United States Patent
Umezaki et al.

(10) Patent No.: US 8,872,745 B2
(45) Date of Patent: Oct. 28, 2014

(54) ELECTRONIC CIRCUIT, DISPLAY DEVICE, ELECTRONIC DEVICE, AND METHOD FOR DRIVING ELECTRONIC CIRCUIT

(75) Inventors: Atsushi Umezaki, Kanagawa (JP); Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1147 days.

(21) Appl. No.: 12/783,079

(22) Filed: May 19, 2010

(65) Prior Publication Data

US 2010/0295838 A1 Nov. 25, 2010

(30) Foreign Application Priority Data

May 21, 2009 (JP) ................................. 2009-122906

(51) Int. Cl.
*G09G 3/36* (2006.01)
*G11C 19/28* (2006.01)

(52) U.S. Cl.
CPC ........ *G11C 19/28* (2013.01); *G09G 2300/0417* (2013.01); *G09G 2310/0286* (2013.01)
USPC .......................................................... 345/98

(58) Field of Classification Search
USPC .................................................. 345/98–100
See application file for complete search history.

(56) References Cited

U.S. PATENT DOCUMENTS

| | | | |
|---|---|---|---|
| 4,409,134 A | 10/1983 | Yamazaki | |
| 6,377,099 B1 | 4/2002 | Cairns | |
| 6,829,322 B2 * | 12/2004 | Shih et al. | 345/100 |
| 6,906,385 B2 | 6/2005 | Moon | |
| 7,057,598 B2 | 6/2006 | Azami | |
| 7,106,292 B2 | 9/2006 | Moon | |
| 7,133,017 B2 | 11/2006 | Hayashi | |
| 7,145,545 B2 | 12/2006 | Zebedee | |
| 7,535,027 B2 | 5/2009 | Moon | |
| 7,688,302 B2 | 3/2010 | Hayashi | |
| 7,710,384 B2 | 5/2010 | Azami | |
| 7,733,321 B2 | 6/2010 | Hayashi | |
| 7,842,951 B2 | 11/2010 | Park | |
| 7,978,274 B2 | 7/2011 | Umezaki | |

(Continued)

FOREIGN PATENT DOCUMENTS

| | | |
|---|---|---|
| CN | 001725287 A | 1/2006 |
| CN | 100362593 C | 1/2008 |

(Continued)

OTHER PUBLICATIONS

Chinese Office Action (Application No. 201010193551.6) dated Nov. 12, 2013, with Full English translation.

*Primary Examiner* — Waseem Moorad
(74) *Attorney, Agent, or Firm* — Fish & Richardson P.C.

(57) ABSTRACT

To control the state of an input signal and output signal of a sequential circuit in order to prevent a malfunction of an electronic circuit. An electronic circuit includes a sequential circuit and a control circuit. A first signal, a second signal, and a third signal are input to the sequential circuit as a start signal, a clock signal, and a reset signal, respectively. The sequential circuit outputs, as an output signal, a fourth signal whose state is set in accordance with the state of the inputted first signal, second signal, and third signal. The control circuit controls the state of the third signal input to the sequential circuit.

19 Claims, 35 Drawing Sheets

(56) References Cited

U.S. PATENT DOCUMENTS

| | | |
|---|---|---|
| 8,008,690 B2 | 8/2011 | Moon |
| 8,054,279 B2 | 11/2011 | Umezaki |
| 8,264,445 B2 | 9/2012 | Azami |
| 8,520,159 B2 | 8/2013 | Umezaki |
| 8,610,179 B2 | 12/2013 | Moon |
| 2004/0218710 A1 | 11/2004 | Shih |
| 2006/0001637 A1 | 1/2006 | Pak et al. |
| 2006/0227093 A1 | 10/2006 | Jang et al. |
| 2006/0256066 A1 | 11/2006 | Moon |
| 2012/0049184 A1 | 3/2012 | Umezaki |
| 2012/0056860 A1 | 3/2012 | Umezaki |
| 2013/0057161 A1 | 3/2013 | Azami |
| 2013/0341616 A1 | 12/2013 | Umezaki |

FOREIGN PATENT DOCUMENTS

| | | |
|---|---|---|
| EP | 1017060 A1 | 7/2000 |
| EP | 1445775 A1 | 8/2004 |
| EP | 1906414 A2 | 4/2008 |
| JP | 2002335153 A | 11/2002 |
| JP | 2004157508 A | 6/2004 |
| JP | 2004185787 A | 7/2004 |
| JP | 2004274050 A | 9/2004 |
| JP | 2006-024350 A | 1/2006 |
| JP | 2006080472 A | 3/2006 |
| JP | 2008089915 A | 4/2008 |
| JP | 2008107807 A | 5/2008 |
| JP | 4175550 A | 11/2008 |
| WO | WO03104879 A3 | 12/2003 |

* cited by examiner

2251

2253

2254

2253  2255

2254  2256

ELECTRONIC CIRCUIT, DISPLAY DEVICE, ELECTRONIC DEVICE, AND METHOD FOR DRIVING ELECTRONIC CIRCUIT

BACKGROUND OF THE INVENTION

1. Field of the Invention

One embodiment of the present invention relates to an electronic circuit and a method for driving the electronic circuit. Moreover, one embodiment of the present invention relates to a display device. Further, one embodiment of the present invention relates to an electronic device including the display device in a display portion.

2. Description of the Related Art

In recent years, with the increase of large display devices such as liquid crystal televisions, display devices such as liquid crystal display devices and light-emitting devices have been actively developed. In particular, a technique for forming a pixel circuit and a driver circuit in a display device over the same insulating substrate by using thin film transistors or the like including semiconductor layers provided over the insulating substrate has been actively developed, because the technique greatly contributes to reduction in power consumption and cost, for example. The driver circuit formed over the insulating substrate is connected to a circuit including a controller IC through an FPC, for example, and its operation is controlled by the controller IC.

Examples of the driver circuit in the display device are a scan line driver circuit and a signal line driver circuit. For example, as disclosed in Patent Document 1, a driver circuit is constituted by a shift register, which is a kind of electronic circuit. The shift register is constituted by sequential circuits of plural stages including a plurality of sequential circuits such as flip-flops.

In order to operate the shift register more correctly, it is preferable to control the state of an output signal from a flip-flop in each operation period so as to be a desired state, for example. If the state of the output signal from the flip-flop cannot be controlled to be a desired state due to adverse effects of noise, for example, it is highly likely that the shift register malfunctions.

REFERENCE

Patent Document 1: Japanese Published Patent Application No. 2006-024350

SUMMARY OF THE INVENTION

An object of one embodiment of the present invention is to control the state of an output signal from a sequential circuit so that a malfunction of a circuit including the sequential circuit is prevented.

In one embodiment of the present invention, a sequential circuit is included and the state of at least one signal input to the sequential circuit is controlled. Since the state of a signal output from the sequential circuit is set in accordance with the state of a signal input to the sequential circuit, the state of the output signal from the sequential circuit is controlled by controlling the state of the signal input to the sequential circuit so as to set the state of the signal input to the sequential circuit.

According to one embodiment of the present invention, an electronic circuit includes a sequential circuit and a control circuit. A first signal, a second signal, and a third signal are input to the sequential circuit as a start signal, a clock signal, and a reset signal, respectively. The sequential circuit outputs a fourth signal whose state is set in accordance with the state of the inputted first signal, second signal, and third signal, as an output signal. The control circuit controls the state of the third signal input to the sequential circuit.

According to one embodiment of the present invention, an electronic circuit includes a sequential circuit and a control circuit. A first signal, a second signal, and a third signal are input to the sequential circuit as a start signal, a clock signal, and a reset signal, respectively. The sequential circuit outputs a fourth signal whose voltage state is set in accordance with the voltage state of the inputted first signal, second signal, and third signal, as an output signal. The fourth signal is input to the control circuit. The control circuit outputs a signal whose voltage state is set in accordance with the voltage state of the inputted fourth signal, as the third signal to the sequential circuit.

Further, in the electronic circuit, the control circuit can be a logic circuit.

According to one embodiment of the present invention, an electronic circuit includes a first sequential circuit, a second sequential circuit, and a control circuit. A first signal, a second signal, and a third signal are input to the first sequential circuit as a start signal, a clock signal, and a reset signal, respectively. The first sequential circuit outputs a fourth signal whose voltage state is set in accordance with the voltage state of the inputted first signal, second signal, and third signal, as an output signal. The fourth signal, a fifth signal, and a sixth signal are input to the second sequential circuit as a start signal, a clock signal, and a reset signal, respectively. The second sequential circuit outputs a seventh signal whose voltage state is set in accordance with the voltage state of the inputted fourth signal, fifth signal, and sixth signal, as an output signal. The seventh signal is input to the control circuit. The control circuit outputs a signal whose voltage state is set in accordance with the voltage state of the inputted seventh signal, as the third signal to the first sequential circuit.

Further, in the electronic circuit, the control circuit can be a delay circuit.

Moreover, in the electronic circuit, the control circuit can be a logic circuit.

According to one embodiment of the present invention, an electronic circuit includes a first sequential circuit, a second sequential circuit, and a control circuit. A first signal, a second signal, and a third signal are input to the first sequential circuit as a start signal, a clock signal, and a reset signal, respectively. The first sequential circuit outputs a fourth signal whose voltage state is set in accordance with the voltage state of the inputted first signal, second signal, and third signal, as an output signal. The fourth signal, a fifth signal, and a sixth signal are input to the second sequential circuit as a start signal, a clock signal, and a reset signal, respectively. The second sequential circuit outputs a seventh signal whose voltage state is set in accordance with the voltage state of the inputted fourth signal, fifth signal, and sixth signal, as an output signal. The fourth signal and the seventh signal are input to the control circuit. The control circuit outputs a signal whose voltage state is set in accordance with the voltage state of the inputted fourth signal and seventh signal, as the third signal to the first sequential circuit.

Moreover, in the electronic circuit, the control circuit can be a logic circuit.

Furthermore, the sequential circuit included in the electronic circuit, which is one embodiment of the present invention, can include a first transistor having a first gate, a first source, and a first drain; a second transistor having a second gate, a second source, and a second drain; and a third transistor having a third gate, a third source, and a third drain. The start signal is input to the first gate of the first transistor. The second gate of the second transistor is electrically connected to one of the first source and the first drain of the first transistor. The clock signal is input to one of the second source and the second drain of the second transistor. A voltage at the other of the second source and the second drain of the second transistor is output as the output signal. The reset signal is input to the third gate of the third transistor. One of the third source and the third drain of the third transistor is electrically connected to the second gate of the second transistor. A first voltage or a second voltage is applied to the other of the third source and the third drain of the third transistor.

According to one embodiment of the present invention, a display device includes a driver circuit including one of the electronic circuits of the present invention; and a pixel portion including a pixel, in which display operation is controlled by the driver circuit.

According to one embodiment of the present invention, an electronic device includes a display portion including one of the display devices of the present invention, and a control switch configured to control display operation of the display portion.

According to one embodiment of the present invention, a method for driving an electronic circuit is as follows. In an electronic circuit including a sequential circuit configured to output, as an output signal, a fourth signal whose voltage state is set in accordance with the voltage state of a first signal, a second signal, and a third signal which are input as a start signal, a clock signal, and a reset signal, respectively, the third signal input to the sequential circuit is set to a first voltage state at the same time as or after the fourth signal is set from the first voltage state to a second voltage state.

According to one embodiment of the present invention, the state of an output signal of a sequential circuit can be set to a desired state; thus, a malfunction of the sequential circuit can be prevented, and further, a malfunction of an electronic circuit can also be prevented.

BRIEF DESCRIPTION OF THE DRAWINGS

In the accompanying drawings:

FIGS. 22A-1, 22A-2, 22B-1, and 22B-2 are diagrams illustrating multi-tone masks applicable to the present invention;

DETAILED DESCRIPTION OF THE INVENTION

Hereinafter, examples of embodiments of the present invention will be described with reference to the accompanying drawings. Note that the present invention is not limited to the following description, and it is easily understood by those skilled in the art that various changes and modifications can be made without departing from the spirit and scope of the present invention. Therefore, the present invention should not be interpreted as being limited to the following description of the embodiments.

Embodiment 1

In this embodiment, an electronic circuit which is one embodiment of the present invention will be described.

Figure 1:
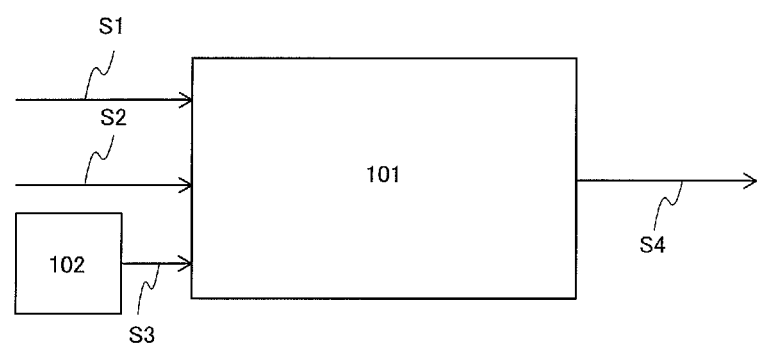
FIG. 1 is a block diagram illustrating an example of a configuration of an electronic circuit in Embodiment 1.

A configuration of an electronic circuit in this embodiment will be described with reference to FIG. 1. FIG. 1 is a circuit block diagram illustrating an example of a configuration of the electronic circuit in this embodiment.

The electronic circuit illustrated in FIG. 1 includes a sequential circuit 101 and a control circuit 102.

The sequential circuit 101 has a function of outputting, as an output signal, a signal S4 whose state is set in accordance with a signal S1, a signal S2, and a signal S3 which are input to the sequential circuit 101 as input signals.

Note that in this specification, the state of a signal refers to a voltage, a current, or a frequency of the signal, for example.

Note that in general, a voltage refers to the potential difference between two points, and a potential refers to electrostatic energy (electric potential energy) that a unit charge in an electrostatic field at one point has; in electronic circuits, the difference (voltage) between a potential at one point and a potential serving as a reference (also referred to as a reference potential) is sometimes used as a value. Therefore, in this specification, the potential difference between a potential at one point and a reference potential is sometimes used as a voltage at the point unless otherwise specified.

The control circuit 102 has a function of outputting the signal S3 to the sequential circuit 101 and also has a function of controlling the state of the signal S3; thus, the control circuit 102 is also referred to as a signal control circuit. For example, the control circuit 102 can have a function of controlling the output timing of a pulse of the signal S3 to the sequential circuit 101. The state of the signal S3 can be set in accordance with the state of the signal S4, for example. Moreover, the control circuit 102 can be electrically connected to the sequential circuit 101, for example. Further, the control circuit 102 can be constituted by a delay circuit or a logic circuit, for example. As an example, when the control circuit 102 is constituted by a delay circuit and a given signal is input to the control circuit 102, the control circuit 102 delays the signal input to the control circuit 102 and outputs a delayed signal as the signal S3. In the case of an electronic circuit including sequential circuits of (N+1) stages (N is a natural number) constituted by (N+1) sequential circuits, for example, an output signal from the (K+1)th stage sequential circuit (K is a natural number of 1 to N) can be used as a signal input to the control circuit 102. Furthermore, when the control circuit 102 is constituted by a logic circuit, the signal S4 can be used, for example.

Note that as a signal in this specification, an analog signal or a digital signal which uses voltage, current, resistance, frequency, or the like can be used, for example. For example, as a signal with voltage (also referred to as a voltage signal), it is preferable to use a signal having at least a first voltage state and a second voltage state. A binary digital signal which has a high-level voltage state as the first voltage state and a low-level voltage state as the second voltage state can be used, for example. Note that in a binary digital signal, a high-level voltage is also referred to as $V_H$ and a low-level voltage is also referred to as $V_L$. Moreover, each of a voltage in the first voltage state and a voltage in the second voltage state preferably has a fixed value. However, since noise or the like, for example, has an influence on an electronic circuit, each of the voltage in the first voltage state and the voltage in the second voltage state does not necessarily have a fixed value and may be a value within a fixed range. Furthermore, as the voltage signal, a signal having three or more voltage states can be used.

Further, in this specification, terms with ordinal numbers, such as "first" and "second", are used in order to avoid confusion among components, and the terms do not limit the components numerically.

The signal S1 can function as a start signal (also referred to as a set signal) of a sequential circuit, for example, and can function as a start signal (also referred to as $ST_{101}$) of the sequential circuit 101, for example.

The signal S2 can function as a clock signal of a sequential circuit, for example, and can function as a clock signal (also referred to as $CK_{101}$) of the sequential circuit 101, for example.

The signal S3 can function as a reset signal of a sequential circuit, for example, and can function as a reset signal (also referred to as $RE_{101}$) of the sequential circuit 101, for example.

As illustrated in FIG. 1 as an example, the example of the electronic circuit in this embodiment includes a sequential circuit (e.g., the sequential circuit 101) and a control circuit (e.g., the control circuit 102); a first signal (e.g., the signal S1), a second signal (e.g., the signal S2), and a third signal (e.g., the signal S3) are input to the sequential circuit and the sequential circuit outputs a fourth signal (e.g., the signal S4); and the control circuit controls the state of any of the signals input to the sequential circuit (e.g., the signal S3). Note that FIG. 1 illustrates the structure where one sequential circuit and one control circuit are included; however, this embodiment is not limited to this structure and the electronic circuit in this embodiment can include a plurality of sequential circuits or a plurality of control circuits. For example, the electronic circuit can include sequential circuits of (N+1) stages (N is a natural number) constituted by (N+1) sequential circuits and N control circuits. For example, an electronic circuit including sequential circuits of (N+1) stages can have a structure in which an output signal of the (K+1)th stage sequential circuit (K is a natural number of 1 to N) is input to one of N control circuits and an output signal of one of the N control circuits is input to the Kth stage sequential circuit.

Figure 2:
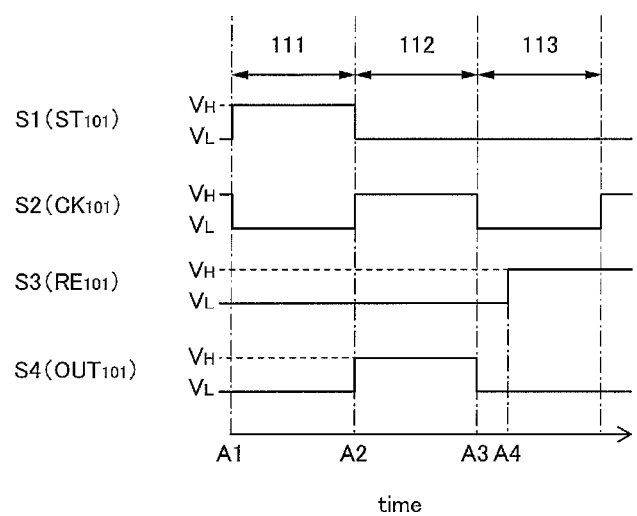
FIG. 2 is a timing chart illustrating an example of operation of the electronic circuit illustrated in FIG. 1.

Next, an example of operation (also referred to as a driving method) of the electronic circuit in this embodiment will be described with reference to FIG. 2. FIG. 2 is a timing chart illustrating an example of the operation of the electronic circuit illustrated in FIG. 1, and illustrates the waveforms of the signals S1 to S4. Note that in the example of the operation of the electronic circuit in FIG. 1, which is described with reference to FIG. 2, each of the signals S1 to S4 is a binary digital signal and the signal S2 is a clock signal. In addition, in the operation of the electronic circuit in this embodiment, the voltage state of each signal illustrated in FIG. 2 can be inverted.

In the example of the operation of the electronic circuit in FIG. 1, a period can be divided into a period 111, a period 112, and a period 113 as illustrated in FIG. 2. Note that in this specification, the length of each period can be set as appropriate in accordance with a clock signal, for example, and can be set to the same length as the half cycle of the clock signal, for example. The operation in each period is described below.

First, in the period 111, at the time A1, the signal S1 is set to High level, the signal S2 is set to Low level, and the signal S3 is at Low level.

At that time, the sequential circuit 101 is set to a set state. Moreover, the signal S4 is at Low level in accordance with the voltage state of the signals S1 to S3. Further, in the period 111, the signal S3 remains at Low level.

Then, in the period 112, at the time A2, the signal S1 is set to Low level, the signal S2 is set to High level, and the signal S3 remains at Low level.

At that time, the signal S4 is set to High level in accordance with the voltage state of the signals S1 to S3. Further, in the period 112, the signal S3 remains at Low level.

Then, in the period 113, at the time A3, the signal S1 remains at Low level, the signal S2 is set to Low level, and the signal S3 remains at Low level.

At that time, the signal S4 is set to Low level in accordance with the voltage state of the signals S1 to S3. Then, at the time A4, the signal S3 is set to High level. When the signal S3 is set to High level, the sequential circuit 101 is set to a reset state. The signal S4 remains at Low level during the time in which the sequential circuit 101 is in the reset state.

Note that in the example of the operation of the electronic circuit in FIG. 1, which is described with reference to FIG. 2, the timing (the time A4) when the signal S3 is set to High level from Low level (i.e., the signal S3 rises) is preferably set at the same time as or after the signal S4 is set to Low level from High level (i.e., the signal S4 falls). This is because if the signal S3 rises before the signal S4 falls, for example, the sequential circuit 101 is set to a reset state due to delay in the sequential circuit 101 before the signal S4 falls, so that it takes a longer time for the signal S4 to fall, which is highly likely to cause a malfunction.

The electronic circuit in this embodiment is operated as illustrated in FIG. 2 as an example, whereby the state of a signal output from the sequential circuit can be controlled. Accordingly, even in the case where operation in the sequential circuit is delayed, for example, the voltage state of a reset signal input to the sequential circuit is set in consideration of the delay of the operation in the sequential circuit, so that the timing at which the sequential circuit is set to a reset state can be controlled. Thus, a malfunction in the sequential circuit can be prevented, and a malfunction in the electronic circuit can be prevented.

Embodiment 2

In this embodiment, an example of an electronic circuit which is one embodiment of the present invention will be described.

Figure 3:
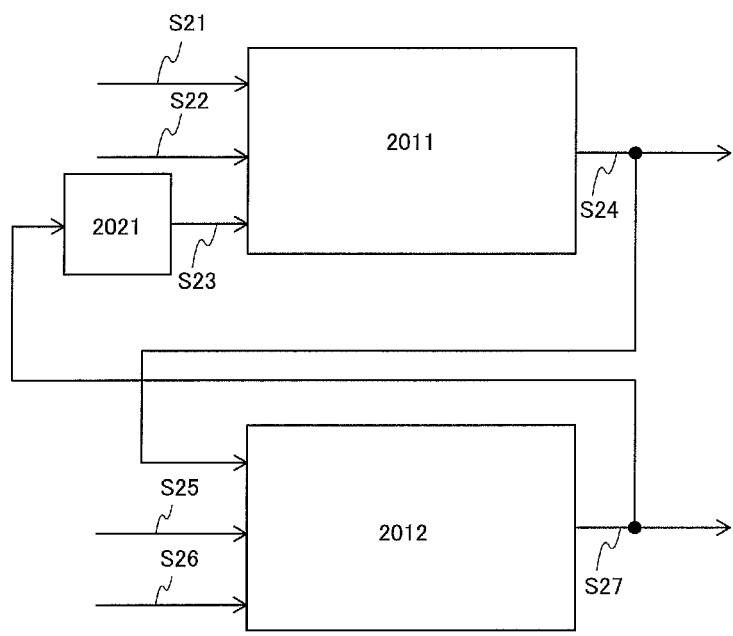
FIG. 3 is a block diagram illustrating an example of a configuration of an electronic circuit in Embodiment 2.

A configuration of an electronic circuit in this embodiment will be described with reference to FIG. 3. FIG. 3 is a circuit block diagram illustrating an example of a configuration of the electronic circuit in this embodiment.

The electronic circuit illustrated in FIG. 3 at least includes a sequential circuit 2011, a sequential circuit 2012, and a control circuit 2021.

The sequential circuit 2011 has a function of outputting, as an output signal, a signal S24 whose voltage state is set in accordance with a signal S21, a signal S22, and a signal S23 which are input to the sequential circuit 2011 as input signals.

The sequential circuit 2012 has a function of outputting, as an output signal, a signal S27 whose voltage state is set in accordance with the signal S24, a signal S25, and a signal S26 which are input to the sequential circuit 2012 as input signals. Note that the sequential circuit 2012 can be electrically connected to the sequential circuit 2011, for example.

The control circuit 2021 has a function of outputting a signal whose voltage state is set in accordance with the signal S27 which is input from the sequential circuit 2012, to the sequential circuit 2011 as the signal S23. Note that the control circuit 2021 can be electrically connected to the sequential circuit 2011 and the sequential circuit 2012, for example.

The signal S21 and the signal S24 can function as a start signal of a sequential circuit, for example. The signal S21 can function as a start signal (also referred to as $ST_{2011}$) of the sequential circuit 2011, and the signal S24 can function as a start signal (also referred to as $ST_{2012}$) of the sequential circuit 2012.

The signal S22 and the signal S25 can function as a clock signal of a sequential circuit, for example. The signal S22 can function as a clock signal (also referred to as $CK_{2011}$) of the sequential circuit 2011, and the signal S25 can function as a clock signal (also referred to as $CK_{2012}$) of the sequential circuit 2012. Note that as the signal S22 and the signal S25, signals whose phases are different from each other can be used. For example, a first clock signal (also referred to as CK1) can be used as the signal S22, and a second clock signal or an inverted clock signal of the first clock signal (such a signal is also referred to as CKB1) can be used as the signal S25.

The signal S23 and the signal S26 can function as a reset signal of a sequential circuit, for example. The signal S23 can function as a reset signal (also referred to as $RE_{2011}$) of the sequential circuit 2011, and the signal S26 can function as a reset signal (also referred to as $RE_{2012}$) of the sequential circuit 2012.

As illustrated in FIG. 3 as an example, the example of the electronic circuit in this embodiment includes a first sequential circuit (e.g., the sequential circuit 2011), a second sequential circuit (e.g., the sequential circuit 2012), and a control circuit (e.g., the control circuit 2021); a first signal (e.g., the signal S21), a second signal (e.g., the signal S22), and a third signal (e.g., the signal S23) are input to the first sequential circuit and the first sequential circuit outputs a fourth signal (e.g., the signal S24); the fourth signal, a fifth signal (e.g., the signal S25), and a sixth signal (e.g., the signal S26) are input to the second sequential circuit and the second sequential circuit outputs a seventh signal (e.g., the signal S27); and the control circuit controls the voltage state of any of the signals input to the first sequential circuit. Note that this embodiment is not limited to this structure, and the electronic circuit in this embodiment can have a structure, for example, including sequential circuits of (N+1) stages (N is a natural number) including (N+1) sequential circuits and a control circuit to which a signal output from the (K+1)th stage sequential circuit (K is a natural number of 1 to N) is input and from which a signal whose voltage state is set in accordance with the voltage state of the inputted signal is output to the Kth stage sequential circuit.

Figure 4:
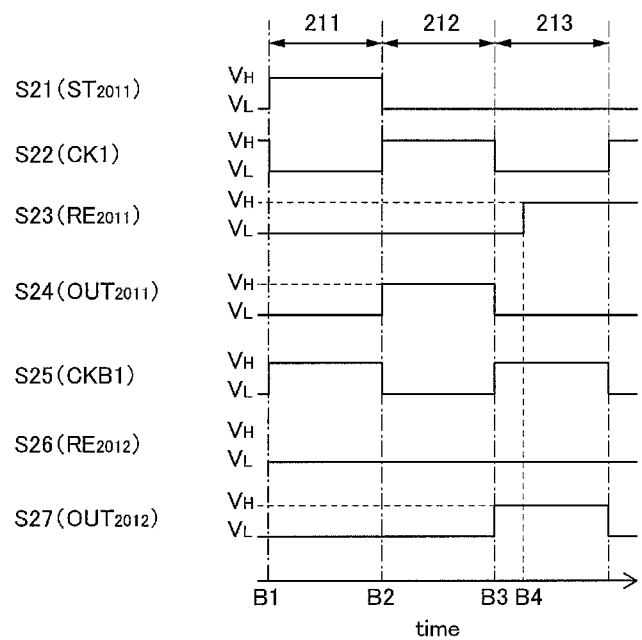
FIG. 4 is a timing chart illustrating an example of operation of the electronic circuit illustrated in FIG. 3.

Next, an example of operation of the electronic circuit in this embodiment will be described with reference to FIG. 4. FIG. 4 is a timing chart illustrating an example of the operation of the electronic circuit illustrated in FIG. 3, and illustrates the waveforms of the signals S21 to S27. Note that in the example of the operation of the electronic circuit in FIG. 3, which is described with reference to FIG. 4, each of the signals S21 to S27 is a binary digital signal, the signal S22 is a first clock signal, and the signal S25 is an inverted clock signal of the first clock signal. Further, in the operation of the electronic circuit in this embodiment, the voltage state of each signal illustrated in FIG. 4 can be inverted.

In the example of the operation of the electronic circuit in FIG. 3, a period can be divided into a period 211, a period 212, and a period 213 as illustrated in FIG. 4. The operation in each period is described below.

First, in the period 211, at the time B1, the signal S21 is set to High level; the signal S22 is set to Low level; the signal S23 is at Low level; the signal S25 is set to High level; and the signal S26 is at Low level.

At that time, the sequential circuit 2011 is set to a set state. Moreover, the signal S24, which is the output signal of the sequential circuit 2011, is at Low level in accordance with the voltage state of the signals S21 to S23. Further, the signal S27, which is the output signal of the sequential circuit 2012, is at Low level in accordance with the voltage state of the signals S24 to S26. Furthermore, in the period 211, the signal S23, which is the output signal of the control circuit 2021, remains at Low level.

Then, in the period 212, at the time B2, the signal S21 is set to Low level; the signal S22 is set to High level; the signal S23 remains at Low level; the signal S25 is set to Low level; and the signal S26 remains at Low level.

At that time, the signal S24 is set to High level in accordance with the voltage state of the signals S21 to S23. When the signal S24 is set to High level, the sequential circuit 2012 is set to a set state. Moreover, the signal S27 remains at Low level in accordance with the voltage state of the signals S24 to S26. Furthermore, in the period 212, the signal S23 remains at Low level.

Then, in the period 213, at the time B3, the signal S21 remains at Low level; the signal S22 is set to Low level; the signal S23 remains at Low level; the signal S25 is set to High level; and the signal S26 remains at Low level.

At that time, the signal S24 is set to Low level in accordance with the voltage state of the signals S21 to S23. Moreover, the signal S27 is set to High level in accordance with the voltage state of the signals S24 to S26. Then, at the time B4, the signal S23 is set to High level in accordance with the voltage state of the signal S27. When the signal S23 is set to High level, the sequential circuit 2011 is set to a reset state. The signal S24 remains at Low level during the time in which the sequential circuit 2011 is in the reset state.

Note that in the example of the operation of the electronic circuit in FIG. 3, which is described with reference to FIG. 4, the timing (the time B4) when the signal S23 rises can be set as appropriate in the period 213. Moreover, the timing when the signal S23 rises is preferably set at the same time as or after the signal S24 falls. This is because if the signal S23 rises before the signal S24 falls, for example, the sequential circuit 2011 is set to a reset state due to delay in the sequential circuit 2011 before the signal S24 falls, so that it takes a longer time for the signal S24 to fall, which is highly likely to cause a malfunction.

The electronic circuit in this embodiment is operated as illustrated in FIG. 4 as an example, whereby the voltage state of a signal input to the first sequential circuit can be set in accordance with the voltage state of an output signal from the second sequential circuit. Note that it can be said that the voltage state of the signal input to the first sequential circuit can be set in accordance with the voltage state of an output signal of the first sequential circuit, because the output signal of the first sequential circuit is input to the second sequential circuit and the voltage state of the output signal of the second sequential circuit is set in accordance with the voltage state of the output signal of the first sequential circuit. Accordingly, a reset signal of the first sequential circuit can be set to the first voltage state after the output signal of the first sequential circuit is set to the second voltage state from the first voltage state. For example, even in the case where operation in the sequential circuit is delayed, the voltage state of a reset signal input to the sequential circuit is set in consideration of the operation in the sequential circuit, so that the timing at which the sequential circuit is set to a reset state can be controlled. Thus, a malfunction in the sequential circuit can be prevented, and a malfunction in the electronic circuit can be prevented.

Next, an example of a circuit configuration of the control circuit in the electronic circuit in this embodiment will be described with reference to FIGS. 5A to 5H and FIGS. 6A to 6E. FIGS. 5A to 5H and FIGS. 6A to 6E are circuit diagrams each illustrating an example of a circuit configuration of the control circuit (the control circuit 2021) in the electronic circuit illustrated in FIG. 3. Note that in description of the control circuits illustrated in FIGS. 5A to 5H and FIGS. 6A to 6E, the description of the electronic circuit illustrated in FIG. 3 is employed as appropriate.

Figure 5A:
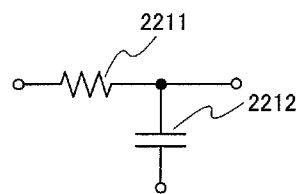
FIGS. 5A to 5H are circuit diagrams each illustrating an example of a circuit configuration of a control circuit in the electronic circuit illustrated in FIG. 3.

The control circuit illustrated in FIG. 5A includes a resistor 2211 and capacitor 2212.

Note that in this specification, a resistor has one end and the other end. Further, a resistance value of a resistor can be set as appropriate.

In addition, in this specification, a capacitor includes at least two electrodes of one electrode and the other electrode, and a film having a function of a dielectric. A terminal including part or all of one electrode of the capacitor is referred to as a first terminal, and a terminal including part or all of the other electrode of the capacitor is referred to as a second terminal. As the film having a function of a dielectric, an insulating film can be used, for example. Moreover, a capacitance value of a capacitor can be set as appropriate.

In the control circuit illustrated in FIG. 5A, a first terminal of the capacitor 2212 is electrically connected to one end or the other end of the resistor 2211, and a voltage $V_1$ (also referred to as a first voltage) or a voltage $V_2$ (also referred to as a second voltage) is applied to a second terminal of the capacitor 2212. The signal S27 is input through one of one end and the other end of the resistor 2211. The signal S23 is output through the other of one end and the other end of the resistor 2211.

Note that in this specification, the value of the voltage $V_1$ is higher than the value of the voltage $V_2$. Moreover, the absolute value of the difference between the value of the voltage $V_1$ and the value of the voltage $V_2$ is preferably larger than a given value. For example, a power supply voltage can be used as the voltage $V_1$ and the voltage $V_2$; a voltage on the relatively high voltage side (also referred to as a high power supply voltage $V_{dd}$) can be used as the voltage $V_1$ and a voltage on the relatively low voltage side (also referred to as a low power supply voltage $V_{ss}$) can be used as the voltage $V_2$. Alternatively, a ground potential (also referred to as $V_{GND}$) can be used as the voltage $V_1$ or the voltage $V_2$. Each of the high power supply voltage and the low power supply voltage is preferably constant; however, in an electronic circuit, a voltage sometimes varies from a desired value due to noise or the like. Therefore, in this specification, such a voltage can be considered as the high power supply voltage or the low power supply voltage as long as it has a value within a fixed range. Further, a value of each power supply voltage can be set as appropriate.

Figure 5B:
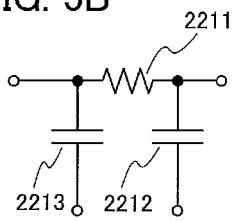

The control circuit illustrated in FIG. 5B includes a capacitor 2213 in addition to the structure of the control circuit in FIG. 5A. A first terminal of the capacitor 2213 is electrically connected to one end of the resistor 2211. The voltage which is the same as that at the second terminal of the capacitor 2212 (i.e., the voltage $V_1$ or the voltage $V_2$) is applied to a second terminal of the capacitor 2213.

Figure 5C:
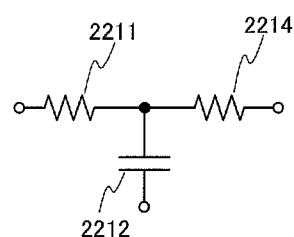

The control circuit illustrated in FIG. 5C includes a resistor 2214 in addition to the structure of the control circuit in FIG. 5A. One end of the resistor 2214 is electrically connected to the other end of the resistor 2211. The signal S27 is input through one of one end of the resistor 2211 and the other end of the resistor 2214. The signal S23 is output through the other of one end of the resistor 2211 and the other end of the resistor 2214.

Figure 5D:
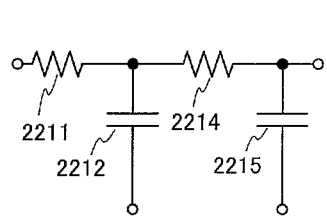

The control circuit illustrated in FIG. 5D includes a capacitor 2215 in addition to the structure of the control circuit in FIG. 5C. A first terminal of the capacitor 2215 is electrically connected to the other end of the resistor 2214. The voltage which is the same as that at the second terminal of the capacitor 2212 (i.e., the voltage $V_1$ or the voltage $V_2$) is applied to a second terminal of the capacitor 2215.

Figure 5E:
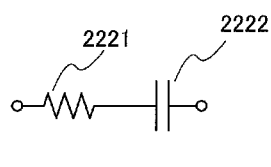

The control circuit illustrated in FIG. 5E includes a resistor 2221 and a capacitor 2222. A first terminal of the capacitor 2222 is electrically connected to the other end of the resistor 2221. The signal S27 is input through one of one end of the resistor 2221 and a second terminal of the capacitor 2222. The signal S23 is output through the other of one end of the resistor 2221 and the second terminal of the capacitor 2222.

Figure 5F:
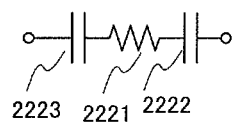

The control circuit illustrated in FIG. 5F includes a capacitor 2223 in addition to the structure of the control circuit in FIG. 5E. A second terminal of the capacitor 2223 is electrically connected to one end of the resistor 2221. The signal S27 is input through one of a first terminal of the capacitor 2223 and the second terminal of the capacitor 2222. The signal S23 is output through the other of the first terminal of the capacitor 2223 and the second terminal of the capacitor 2222.

Figure 5G:
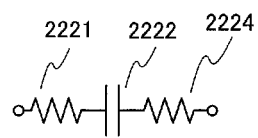

The control circuit illustrated in FIG. 5G includes a resistor 2224 in addition to the structure of the control circuit in FIG. 5E. One end of the resistor 2224 is electrically connected to the second terminal of the capacitor 2222. The signal S27 is input through one of one end of the resistor 2221 and the other end of the resistor 2224. The signal S23 is output through the other of one end of the resistor 2221 and the other end of the resistor 2224.

Figure 5H:
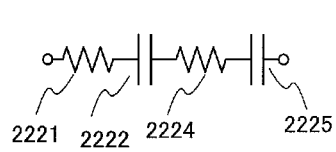

The control circuit illustrated in FIG. 5H includes a capacitor 2225 in addition to the structure of the control circuit in FIG. 5G. A first terminal of the capacitor 2225 is electrically connected to the other end of the resistor 2224. The signal S27 is input through one of one end of the resistor 2221 and a second terminal of the capacitor 2225. The signal S23 is output through the other of one end of the resistor 2221 and the second terminal of the capacitor 2225.

Figure 6A:
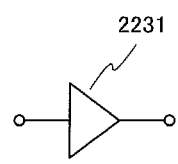
FIGS. 6A to 6E are circuit diagrams each illustrating an example of a circuit configuration of a control circuit in the electronic circuit illustrated in FIG. 3.

The control circuit illustrated in FIG. 6A includes a buffer circuit 2231. The signal S27 is input to the buffer circuit 2231. The signal S23 is output from the buffer circuit 2231.

Figure 6B:
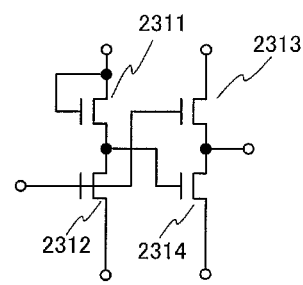

FIG. 6B illustrates an example of a circuit configuration of the buffer circuit 2231 illustrated in FIG. 6A.

The buffer circuit illustrated in FIG. 6B includes a transistor 2311, a transistor 2312, a transistor 2313, and a transistor 2314.

Note that in this specification, a transistor has at least three terminals and has a structure so that a potential of one terminal controls conduction between the other two terminals. For example, a field effect transistor or a bipolar transistor can be used.

In this specification, a field effect transistor has at least a gate, a source, and a drain. As the field effect transistor, a thin film transistor (also referred to as a TFT) can be used, for example. Moreover, the field effect transistor can have a top-gate structure or a bottom-gate structure, for example. The bottom-gate transistor can have a channel-etched structure or a bottom-contact structure (also referred to as an inverted coplanar structure), for example. Further, the field effect transistor can have n-type or p-type conductivity. As an example, the case is described in which all the transistors in the control circuit illustrated in FIGS. 6A to 6E are field effect transistors of the same conductivity. When all the transistors have the same conductivity, the number of manufacturing steps can be reduced as compared to the case where transistors with different conductivities are used.

The field effect transistor can include, for example, a gate electrode; a semiconductor layer including a source region, a channel region, and a drain region; and a gate insulating layer provided between the gate electrode and the semiconductor layer in the cross-sectional view. The semiconductor layer can be formed using a semiconductor film or a semiconductor substrate. Examples of a semiconductor material which can be applied to a semiconductor film or a semiconductor substrate are an amorphous semiconductor, a microcrystalline semiconductor, a single crystal semiconductor, and a polycrystalline semiconductor. Moreover, an oxide semiconductor can be used as the semiconductor material. As an oxide semiconductor, an oxide semiconductor whose composition formula is represented by $InMO_3(ZnO)_m$ (m>0) can be used, for example. It is particularly preferable to use an In—Ga—Zn—O-based oxide semiconductor among oxide semiconductors whose composition formulas are represented by $InMO_3(ZnO)_m$ (m>0). Note that M denotes one or more of metal elements selected from gallium (Ga), iron (Fe), nickel (Ni), manganese (Mn), and cobalt (Co). For example, M denotes Ga in some cases; meanwhile, M denotes the above metal element such as Ni or Fe in addition to Ga (i.e., Ga and Ni or Ga and Fe) in other cases. Further, the oxide semiconductor may contain a transitional metal element such as Fe or Ni or an oxide of the transitional metal as an impurity element in addition to the metal element contained as M. Furthermore, as the oxide semiconductor, any of the following oxide semiconductors can also be used: an In—Sn—Zn—O-based oxide semiconductor, an Al—In—Zn—O-based oxide semiconductor, a Ga—Sn—Zn—O-based oxide semiconductor, an Al—Ga—Zn—O-based oxide semiconductor, an Al—Sn—Zn—O-based oxide semiconductor, an In—Zn—O-based oxide semiconductor, a Sn—Zn—O-based oxide semiconductor, an Al—Zn—O-based oxide semiconductor, an In—O-based oxide semiconductor, a Sn—O-based oxide semiconductor, and a Zn—O-based oxide semiconductor.

Note that in this specification, a gate refers to all or part of a gate electrode and a wiring electrically connected to the gate electrode (such a wiring is also referred to as a gate wiring). A source refers to all or part of a source region, a source electrode, and a wiring electrically connected to the source electrode (such a wiring is also referred to as a source wiring). A drain refers to all or part of a drain region, a drain electrode, and a wiring electrically connected to the drain electrode (such a wiring is also referred to as a drain wiring).

In addition, in this specification, a source and a drain sometimes replace each other depending on the structure, the operating conditions, or the like of a field effect transistor.

One of the voltage $V_1$ and the voltage $V_2$ is applied to a gate and one of a source and a drain of the transistor 2311.

A signal $IN_{CTL}$ is input to a gate of the transistor 2312. One of a source and a drain of the transistor 2312 is electrically connected to the other of the source and the drain of the transistor 2311. The other of the voltage $V_1$ and the voltage $V_2$ is applied to the other of the source and the drain of the transistor 2312.

The voltage which is the same as that at one of the source and the drain of the transistor 2311 (i.e., one of the voltage $V_1$ and the voltage $V_2$) is applied to one of a source and a drain of the transistor 2313.

A gate of the transistor 2314 is electrically connected to the other of the source and the drain of the transistor 2311. One of a source and a drain of the transistor 2314 is electrically connected to the other of the source and the drain of the transistor 2313. The voltage which is the same as that at the other of the source and the drain of the transistor 2312 (i.e., the other of the voltage $V_1$ and the voltage $V_2$) is applied to the other of the source and the drain of the transistor 2314.

In the control circuit illustrated in FIG. 6B, the signal S27 is input to the gate of the transistor 2312, and the voltage at the other of the source and the drain of the transistor 2313 is output as the signal S23.

Figure 6C:
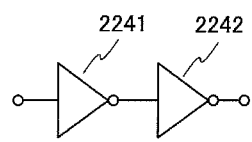

The control circuit illustrated in FIG. 6C includes an inverter (also referred to as a NOT gate or a NOT circuit) 2241 and an inverter 2242. The inverter 2242 is electrically connected in series with the inverter 2241. The signal S27 is input to the inverter 2241, and the signal S23 is output from the inverter 2242. Note that FIG. 6C illustrates the control circuit including two inverters; however, this embodiment is not limited to this structure. The control circuit in the electronic circuit in this embodiment can have a structure in which 2M inverters (M is a natural number) are electrically connected in series.

Figure 6D:
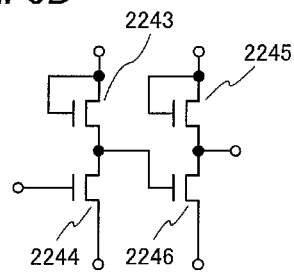

FIG. 6D illustrates an example of a circuit configuration of the control circuit illustrated in FIG. 6C.

The control circuit illustrated in FIG. 6D includes a transistor 2243, a transistor 2244, a transistor 2245, and a transistor 2246.

One of the voltage $V_1$ and the voltage $V_2$ is applied to a gate and one of a source and a drain of the transistor 2243.

One of a source and a drain of the transistor 2244 is electrically connected to the other of the source and the drain of the transistor 2243. The other of the voltage $V_1$ and the voltage $V_2$ is applied to the other of the source and the drain of the transistor 2244.

The voltage which is the same as that at one of the source and the drain of the transistor 2243 (i.e., one of the voltage $V_1$ and the voltage $V_2$) is applied to a gate and one of a source and a drain of the transistor 2245.

A gate of the transistor 2246 is electrically connected to the other of the source and the drain of the transistor 2243. One of a source and a drain of the transistor 2246 is electrically connected to the other of the source and the drain of the transistor 2245. The voltage which is the same as that at the other of the source and the drain of the transistor 2244 (i.e., the other of the voltage $V_1$ and the voltage $V_2$) is applied to the other of the source and the drain of the transistor 2246.

In the control circuit illustrated in FIG. 6D, the signal S27 is input to the gate of the transistor 2244, and the voltage at the other of the source and the drain of the transistor 2245 is output as the signal S23.

Figure 6E:
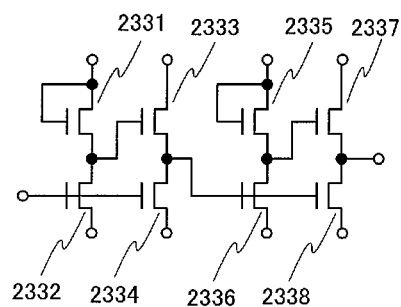

The control circuit illustrated in FIG. 6E includes a transistor 2331, a transistor 2332, a transistor 2333, a transistor 2334, a transistor 2335, a transistor 2336, a transistor 2337, and a transistor 2338.

One of the voltage $V_1$ and the voltage $V_2$ is applied to a gate and one of a source and a drain of the transistor 2331.

One of a source and a drain of the transistor 2332 is electrically connected to the other of the source and the drain of the transistor 2331. The other of the voltage $V_1$ and the voltage $V_2$ is applied to the other of the source and the drain of the transistor 2332.

A gate of the transistor 2333 is electrically connected to the other of the source and the drain of the transistor 2331. The voltage which is the same as that at one of the source and the drain of the transistor 2331 (i.e., one of the voltage $V_1$ and the voltage $V_2$) is applied to one of a source and a drain of the transistor 2333.

One of a source and a drain of the transistor 2334 is electrically connected to the other of the source and the drain of the transistor 2333. The voltage which is the same as that at the other of the source and the drain of the transistor 2332 (i.e., the other of the voltage $V_1$ and the voltage $V_2$) is applied to the other of the source and the drain of the transistor 2334.

The voltage which is the same as that at one of the source and the drain of the transistor 2331 (i.e., one of the voltage $V_1$ and the voltage $V_2$) is applied to a gate and one of a source and a drain of the transistor 2335.

A gate of the transistor 2336 is electrically connected to the other of the source and the drain of the transistor 2333. One of a source and a drain of the transistor 2336 is electrically connected to the other of the source and the drain of the transistor 2335. The voltage which is the same as that at the other of the source and the drain of the transistor 2332 (i.e., the other of the voltage $V_1$ and the voltage $V_2$) is applied to the other of the source and the drain of the transistor 2336.

A gate of the transistor 2337 is electrically connected to the other of the source and the drain of the transistor 2335. The voltage which is the same as that at one of the source and the drain of the transistor 2331 (i.e., one of the voltage $V_1$ and the voltage $V_2$) is applied to one of a source and a drain of the transistor 2337.

A gate of the transistor 2338 is electrically connected to the other of the source and the drain of the transistor 2333. One of a source and a drain of the transistor 2338 is electrically connected to the other of the source and the drain of the transistor 2337. The voltage which is the same as that at the other of the source and the drain of the transistor 2332 (i.e., the other of the voltage $V_1$ and the voltage $V_2$) is applied to the other of the source and the drain of the transistor 2338.

In the control circuit illustrated in FIG. 6E, the signal S27 is input to the gate of the transistor 2332, and the voltage at the other of the source and the drain of the transistor 2337 is output as the signal S23.

Figure 7:
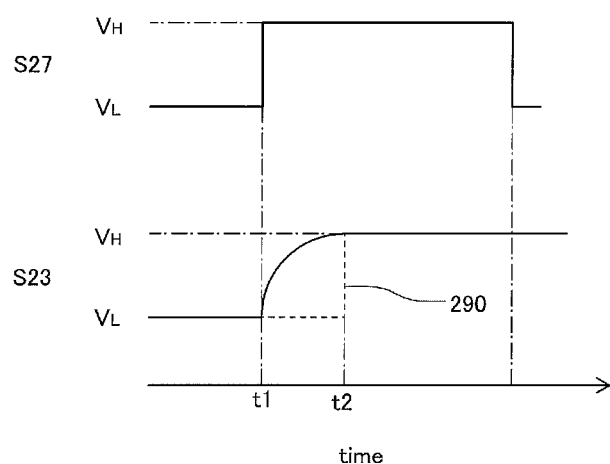
FIG. 7 is a timing chart illustrating an example of operation of the control circuit illustrated in FIG. 5A.

Next, an example of operation of the control circuit in the electronic circuit in this embodiment will be described with reference to FIG. 7. FIG. 7 is a timing chart illustrating an example of operation of the control circuit illustrated in FIG. 5A, and illustrates the waveforms of the signal S27 and the signal S23. Note that in the example of the operation of the control circuit in the electronic circuit in this embodiment, which is described with reference to FIG. 7, the voltage $V_2$ is applied to the second terminal of the capacitor 2212, is a ground potential, and has a value which is the same as that of a low-level voltage of a digital signal.

As illustrated in FIG. 7, at the time t1, the signal S27 input to the control circuit rises. Since the signal S27 is delayed in the control circuit at that time, the signal S23 output from the control circuit can be considered to rise at the time t2 as shown by a dotted line 290.

As illustrated in FIGS. 5A to 5H and FIGS. 6A to 6E as examples, the example of the control circuit in the electronic circuit in this embodiment can be formed using a delay circuit. By the formation of the control circuit by using the delay circuit, for example, an output signal of a second sequential circuit, which is input to the control circuit, can be delayed and the delayed signal can be output from the control circuit to a first sequential circuit in the electronic circuit in this embodiment. The delay time of the output signal from the control circuit can be represented by the product of the capacitance value of a capacitor and the resistance value of a resistor. For example, the delay time can be set in such a manner that the capacitance value of the capacitor and the resistance value of the resistor are set as appropriate in accordance with specifications for the electronic circuit in this embodiment. Accordingly, for example, a signal input to a sequential circuit is delayed in consideration of delay of operation in the sequential circuit, whereby adverse effects of the delay of the operation in the sequential circuit can be suppressed, and a malfunction due to the sequential circuit can be prevented.

Note that this embodiment can be combined or replaced with any of the other embodiments as appropriate.

Embodiment 3

In this embodiment, an example of an electronic circuit which is one embodiment of the present invention will be described.

Figure 8:
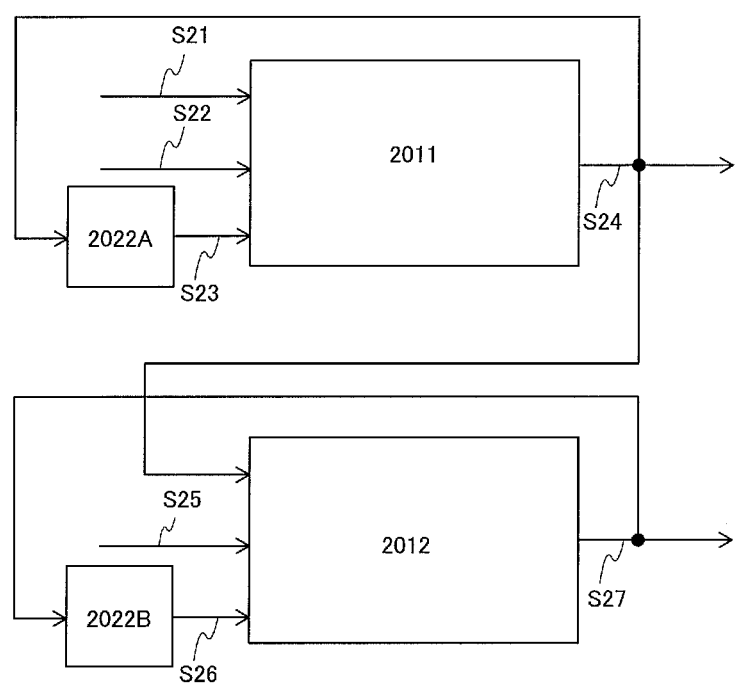
FIG. 8 is a block diagram illustrating an example of a configuration of an electronic circuit in Embodiment 3.

A configuration of an electronic circuit in this embodiment will be described with reference to FIG. 8. FIG. 8 is a block diagram illustrating an example of a configuration of the electronic circuit in this embodiment.

The electronic circuit illustrated in FIG. 8 at least includes the sequential circuit 2011, the sequential circuit 2012, a control circuit 2022A, and a control circuit 2022B. Note that the description of the electronic circuit in FIG. 3 is employed as appropriate for portions which have the same configuration as the electronic circuit in FIG. 3; the other portions will be described below.

The control circuit 2022A has a function of outputting a signal whose voltage state is set in accordance with the signal S24 which is input from the sequential circuit 2011, to the sequential circuit 2011 as the signal S23. The control circuit 2022A can be electrically connected to the sequential circuit 2011, for example.

The control circuit 2022B has a function of outputting a signal whose voltage state is set in accordance with the signal S27 which is input from the sequential circuit 2012, to the sequential circuit 2012 as the signal S26. The control circuit 2022B can be electrically connected to the sequential circuit 2012, for example.

Note that in the electronic circuit in this embodiment, the sequential circuit 2012 and the control circuit 2022B are not necessarily provided.

As illustrated in FIG. 8 as an example, the example of the electronic circuit in this embodiment includes a sequential circuit (e.g., the sequential circuit 2011) and a control circuit (e.g., the control circuit 2022A); a first signal (e.g., the signal S21), a second signal (e.g., the signal S22), and a third signal (e.g., the signal S23) are input to the sequential circuit and the sequential circuit outputs a fourth signal (e.g., the signal S24); and the control circuit controls the voltage state of any of the signals input to the sequential circuit (e.g., the signal S23). Note that this embodiment is not limited to this structure. The electronic circuit in this embodiment can have a structure, for example, including sequential circuits of N stages constituted by N sequential circuits and a control circuit to which a signal output from the Kth stage sequential circuit (K is a natural number of 1 to N) is input and from which a signal whose voltage state is set in accordance with the voltage state of the inputted signal is output to the Kth stage sequential circuit.

Figure 9:
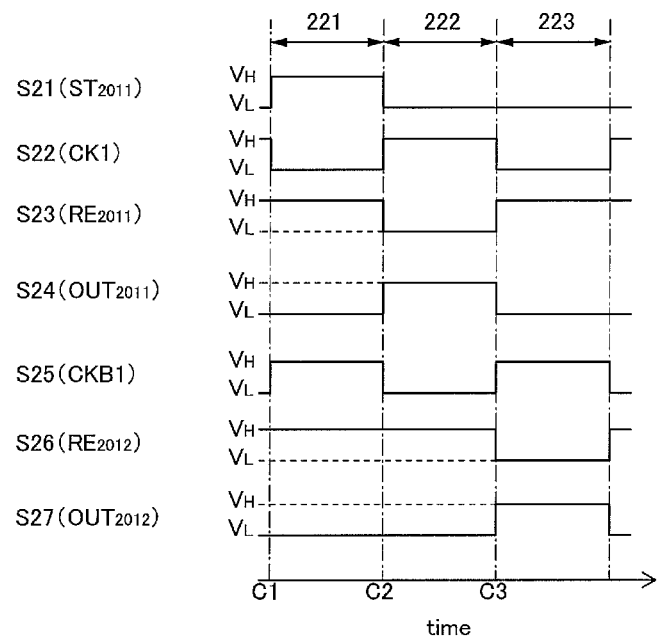
FIG. 9 is a timing chart illustrating an example of operation of the electronic circuit illustrated in FIG. 8.

Next, an example of operation of the electronic circuit in this embodiment will be described with reference to FIG. 9. FIG. 9 is a timing chart illustrating an example of the operation of the electronic circuit illustrated in FIG. 8, and illustrates the waveforms of the signals S21 to S27. Note that in the example of the operation of the electronic circuit in FIG. 8, which is described with reference to FIG. 9, each of the signals S21 to S27 is a binary digital signal, the signal S22 is a first clock signal, and the signal S25 is an inverted clock signal of the first clock signal. Further, in the operation of the electronic circuit in this embodiment, the voltage state of each signal illustrated in FIG. 9 can be inverted.

In the example of the operation of the electronic circuit in FIG. 8, a period can be divided into a period 221, a period 222, and a period 223 as illustrated in FIG. 9. The operation in each period is described below.

First, in the period 221, at the time C1, the signal S21 is set to High level; the signal S22 is set to Low level; and the signal S25 is set to High level.

At that time, the sequential circuit 2011 is set to a set state. Moreover, the signal S24 is at Low level in accordance with the voltage state of the signals S21 to S23. When the signal S24 is at Low level, the signal S23, which is an output signal of the control circuit 2022A, is at High level in accordance with the voltage state of the signal S24. Furthermore, the signal S27 is at Low level in accordance with the voltage state of the signals S24 to S26. When the signal S27 is at Low level, the signal S26, which is an output signal of the control circuit 2022B, is at High level.

Then, in the period 222, at the time C2, the signal S21 is set to Low level; the signal S22 is set to High level; and the signal S25 is set to Low level.

At that time, the signal S24 is set to High level in accordance with the voltage state of the signals S21 to S23. When the signal S24 is set to High level, the signal S23 is set to Low level in accordance with the voltage state of the signal S24, and the sequential circuit 2012 is set to a set state. Moreover, the signal S27 is at Low level in accordance with the voltage state of the signals S24 to S26. When the signal S27 is at Low level, the signal S26 is at High level in accordance with the voltage state of the signal S27.

Then, in the period 223, at the time C3, the signal S21 remains at Low level; the signal S22 is set to Low level; and the signal S25 is set to High level.

At that time, the signal S24 is set to Low level in accordance with the voltage state of the signals S21 to S23. Moreover, when the signal S24 is set to Low level, the signal S23 is set to High level in accordance with the voltage state of the signal S24. When the signal S23 is set to High level, the sequential circuit 2011 is set to a reset state. The signal S24 remains at Low level during the time in which the sequential circuit 2011 is in the reset state. Moreover, the signal S27 is set to High level in accordance with the voltage state of the signals S24 to S26. When the signal S27 is set to High level, the signal S26 is set to Low level in accordance with the voltage state of the signal S27.

The electronic circuit in this embodiment is operated as described in FIG. 8 and FIG. 9 as an example, whereby the voltage state of a signal input to the sequential circuit can be set in accordance with the voltage state of an output signal of the sequential circuit. Accordingly, a reset signal of the sequential circuit can be set to the first voltage state after the output signal of the sequential circuit is set to the second voltage state from the first voltage state. For example, even in the case where operation in the sequential circuit is delayed, the voltage state of a reset signal input to the sequential circuit is set in accordance with the voltage state of the output signal of the sequential circuit. Thus, a malfunction in the sequential circuit can be prevented.

Figure 10A:
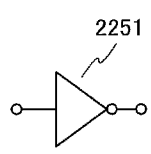
FIGS. 10A to 10C are circuit diagrams each illustrating an example of a circuit configuration of a control circuit in the electronic circuit illustrated in FIG. 8.
Figure 10B:
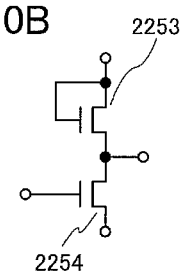
Figure 10C:
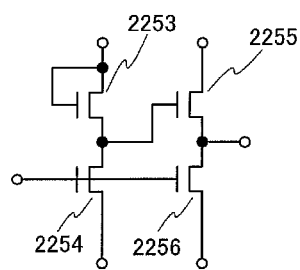

Next, an example of a circuit configuration of the control circuit in the electronic circuit in this embodiment will be described with reference to FIGS. 10A to 10C. FIGS. 10A to 10C are circuit diagrams each illustrating an example of a circuit configuration of the control circuit (the control circuit 2022A) in the electronic circuit illustrated in FIG. 8. Note that in description of the control circuits illustrated in FIGS. 10A to 10C, the description of the electronic circuit illustrated in FIG. 8 is employed as appropriate.

The control circuit illustrated in FIG. 10A includes an inverter 2251. The signal S24 is input to the inverter 2251, and the signal S23 is output from the inverter 2251. Note that FIG. 10A illustrates the control circuit including one inverter; however, this embodiment is not limited to this structure. The control circuit in the electronic circuit in this embodiment can have a structure in which (2L−1) inverters (L is a natural number) are electrically connected in series.

FIGS. 10B and 10C each illustrate an example of a circuit configuration of the inverter 2251 in FIG. 10A.

The inverter illustrated in FIG. 10B includes a transistor 2253 and a transistor 2254. As an example, all the transistors in the control circuit illustrated in FIGS. 10A to 10C are field effect transistors of the same conductivity. When all the transistors have the same conductivity, the number of manufacturing steps can be reduced as compared to the case where transistors with different conductivities are used.

One of the voltage $V_1$ and the voltage $V_2$ is applied to a gate and one of a source and a drain of the transistor 2253.

One of a source and a drain of the transistor 2254 is electrically connected to the other of the source and the drain of the transistor 2253. The other of the voltage $V_1$ and the voltage $V_2$ is applied to the other of the source and the drain of the transistor 2254.

In the inverter illustrated in FIG. 10B, the signal S24 is input to the gate of the transistor 2254, and the voltage at the other of the source and the drain of the transistor 2253 is output as the signal S23.

The inverter illustrated in FIG. 10C includes a transistor 2255 and a transistor 2256 in addition to the circuit configuration illustrated in FIG. 10B.

A gate of the transistor 2255 is electrically connected to the other of the source and the drain of the transistor 2253. The voltage which is the same as that at one of the source and the drain of the transistor 2253 (i.e., one of the voltage $V_1$ and the voltage $V_2$) is applied to one of a source and a drain of the transistor 2255.

One of a source and a drain of the transistor 2256 is electrically connected to the other of the source and the drain of the transistor 2255. The voltage which is the same as that at the other of the source and the drain of the transistor 2254 (i.e., the other of the voltage $V_1$ and the voltage $V_2$) is applied to the other of the source and the drain of the transistor 2256.

In the inverter illustrated in FIG. 10C, the signal S24 is input to the gate of the transistor 2254, and the voltage at the other of the source and the drain of the transistor 2255 is output as the signal S23. Note that the voltage of the output signal of the inverter in FIG. 10C can be made higher than that of the inverter in FIG. 10B.

As illustrated in FIGS. 10A to 10C as examples, the control circuit in the electronic circuit in this embodiment can include an inverter. With such a structure, a signal whose voltage state is set in accordance with the voltage state of a signal input to the control circuit can be output as an output signal. Moreover, a node to which an output signal of a sequential circuit is input and a node from which a signal to be input to the sequential circuit is output are not electrically connected to each other, resulting in reducing adverse effects of delay of the output signal from the sequential circuit on the signal input to the sequential circuit.

Note that the configuration of the control circuit illustrated in FIGS. 10A to 10C can also be applied to the control circuit 2022B illustrated in FIG. 8. In that case, in the description of the control circuit illustrated in FIGS. 10A to 10C, the signal S23 is replaced by the signal S26 and the signal S24 is replaced by the signal S27.

Note that this embodiment can be combined or replaced with any of the other embodiments as appropriate.

Embodiment 4

In this embodiment, an example of an electronic circuit which is one embodiment of the present invention will be described.

Figure 11:
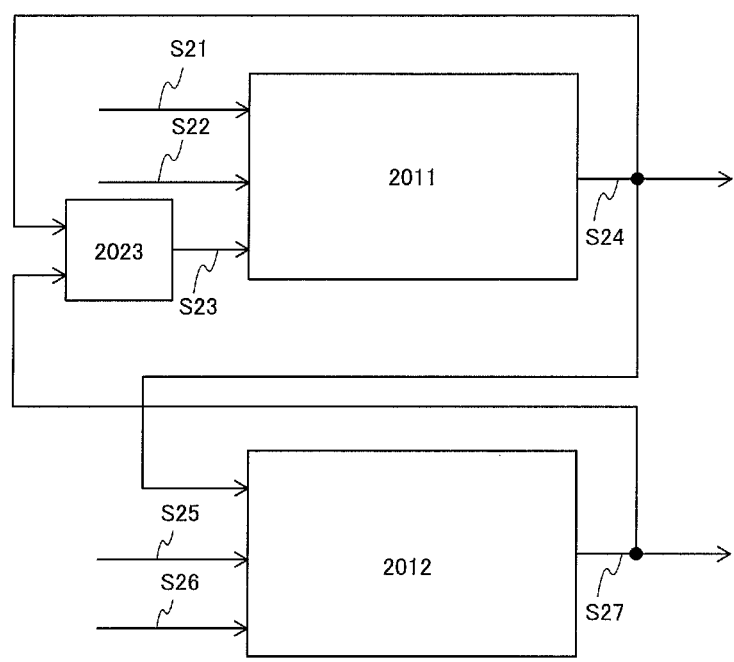
FIG. 11 is a block diagram illustrating an example of a configuration of an electronic circuit in Embodiment 4.

A configuration of an electronic circuit in this embodiment will be described with reference to FIG. 11. FIG. 11 is a block diagram illustrating an example of a configuration of the electronic circuit in this embodiment.

The electronic circuit illustrated in FIG. 11 at least includes the sequential circuit 2011, the sequential circuit 2012, and a control circuit 2023. Note that the description of the electronic circuit in FIG. 3 is employed as appropriate for portions which have the same configuration as the electronic circuit in FIG. 3; the other portions will be described below.

The control circuit 2023 has a function of outputting a signal whose voltage state is set in accordance with the signal S24 which is input from the sequential circuit 2011 and the signal S27 which is input from the sequential circuit 2012, to the sequential circuit 2011 as the signal S23. The control circuit 2023 can be electrically connected to the sequential circuit 2011 and the sequential circuit 2012, for example.

As illustrated in FIG. 11 as an example, the example of the electronic circuit in this embodiment includes a first sequential circuit (e.g., the sequential circuit 2011), a second sequential circuit (e.g., the sequential circuit 2012), and a control circuit (e.g., the control circuit 2023); a first signal, a second signal, and a third signal are input to the first sequential circuit and the first sequential circuit outputs a fourth signal; the fourth signal, a fifth signal, and a sixth signal are input to the second sequential circuit and the second sequential circuit outputs a seventh signal; and the control circuit controls the voltage state of any of the signals input to the first sequential circuit (e.g., the signal S23). Note that this embodiment is not limited to this structure, and the electronic circuit in this embodiment can have a structure including sequential circuits of (N+1) stages including (N+1) sequential circuits and a control circuit to which output signals from the Kth stage sequential circuit and the (K+1)th stage sequential circuit are input and from which a signal whose voltage state is set in accordance with the voltage state of the inputted signals is output to the Kth stage sequential circuit.

Figure 12:
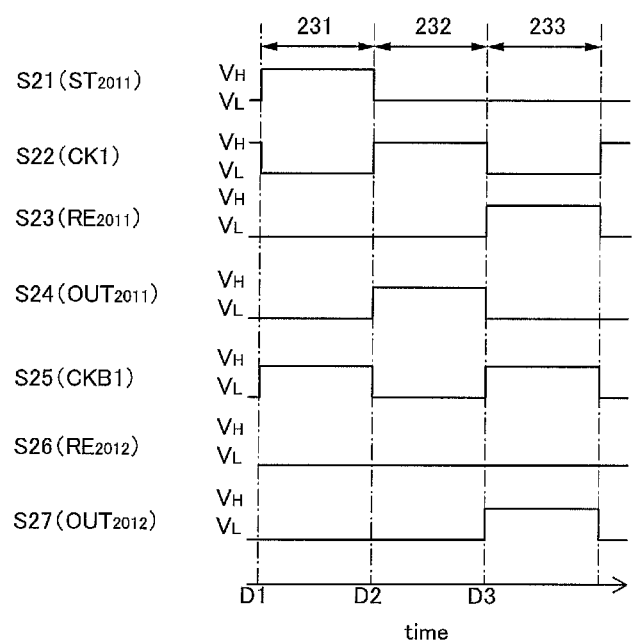
FIG. 12 is a timing chart illustrating an example of operation of the electronic circuit illustrated in FIG. 11.

Next, an example of operation of the electronic circuit in this embodiment will be described with reference to FIG. 12. FIG. 12 is a timing chart illustrating an example of the operation of the electronic circuit illustrated in FIG. 11, and illustrates the waveforms of the signals S21 to S27. Note that in the example of the operation of the electronic circuit in FIG. 11, which is described with reference to FIG. 12, each of the signals S21 to S27 is a binary digital signal, the signal S22 is a first clock signal, and the signal S25 is an inverted clock signal of the first clock signal. Further, in the operation of the electronic circuit in this embodiment, the voltage state of each signal illustrated in FIG. 12 can be inverted.

In the example of the operation of the electronic circuit in FIG. 11, a period can be divided into a period 231, a period 232, and a period 233 as illustrated in FIG. 12. The operation in each period is described below.

First, in the period 231, at the time D1, the signal S21 is set to High level; the signal S22 is set to Low level; the signal S25 is set to High level; and the signal S26 remains at Low level.

At that time, the sequential circuit 2011 is set to a set state. Moreover, the signal S24, which is the output signal of the sequential circuit 2011, is at Low level in accordance with the voltage state of the signals S21 to S23. Further, the signal S27 is at Low level in accordance with the voltage state of the signals S24 to S26. When the signal S24 is at Low level and the signal S27 is at Low level, the signal S23, which is the output signal of the control circuit 2023, is at Low level in accordance with the voltage state of the signals S24 and S27.

Then, in the period 232, at the time D2, the signal S21 is set to Low level; the signal S22 is set to High level; the signal S25 is set to Low level; and the signal S26 remains at Low level.

At that time, the signal S24 is set to High level in accordance with the voltage state of the signals S21 to S23. When the signal S24 is set to High level, the sequential circuit 2012 is set to a set state. Moreover, the signal S27 remains at Low level in accordance with the voltage state of the signals S24 to S26. Further, when the signal S24 is at High level and the signal S27 is at Low level, the signal S23 remains at Low level in accordance with the voltage state of the signal S24 and the signal S27.

Then, in the period 233, at the time D3, the signal S21 remains at Low level; the signal S22 is set to Low level; the signal S25 is set to High level; and the signal S26 remains at Low level.

At that time, the signal S24 is set to Low level in accordance with the voltage state of the signals S21 to S23. Moreover, the signal S27 is set to High level in accordance with the voltage state of the signals S24 to S26. When the signal S24 is set to High level and the signal S27 is set to Low level, the signal S23 is set to High level in accordance with the voltage state of the signal S24 and the signal S27. Furthermore, when the signal S23 is set to High level, the sequential circuit 2011 is set to a reset state. The signal S24 remains at Low level during the time in which the sequential circuit 2011 is in the reset state.

The electronic circuit in this embodiment is operated as described in FIG. 12 as an example, whereby at least one voltage state of signals input to one sequential circuit can be set in accordance with the voltage state of output signals of a plurality of sequential circuits. Accordingly, a reset signal of the first sequential circuit can be set to the first voltage state after the output signal of the first sequential circuit is set to the second voltage state from the first voltage state, and moreover, the voltage state of the output signal can be correctly controlled as compared to the case where the voltage state of a signal input to one sequential circuit is controlled by using an output signal of the sequential circuit. For example, even in the case where operation in each sequential circuit is delayed, the voltage state of a reset signal input to one sequential circuit is set in accordance with the voltage state of the output signal of each sequential circuit. Thus, a malfunction in the sequential circuit can be prevented, and a malfunction in the electronic circuit can be prevented.

Next, an example of a circuit configuration of the control circuit in the electronic circuit in this embodiment will be described with reference to FIGS. 13A to 13G. FIGS. 13A to 13G are circuit diagrams each illustrating an example of a circuit configuration of the control circuit (the control circuit 2023) in the electronic circuit illustrated in FIG. 11.

Figure 13A:
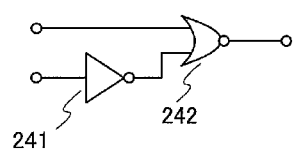
FIGS. 13A to 13G are circuit diagrams each illustrating an example of a circuit configuration of a control circuit in the electronic circuit illustrated in FIG. 11.

The control circuit illustrated in FIG. 13A includes an inverter 241 and a NOR gate (also referred to as a NOR circuit) 242. The NOR gate 242 is electrically connected to the inverter 241. The signal S24 is input to the NOR gate 242. The signal S27 is input to the inverter 241. The signal S23 is output from the NOR gate 242.

Figure 13B:
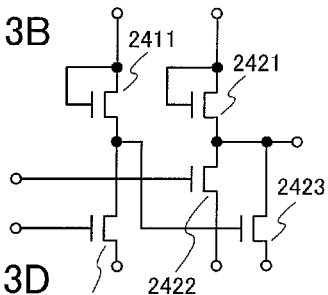

FIG. 13B illustrates an example of a circuit configuration of the control circuit illustrated in FIG. 13A.

The control circuit illustrated in FIG. 13B includes a transistor 2411, a transistor 2412, a transistor 2421, a transistor 2422, and a transistor 2423. As an example, all the transistors in the control circuit illustrated in FIGS. 13A to 13G are field effect transistors of the same conductivity. When all the transistors have the same conductivity, the number of manufacturing steps can be reduced as compared to the case where transistors with different conductivities are used.

One of the voltage $V_1$ and the voltage $V_2$ is applied to a gate and one of a source and a drain of the transistor 2411.

One of a source and a drain of the transistor 2412 is electrically connected to the other of the source and the drain of the transistor 2411. One of the voltage $V_1$ and the voltage $V_2$ is applied to the other of the source and the drain of the transistor 2412.

The voltage which is the same as that at one of the source and the drain of the transistor 2411 (i.e., one of the voltage $V_1$ and the voltage $V_2$) is applied to a gate and one of a source and a drain of the transistor 2421.

One of a source and a drain of the transistor 2422 is electrically connected to the other of the source and the drain of the transistor 2421. The voltage which is the same as that at the other of the source and the drain of the transistor 2412 (i.e., the other of the voltage $V_1$ and the voltage $V_2$) is applied to the other of the source and the drain of the transistor 2422.

A gate of the transistor 2423 is electrically connected to the other of the source and the drain of the transistor 2411. One of a source and a drain of the transistor 2423 is electrically connected to the other of the source and the drain of the transistor 2421. The voltage which is the same as that at the other of the source and the drain of the transistor 2412 (i.e., the other of the voltage $V_1$ and the voltage $V_2$) is applied to the other of the source and the drain of the transistor 2423.

In the control circuit illustrated in FIG. 13B, the signal S24 is input to the gate of the transistor 2422, the signal S27 is input to the gate of the transistor 2412, and the voltage at the other of the source and the drain of the transistor 2421 is output as the signal S23.

Figure 13C:
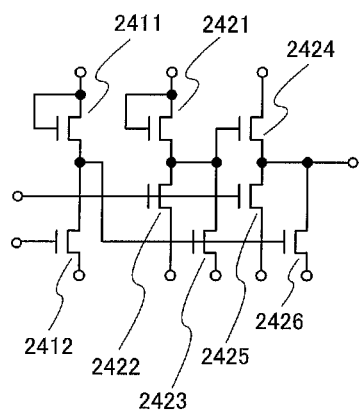

The control circuit illustrated in FIG. 13C includes a transistor 2424, a transistor 2425, and a transistor 2426 in addition to the circuit configuration illustrated in FIG. 13B.

A gate of the transistor 2424 is electrically connected to the other of the source and the drain of the transistor 2421. The voltage which is the same as that at one of the source and the drain of the transistor 2411 (i.e., one of the voltage $V_1$ and the voltage $V_2$) is applied to one of a source and a drain of the transistor 2424.

One of a source and a drain of the transistor 2425 is electrically connected to the other of the source and the drain of the transistor 2424. The voltage which is the same as that at the other of the source and the drain of the transistor 2412 (i.e., the other of the voltage $V_1$ and the voltage $V_2$) is applied to the other of the source and the drain of the transistor 2425.

A gate of the transistor 2426 is electrically connected to the other of the source and the drain of the transistor 2411. One of a source and a drain of the transistor 2426 is electrically connected to the other of the source and the drain of the transistor 2424. The voltage which is the same as that at the other of the source and the drain of the transistor 2412 (i.e., the other of the voltage $V_1$ and the voltage $V_2$) is applied to the other of the source and the drain of the transistor 2426.

In the control circuit illustrated in FIG. 13C, the signal S24 is input to the gate of the transistor 2422 and the gate of the transistor 2425, the signal S27 is input to the gate of the transistor 2412, and the voltage at the other of the source and the drain of the transistor 2424 is output as the signal S23.

Figure 13D:
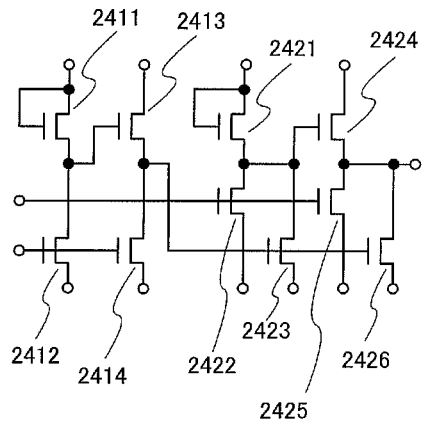

The control circuit illustrated in FIG. 13D includes a transistor 2413 and a transistor 2414 in addition to the circuit configuration illustrated in FIG. 13C.

A gate of the transistor 2413 is electrically connected to the other of the source and the drain of the transistor 2411. The voltage which is the same as that at one of the source and the drain of the transistor 2411 (i.e., one of the voltage $V_1$ and the voltage $V_2$) is applied to one of a source and a drain of the transistor 2413.

One of a source and a drain of the transistor 2414 is electrically connected to the other of the source and the drain of the transistor 2413. The other of the voltage $V_1$ and the voltage $V_2$ is applied to the other of the source and the drain of the transistor 2414.

Unlike in the control circuit illustrated in FIG. 13C, the gate of the transistor 2426 is electrically connected to the other of the source and the drain of the transistor 2413 in the control circuit illustrated in FIG. 13D.

In the control circuit illustrated in FIG. 13D, the signal S24 is input to the gate of the transistor 2422 and the gate of the transistor 2425; the signal S27 is input to the gate of the transistor 2412 and the gate of the transistor 2414; and the voltage at the other of the source and the drain of the transistor 2424 is output as the signal S23.

Figure 13E:
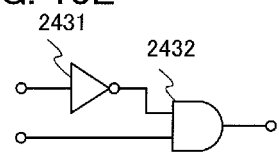

The control circuit illustrated in FIG. 13E includes an inverter 2431 and an AND gate (also referred to as an AND circuit) 2432. The AND gate 2432 is electrically connected to the inverter 2431. The signal S24 is input to the inverter 2431. The signal S27 is input to the AND gate 2432. The signal S23 is output from the AND gate 2432.

Figure 13F:
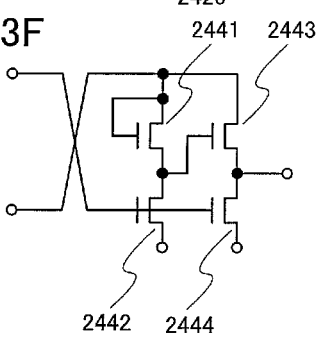

The control circuit illustrated in FIG. 13F includes a transistor 2441, a transistor 2442, a transistor 2443, and a transistor 2444.

The signal S27 is input to one of a source and a drain of the transistor 2441.

One of a source and a drain of the transistor 2442 is electrically connected to the other of the source and the drain of the transistor 2441. The voltage $V_1$ or the voltage $V_2$ is applied to the other of the source and the drain of the transistor 2442.

A gate of the transistor 2443 is electrically connected to the other of the source and the drain of the transistor 2441. The signal S27 is input to one of a source and a drain of the transistor 2443.

One of a source and a drain of the transistor 2444 is electrically connected to the other of the source and the drain of the transistor 2443. The voltage which is the same as that at the other of the source and the drain of the transistor 2442 (i.e., the voltage $V_1$ or the voltage $V_2$) is applied to the other of the source and the drain of the transistor 2444.

In the control circuit illustrated in FIG. 13F, the signal S24 is input to the gate of the transistor 2442 and the gate of the transistor 2444; the signal S27 is input to the gate and one of the source and the drain of the transistor 2441 and one of the source and the drain of the transistor 2443; and the voltage at the other of the source and the drain of the transistor 2443 is output as the signal S23.

Figure 13G:
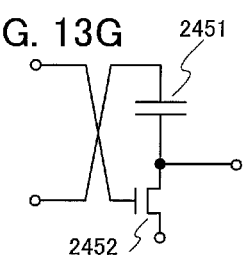

The control circuit illustrated in FIG. 13G includes a capacitor 2451 and a transistor 2452.

One of a source and a drain of the transistor 2452 is electrically connected to a second terminal of the capacitor 2451. The voltage $V_1$ or the voltage $V_2$ is applied to the other of the source and the drain of the transistor 2452.

In the control circuit illustrated in FIG. 13G, the signal S24 is input to a gate of the transistor 2452, the signal S27 is input through a first terminal of the capacitor 2451, and the voltage at the second terminal of the capacitor 2451 is output as the signal S23.

The control circuits illustrated in FIGS. 13A to 13G each has a structure including a logic circuit to which two signals are input and from which one signal is output. With this structure, the state of the output signal can be set more correctly.

Note that this embodiment can be combined or replaced with any of the other embodiments as appropriate.

Embodiment 5

In this embodiment, an example of a circuit configuration of a sequential circuit in an electronic circuit, which is one embodiment of the present invention, will be described.

An example of a circuit configuration of a sequential circuit in this embodiment will be described with reference to FIGS. 14A to 14E. FIGS. 14A to 14E are circuit diagrams each illustrating an example of a circuit configuration of the sequential circuit in this embodiment.

Figure 14A:
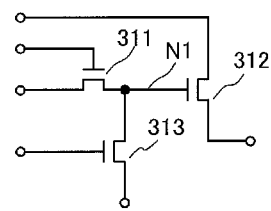
FIGS. 14A to 14E are circuit diagrams each illustrating an example of a circuit configuration of a sequential circuit in Embodiment 5.
Figure 14B:
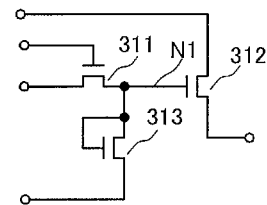

The sequential circuit illustrated in FIG. 14A includes a transistor 311, a transistor 312, and a transistor 313. As an example, all the transistors illustrated in FIGS. 14A to 14E are field effect transistors of the same conductivity. When all the transistors have the same conductivity, the number of manufacturing steps can be reduced as compared to the case where transistors with different conductivities are used.

A signal S31 is input to one of a source and a drain of the transistor 311.

A gate of the transistor 312 is electrically connected to the other of the source and the drain of the transistor 311. Note that a portion where the gate of the transistor 312 is connected to another element can be referred to as a node N1.

One of a source and a drain of the transistor 313 is electrically connected to the other of the source and the drain of the transistor 311. The voltage $V_1$ or the voltage $V_2$ is applied to the other of the source and the drain of the transistor 313.

In the sequential circuit illustrated in FIG. 14A, the signal S31 is input to a gate and one of the source and the drain of the transistor 311; a signal S32 is input to one of a source and a drain of the transistor 312; a signal S33 is input to a gate of the transistor 313; and the voltage at the other of the source and the drain of the transistor 312 is output as a signal S34.

In the sequential circuit illustrated in FIG. 14A, instead of the signal S31, a signal S35 which is an inverted clock signal of the signal S32 can be input to one of the source and the drain of the transistor 311. Alternatively, in the sequential circuit in FIG. 14A, one of the voltage $V_1$ and the voltage $V_2$ can be applied to one of the source and the drain of the transistor 311 and the other of the voltage $V_1$ and the voltage $V_2$ can be applied to the other of the source and the drain of the transistor 313, instead of inputting the signal S31 to one of the source and the drain of the transistor 311. Further alternatively, the sequential circuit in FIG. 14A can have a structure illustrated in FIG. 14B, in which the gate of the transistor 313 is electrically connected to the other of the source and the drain of the transistor 311 and the signal S33 is input to the other of the source and the drain of the transistor 313, instead of inputting the signal S33 to the gate of the transistor 313 and applying the voltage $V_1$ or the voltage $V_2$ to the other of the source and the drain of the transistor 313.

Figure 14C:
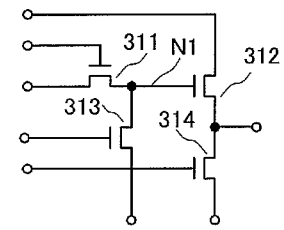

The sequential circuit illustrated in FIG. 14C includes a transistor 314 in addition to the configuration of the sequential circuit illustrated in FIG. 14A. Note that in the sequential circuit in FIG. 14C, the description of the sequential circuit in FIG. 14A is employed as appropriate for the same portion as the sequential circuit in FIG. 14A; the other portions will be described below.

One of a source and a drain of the transistor 314 is electrically connected to the other of the source and the drain of the transistor 312. The voltage which is the same as that at the other of the source and the drain of the transistor 313 (i.e., the voltage $V_1$ or the voltage $V_2$) is applied to the other of the source and the drain of the transistor 314. Moreover, in the sequential circuit in FIG. 14C, the signal S33 is input to a gate of the transistor 314.

Note that in the sequential circuit in FIG. 14C, instead of the signal S33, a signal S36 can be input to the gate of the transistor 314.

Figure 14D:
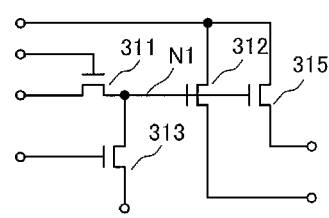

The sequential circuit illustrated in FIG. 14D includes a transistor 315 in addition to the configuration of the sequential circuit illustrated in FIG. 14A. Note that in the sequential circuit in FIG. 14D, the description of the sequential circuit in FIG. 14A is employed as appropriate for the same portion as the sequential circuit in FIG. 14A; the other portions will be described below.

A gate of the transistor 315 is electrically connected to the other of the source and the drain of the transistor 311. One of a source and a drain of the transistor 315 is electrically connected to one of the source and the drain of the transistor 312. Moreover, the sequential circuit in FIG. 14D outputs the voltage at the other of the source and the drain of the transistor 315 as a signal S37.

Figure 14E:
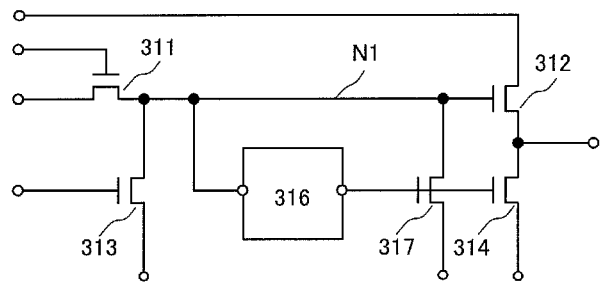

The sequential circuit illustrated in FIG. 14E includes a control circuit 316 and a transistor 317 in addition to the configuration of the sequential circuit in FIG. 14C. Note that in the sequential circuit in FIG. 14E, the description of the sequential circuit in FIG. 14C is employed as appropriate for the same portion as the sequential circuit in FIG. 14C; the other portions will be described below.

The control circuit 316 has a function of outputting, as a signal S39, a signal whose voltage state is set in accordance with the voltage state of a signal S38 input to the control circuit 316.

The signal S39 is input to a gate of the transistor 317 from the control circuit 316. One of a source and a drain of the transistor 317 is electrically connected to the gate of the transistor 312. The voltage which is the same as that at the other of the source and the drain of the transistor 314 (i.e., the voltage $V_1$ or the voltage $V_2$) is applied to the other of the source and the drain of the transistor 317.

Next, an example of a circuit configuration of the control circuit 316 will be described with reference to FIGS. 15A to 15F. FIGS. 15A to 15F are circuit diagrams each illustrating an example of a circuit configuration of the control circuit (the control circuit 316) in the sequential circuit illustrated in FIG. 14E.

Figure 15A:
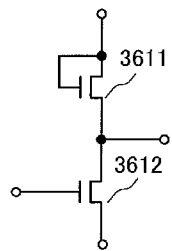
FIGS. 15A to 15F are circuit diagrams each illustrating an example of a circuit configuration of a control circuit in the sequential circuit illustrated in FIG. 14E.

The control circuit illustrated in FIG. 15A includes a transistor 3611 and a transistor 3612. As an example, all the transistors illustrated in FIGS. 15A to 15F are field effect transistors of the same conductivity. When all the transistors have the same conductivity, the number of manufacturing steps can be reduced as compared to the case where transistors with different conductivities are used.

One of the voltage $V_1$ and the voltage $V_2$ is applied to a gate and one of a source and a drain of the transistor 3611.

One of a source and a drain of the transistor 3612 is electrically connected to the other of the source and the drain of the transistor 3611. The other of the voltage $V_1$ and the voltage $V_2$ is applied to the other of the source and the drain of the transistor 3612.

In the control circuit illustrated in FIG. 15A, the signal S38 is input to a gate of the transistor 3612, and the voltage at the other of the source and the drain of the transistor 3611 is output as the signal S39.

Figure 15B:
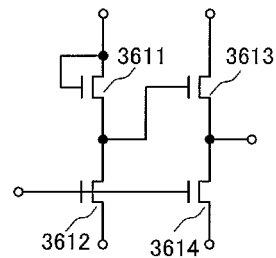

The control circuit illustrated in FIG. 15B includes a transistor 3613 and a transistor 3614 in addition to the configuration of the control circuit in FIG. 15A. Note that in the control circuit in FIG. 15B, the description of the control circuit in FIG. 15A is employed as appropriate for the same portion as the control circuit in FIG. 15A; the other portions will be described below.

A gate of the transistor 3613 is electrically connected to the other of the source and the drain of the transistor 3611. The voltage which is the same as that at one of the source and the drain of the transistor 3611 (i.e., one of the voltage $V_1$ and the voltage $V_2$) is applied to one of a source and a drain of the transistor 3613.

One of a source and a drain of the transistor 3614 is electrically connected to the other of the source and the drain of the transistor 3613. The voltage which is the same as that at the other of the source and the drain of the transistor 3612 (i.e., the other of the voltage $V_1$ and the voltage $V_2$) is applied to the other of the source and the drain of the transistor 3614.

In the control circuit illustrated in FIG. 15B, instead of applying one of the voltage $V_1$ and the voltage $V_2$, the signal S32 is input to the gate and one of the source and the drain of the transistor 3611 and one of the source and the drain of the transistor 3613.

Moreover, the control circuit in FIG. 15B outputs, as the signal S39, the voltage at the other of the source and the drain of the transistor 3613 instead of the voltage at the other of the source and the drain of the transistor 3611.

Figure 15C:
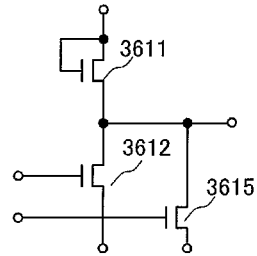

The control circuit illustrated in FIG. 15C includes a transistor 3615 in addition to the configuration of the control circuit in FIG. 15A. Note that in the control circuit in FIG. 15C, the description of the control circuit in FIG. 15A is employed as appropriate for the same portion as the control circuit in FIG. 15A; the other portions will be described below.

One of a source and a drain of the transistor 3615 is electrically connected to the other of the source and the drain of the transistor 3611. The voltage which is the same as that at the other of the source and the drain of the transistor 3612 (i.e., the other of the voltage $V_1$ and the voltage $V_2$) is applied to the other of the source and the drain of the transistor 3615.

Moreover, in the control circuit in FIG. 15C, the signal S35 is input to a gate of the transistor 3615.

Figure 15D:
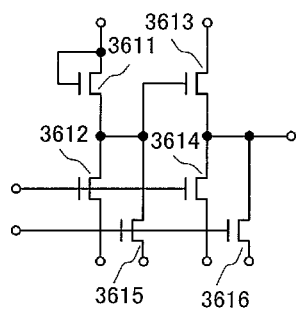

The control circuit illustrated in FIG. 15D includes a transistor 3616 in addition to a combination of the configurations of the control circuits illustrated in FIGS. 15B and 15C. Note that in the control circuit in FIG. 15D, the description of the control circuits in FIGS. 15B and 15C is employed as appropriate for the same portion as the control circuits in FIGS. 15B and 15C; the other portions will be described below.

One of a source and a drain of the transistor 3616 is electrically connected to the other of the source and the drain of the transistor 3613. The voltage which is the same as that at the other of the source and the drain of the transistor 3612 (i.e., the other of the voltage $V_1$ and the voltage $V_2$) is applied to the other of the source and the drain of the transistor 3616.

In the control circuit in FIG. 15D, the signal S35 is input to a gate of the transistor 3616.

Figure 15E:
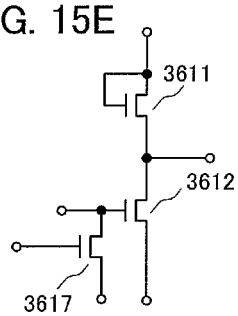

The control circuit illustrated in FIG. 15E includes a transistor 3617 in addition to the configuration of the control circuit in FIG. 15A. Note that in the control circuit in FIG. 15E, the description of the control circuit in FIG. 15A is employed as appropriate for the same portion as the control circuit in FIG. 15A; the other portions will be described below.

One of a source and a drain of the transistor 3617 is electrically connected to the gate of the transistor 3612. The voltage which is the same as that at the other of the source and the drain of the transistor 3612 (i.e., the other of the voltage $V_1$ and the voltage $V_2$) is applied to the other of the source and the drain of the transistor 3617.

In the control circuit in FIG. 15E, the signal S31 is input to a gate of the transistor 3617.

Figure 15F:
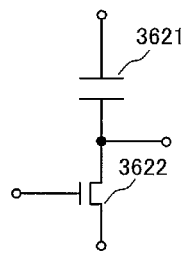

The control circuit illustrated in FIG. 15F includes a capacitor 3621 and a transistor 3622.

The signal S32 is input through a first terminal of the capacitor 3621.

One of a source and a drain of the transistor 3622 is electrically connected to a second terminal of the capacitor 3621. The voltage $V_1$ or the voltage $V_2$ is applied to the other of the source and the drain of the transistor 3622.

In the control circuit illustrated in FIG. 15F, the signal S32 is input through the first terminal of the capacitor 3621, the signal S38 is input to a gate of the transistor 3622, and the voltage at the second terminal of the capacitor 3621 is output as the signal S39.

Note that the signal S31 can function as a start signal (also referred to as $ST_{SC}$) of a sequential circuit, for example, and corresponds to the signal S1 in Embodiment 1, for example.

The signal S32 can function as a clock signal (also referred to as $CK_{SC1}$) of a sequential circuit, for example, and corresponds to the signal S2 in Embodiment 1, for example.

The signal S33 can function as a reset signal (also referred to as $RE_{SC}$) of a sequential circuit, for example, and corresponds to the signal S3 in Embodiment 1, for example.

Each of the signal S34 and the signal S37 can function as an output signal of a sequential circuit and corresponds to the signal S4 in Embodiment 1, for example. For example, the signal S34 can function as an output signal (also referred to as $OUT_{SC1}$) of a sequential circuit, and the signal S37 can function as an output signal (also referred to as $OUT_{SC2}$) of a sequential circuit.

The signal S35 can function as a second clock signal (also referred to as $CK_{SC2}$) of a sequential circuit, for example.

The signal S36 can function as a second reset signal of a sequential circuit, for example. As for the signal S36, in the case of a structure including sequential circuits of plural stages, an output signal from the (K+1)th stage sequential circuit can be used as the second reset signal of the Kth stage sequential circuit.

As illustrated in FIG. 14E, a signal of the voltage of the node N1 (such a signal is also referred to as a signal N1) can be used as the signal S38, for example. Note that this embodiment is not limited to this example. Instead of the signal N1, the signal S34 can be used as the signal S38.

The signal S39 can function as an output signal (also referred to as $OUT_{316}$) of the control circuit 316.

Figure 16:
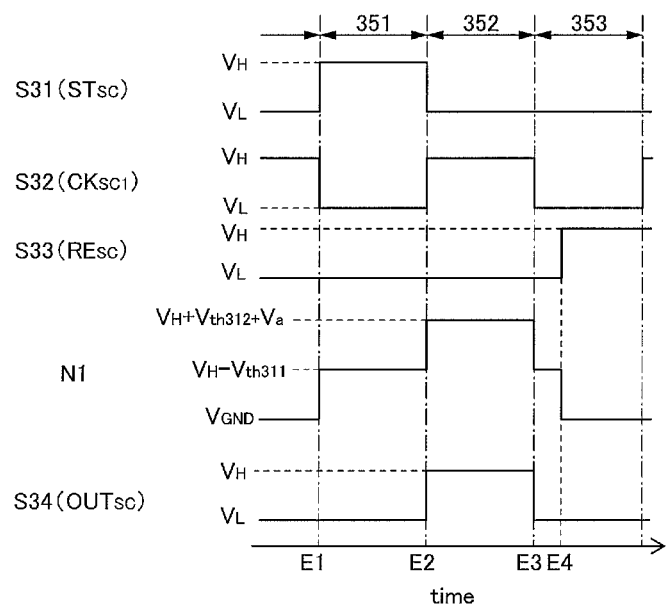
FIG. 16 is a timing chart illustrating an example of operation of the sequential circuit illustrated in FIG. 14A.

Next, an example of operation of the sequential circuit in this embodiment will be described with reference to FIG. 16. FIG. 16 is a timing chart illustrating an example of the operation of the sequential circuit illustrated in FIG. 14A. Note that in the example of the operation of the sequential circuit in FIG. 14A, which is described with reference to FIG. 16, the sequential circuit is the sequential circuit in the electronic circuit in Embodiment 2; and as an example, all the transistors 311 to 313 are n-channel transistors; all the signals S31 to S34 are binary digital signals; the signal S32 is a clock signal; and a ground potential is applied to the other of the source and the drain of the transistor 313. Further, in the operation of the sequential circuit in this embodiment, the voltage state of each signal illustrated in FIG. 16 can be inverted.

In the example of the operation of the sequential circuit in FIG. 14A, a period can be divided into a period 351, a period 352, and a period 353 as illustrated in FIG. 16. The operation in each period is described below.

First, in the period 351, at the time E1, the signal S31 is set to High level, the signal S32 is set to Low level, and the signal S33 is at Low level.

At that time, the sequential circuit is set to a set state. Moreover, the transistor 311 is turned on, and the potential of the node N1 starts to increase. The potential of the node N1 is increased to $V_H - V_{th311}$ (the threshold voltage of the transistor 311). When the potential of the node N1 becomes $V_H - V_{th311}$, the transistor 311 is turned off and the node N1 is set to a floating state. Moreover, when the absolute value of the potential of the node N1 becomes larger than the absolute value of the threshold voltage ($V_{th312}$) of the transistor 312, the transistor 312 is turned off and the signal S34 is at Low level.

Next, in the period 352, at the time E2, the signal S31 is set to Low level, the signal S32 is set to High level, and the signal S33 is at Low level.

Since the transistor 311 is kept off at that time, the potential of the node N1 remains at $V_H - V_{th311}$.

The transistor 312 is kept on when the potential of the node N1 remains at $V_H - V_{th311}$, and the potential of the other of the source and the drain of the transistor 312 starts to increase when the potential of one of the source and the drain of the transistor 312 is $V_H$. Accordingly, since the node N1 is in a floating state, the potential of the node N1 starts to rise in accordance with the potential of an output signal because of capacitive coupling of capacitance (e.g., parasitic capacitance) generated between the gate and the other of the source and the drain of the transistor 312. This is so-called bootstrap operation.

The potential of the node N1 is increased to a value larger than the sum of the potential of the node N1 in the period 351 and the threshold voltage of the transistor 312, that is, $V_H + V_{th312} + V_\alpha$ ($V_\alpha$ is a given positive value). At that time, the transistor 312 is kept on.

Next, in the period 353, at the time E3, the signal S31 is at Low level, the signal S32 is set to Low level, and the signal S33 remains at Low level.

At that time, the transistor 312 is kept on, and the potential of the other of the source and the drain of the transistor 312 starts to decrease when the potential of one of the source and the drain of the transistor 312 is $V_L$. Since the node N1 is in a floating state, the potential of the node N1 starts to fall because of capacitive coupling of the capacitance generated between the gate and the other of the source and the drain of the transistor 312.

The potential of the node N1 is decreased to $V_L + V_{th312}$. When the potential of the node N1 becomes $V_L + V_{th312}$, the transistor 312 is turned off. Note that in the example of the operation of the sequential circuit in FIG. 14A, which is described with reference to FIG. 16, $V_L + V_{th312}$ is equal to $V_H - V_{th311}$; however, this embodiment is not limited to this example, and $V_L + V_{th312}$ and $V_H - V_{th311}$ can be different values in the sequential circuit in this embodiment. At that time, the signal S34 is set to Low level. Then, when the signal S33 is set to High level at the time E4, the transistor 313 is turned on, the potential of the node N1 is set to $V_{GND}$, and the sequential circuit is set in a reset state. The transistor 312 is kept off during the time in which the sequential circuit is in the reset state.

As illustrated in FIGS. 14A to 14E and FIGS. 15A to 15F as examples, the sequential circuit in the electronic circuit in this embodiment can be constituted by field effect transistors of the same conductivity, for example. By using the transistors of the same conductivity, the number of manufacturing steps can be reduced as compared to the case where transistors with different conductivities are used.

Note that this embodiment can be combined or replaced with any of the other embodiments as appropriate.

Embodiment 6

Figure 17:
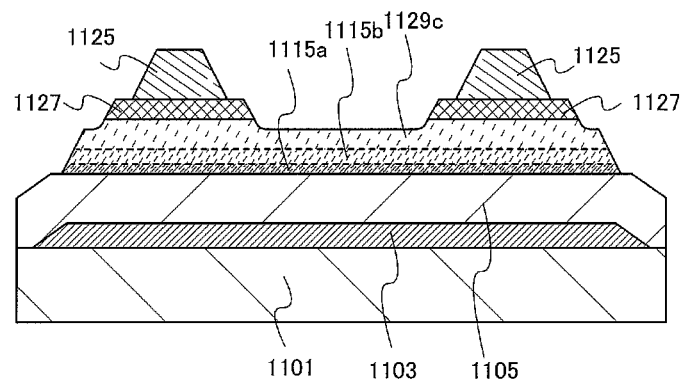
FIG. 17 is a cross-sectional view illustrating an example of a structure of a transistor in Embodiment 6.

In this embodiment, an example of a structure of a transistor that can be used in an electronic circuit which is one embodiment of the present invention will be described.
(Structure 1)
An example of a structure of a transistor in this embodiment, which can be used in the electronic circuit which is one embodiment of the present invention, will be described with reference to FIG. 17. FIG. 17 is a cross-sectional view illustrating an example of a structure of the transistor in this embodiment, which can be used in the electronic circuit which is one embodiment of the present invention.

The transistor illustrated in FIG. 17 includes, over a substrate 1101, a gate electrode 1103; a microcrystalline semiconductor layer 1115a; a mixed layer 1115b; a layer 1129c containing an amorphous semiconductor; a gate insulating layer 1105 provided between the gate electrode 1103 and the microcrystalline semiconductor layer 1115a, impurity semiconductor layers 1127 which are in contact with the layer 1129c containing the amorphous semiconductor and include regions with a function of a source region or a drain region; and wirings 1125 which are in contact with the impurity semiconductor layers 1127.

Note that when it is described that "A is provided over or on B" in this specification, A is not necessarily provided on and in direct contact with B. For example, the case where another object is placed between A and B in the cross-sectional view is also included unless otherwise specified. Here, each of A and B corresponds to an object (e.g., a device, an element, a circuit, a wiring, an electrode, a terminal, a film, or a layer).

Similarly, when it is described that "A is provided under B", B is not necessarily provided under and in direct contact with A. For example, the case where another object is placed between A and B in the cross-sectional view is also included unless otherwise specified.

As the substrate 1101, a glass substrate, a ceramic substrate, a plastic substrate with heat resistance which can withstand process temperature in the manufacturing steps, or the like can be used. When the substrate 1101 does not need a light-transmitting property, a metal substrate (e.g., a stainless steel alloy substrate) whose surface is provided with an insulating layer may be used as the substrate 1101. As the glass substrate, an alkali-free glass substrate of barium borosilicate glass, aluminoborosilicate glass, aluminosilicate glass, or the like may be used, for example. Moreover, as the substrate 1101, a glass substrate having any of the following size can be used: the 3rd generation (550 mm×650 mm); the 3.5th generation (600 mm×720 mm or 620 mm×750 mm); the 4th generation (680 mm×880 mm or 730 mm×920 mm); the 5th generation (1100 mm×1300 mm); the 6th generation (1500 mm×1850 mm); the 7th generation (1870 mm×2200 mm); the 8th generation (2200 mm×2400 mm); the 9th generation (2400 mm×2800 mm or 2450 mm×3050 mm); and the 10th generation (2950 mm×3400 mm).

The gate electrode 1103 can be formed using a metal material such as molybdenum, titanium, chromium, tantalum, tungsten, aluminum, copper, neodymium, or scandium; or an alloy material containing any of these materials as a main component. Moreover, the gate electrode 1103 can be formed by stacking the materials that can be used for forming the gate electrode 1103. Alternatively, the gate electrode 1103 may be formed using a semiconductor layer typified by polycrystalline silicon doped with an impurity element such as phosphorus, or an AgPdCu alloy.

For example, as a two-layer structure of the gate electrode 1103, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked is preferably employed. As a three-layer structure of the gate electrode 1103, a stack of a tungsten layer or a tungsten nitride layer, an alloy layer of aluminum and silicon or an alloy layer of aluminum and titanium, and a titanium nitride layer or a titanium layer is preferably employed. When a metal layer functioning as a barrier layer is stacked over a layer with low electric resistance, the electric resistance can be reduced and diffusion of a metal element from the metal layer into the semiconductor layer can be prevented.

Note that in order to increase adhesion between the gate electrode 1103 and the substrate 1101, a nitride layer of any of the above metal materials may be provided between the substrate 1101 and the gate electrode 1103.

The gate insulating layer 1105 can be formed using a single layer or a stack of any of a silicon oxide layer, a silicon nitride layer, a silicon oxynitride layer, and a silicon nitride oxide layer by a CVD method, a sputtering method, or the like.

Note that in this specification, silicon oxynitride contains more oxygen than nitrogen, and in the case where measurements are performed using Rutherford backscattering spectrometry (RBS) and hydrogen forward scattering (HFS), silicon oxynitride preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen, and in the case where measurements are conducted using RBS and HFS, silicon nitride oxide preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

A microcrystalline semiconductor included in the microcrystalline semiconductor layer 1115a is a semiconductor having an intermediate structure between amorphous and crystalline (including single crystal and polycrystalline) structures. A microcrystalline semiconductor is a semiconductor having a third state that is stable in terms of free energy and a crystalline semiconductor having short-range order and lattice distortion, in which columnar crystals or needle-like crystals having a crystal grain size of 2 nm to 200 nm, preferably 10 nm to 80 nm, more preferably 20 nm to 50 nm have grown in a direction normal to the substrate surface. Therefore, a crystal grain boundary is sometimes formed at the interface of the columnar crystals or the needle-like crystals.

The Raman spectrum of microcrystalline silicon, which is a typical example of a microcrystalline semiconductor, is shifted to a wave number lower than 520 cm$^{-1}$, which represents a peak of the Raman spectrum of single crystal silicon. That is, the peak of the Raman spectrum of microcrystalline silicon is located between 480 cm$^{-1}$, which represents amorphous silicon, and 520 cm$^{-1}$, which represents single crystal silicon. Moreover, a microcrystalline semiconductor contains hydrogen or halogen of at least 1 at. % or more in order to terminate dangling bonds. Further, a microcrystalline semiconductor contains a rare gas element such as helium, argon, krypton, or neon to further promote lattice distortion, whereby the stability is increased and a favorable microcrystalline semiconductor can be obtained. Such a microcrystalline semiconductor is disclosed in, for example, U.S. Pat. No. 4,409,134.

Further, when the concentration of oxygen and nitrogen contained in the microcrystalline semiconductor layer 1115a measured by secondary ion mass spectrometry is less than $1 \times 10^{18}$ atoms/cm³, the crystallinity of the microcrystalline semiconductor layer 1115a can be improved.

The layer 1129c containing the amorphous semiconductor has an amorphous structure. Moreover, the layer 1129c containing the amorphous semiconductor sometimes includes semiconductor crystal grains having a grain size of 1 nm to 10 nm, preferably 1 nm to 5 nm. Here, the layer 1129c containing the amorphous semiconductor corresponds to a semiconductor layer having lower energy at an Urbach edge and a smaller amount of defect absorption spectra which are measured by a constant photocurrent method (CPM) or photoluminescence spectroscopy, as compared to a conventional amorphous semiconductor layer. That is, the layer 1129c containing the amorphous semiconductor is a well-ordered semiconductor layer which has fewer defects and whose tail slope of a level at a band edge in the valence band is steeper, as compared to the conventional amorphous semiconductor layer. Since the tail of the level at the band edge in the valence band is steep in the layer 1129c containing the amorphous semiconductor, the band gap gets wider, and tunneling current does not easily flow.

Note that amorphous silicon is a typical example of the amorphous semiconductor in the layer 1129c containing the amorphous semiconductor.

Further, the layer 1129c containing the amorphous semiconductor may include nitrogen, an NH group, or an $NH_2$ group.

Figure 18A:
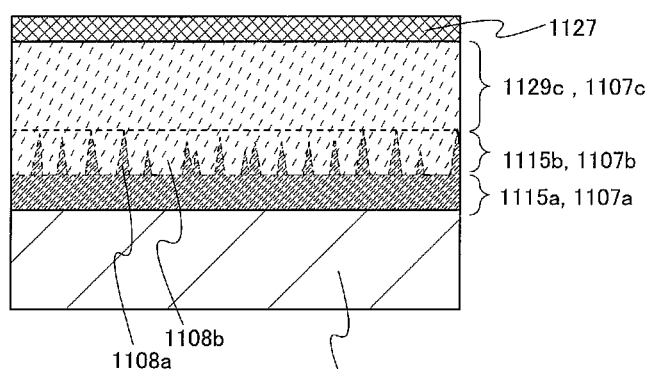
FIGS. 18A and 18B are enlarged views each illustrating a region between a gate insulating layer and an impurity semiconductor layer functioning as a source region or a drain region in the transistor illustrated in FIG. 17.
Figure 18B:
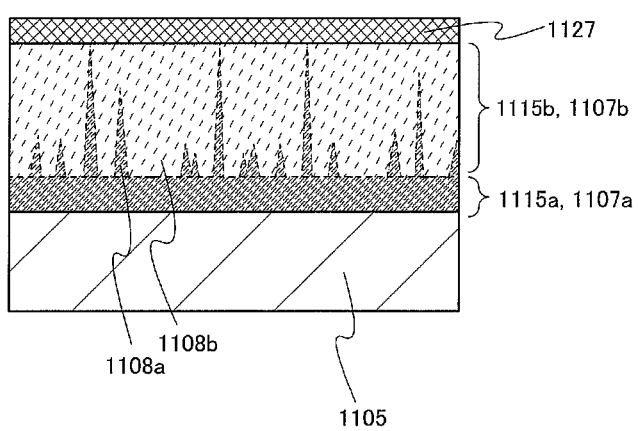

FIGS. 18A and 18B are enlarged views each illustrating a region between the gate insulating layer 1105 and the impurity semiconductor layer 1127 functioning as the source region or the drain region in FIG. 17, and specifically illustrate the mixed layer 1115b in detail.

As illustrated in FIG. 18A, the mixed layer 1115b is provided between the microcrystalline semiconductor layer 1115a and the layer 1129c containing the amorphous semiconductor. Moreover, the mixed layer 1115b includes microcrystalline semiconductor regions 1108a and an amorphous semiconductor region 1108b for filling a space between the microcrystalline semiconductor regions 1108a. Specifically, the mixed layer 1115b includes the microcrystalline semiconductor regions 1108a which protrudes from the microcrystalline semiconductor layer 1115a and the amorphous semiconductor region 1108b which is formed using a similar kind of semiconductor to the layer 1129c containing the amorphous semiconductor. Note that the amorphous semiconductor region 1108b included in the mixed layer 1115b may include semiconductor crystal grains having a grain size of 1 nm to 10 nm, preferably 1 nm to 5 nm.

The microcrystalline semiconductor region 1108a is a region of a microcrystalline semiconductor having a conical or pyramidal shape or a projecting shape with a tip that narrows from the gate insulating layer 1105 to the layer 1129c containing the amorphous semiconductor. Alternatively, the microcrystalline semiconductor region 1108a may be a region of a microcrystalline semiconductor having a conical or pyramidal shape or a projecting shape with a width increasing from the gate insulating layer 1105 to the layer 1129c containing the amorphous semiconductor.

When each of the microcrystalline semiconductor regions 1108a in the mixed layer 1115b is a region of semiconductor crystal grains having a projecting shape with a tip that narrows from the gate insulating layer 1105 to the layer 1129c containing the amorphous semiconductor, the mixed layer 1115b on the microcrystalline semiconductor layer 1115a side includes a larger amount of microcrystalline semiconductor regions than the mixed layer 1115b on the side of the layer 1129c containing the amorphous semiconductor. The reason is as follows. The crystals of the microcrystalline semiconductor regions 1108a grow in the thickness direction from a surface of the microcrystalline semiconductor layer 1115a. When a gas containing nitrogen is added to the source gas or when the flow ratio of hydrogen to silane is reduced to less than that in the deposition condition of a microcrystalline semiconductor film and a gas containing nitrogen is added to the source gas, crystal growth of the semiconductor crystal grains in the microcrystalline semiconductor regions 1108a is suppressed, the semiconductor crystal grains come to have a conical or pyramidal shape, and the amorphous semiconductor is eventually deposited.

Note that the microcrystalline semiconductor region 1108a included in the mixed layer 1115b is a semiconductor whose quality is approximately the same as that of the microcrystalline semiconductor layer 1115a. The amorphous semiconductor region 1108b included in the mixed layer 1115b is a semiconductor whose quality is approximately the same as that of the amorphous semiconductor included in the layer 1129c containing the amorphous semiconductor. Further, the interface between a microcrystalline semiconductor layer and a layer containing an amorphous semiconductor corresponds to the interface between the microcrystalline semiconductor regions 1108a and the amorphous semiconductor region 1108b in the mixed layer 1115b; accordingly, it can be said that the interface between the microcrystalline semiconductor layer regions 1108a and the layer 1129c containing the amorphous semiconductor is uneven.

Since the mixed layer 1115b includes the microcrystalline semiconductor regions 1108a, it is possible to reduce the resistance in the vertical direction (the thickness direction), that is, the resistance between the microcrystalline semiconductor layer 1115a and the impurity semiconductor layer 1127 serving as the source region or the drain region.

Accordingly, a channel region is formed using the microcrystalline semiconductor layer 1115a; and the mixed layer 1115b including the microcrystalline semiconductor regions 1108a and the layer 1129c containing the amorphous semiconductor, which is formed using a well-ordered semiconductor layer which has few defects and whose tail slope of a level at a band edge in the valence band is steep, are provided between the microcrystalline semiconductor layer 1115a including the channel region and the impurity semiconductor layer 1127 serving as the source region or the drain region. Thus, it is possible to reduce the off-state current of the thin film transistor and increase the on-state current and the field effect mobility.

In some cases, the mixed layer 1115b is provided between the microcrystalline semiconductor layer 1115a and the impurity semiconductor layer 1127, and the layer 1129c containing the amorphous semiconductor is not formed between the mixed layer 1115b and the impurity semiconductor layer 1127 as illustrated in FIG. 18B. In such a structure, the microcrystalline semiconductor regions 1108a preferably occupy a smaller area than the amorphous semiconductor region 1108b. Thus, the off-state current of the thin film transistor can be reduced. Further, the resistance in the vertical direction (the thickness direction) and the resistance between the source region and the drain region can be reduced by the mixed layer 1115b, and the on-state current of the thin film transistor can be increased.

In addition, the mixed layer 1115b preferably includes nitrogen, for a typical example, an NH group or an $NH_2$ group. This is because defects are reduced when nitrogen, typically an NH group or an $NH_2$ group, is bonded to dangling bonds of silicon atoms at the interface between semiconductor crystal grains included in the microcrystalline semiconductor regions 1108a or at the interface between the microcrystalline semiconductor regions 1108a and the amorphous semiconductor region 1108b. Accordingly, by setting the concentration of nitrogen at $1 \times 10^{20}$ cm$^{-3}$ to $1 \times 10^{21}$ cm$^{-3}$, the dangling bonds of silicon atoms can be easily cross-linked with nitrogen, preferably an NH group, so that carriers can flow easily. Alternatively, the dangling bonds of the semiconductor atoms at the interface are terminated with the $NH_2$ group, so that the defect level disappears. As a result, the resistance in the vertical direction (the thickness direction) when the thin film transistor is on and voltage is applied between the source electrode and the drain electrode is reduced. That is, the field effect mobility and the on-state current of the thin film transistor are increased.

Further, by reduction in oxygen concentration in the mixed layer 1115b, bonds which interfere with the carrier transfer at the interface between the microcrystalline semiconductor regions 1108a and the microcrystalline semiconductor region 1108b and in defects at the interface between the semiconductor crystal grains can be reduced.

Note that here, the microcrystalline semiconductor layer 1115a refers to a region having an approximately uniform thickness. Further, the interface between the microcrystalline semiconductor layer 1115a and the mixed layer 1115b refers to a region where the region closest to the gate insulating layer 1105 is extended in a plain portion of the interface between the microcrystalline semiconductor regions 1108a and the microcrystalline semiconductor region 1108b.

The total thickness of the microcrystalline semiconductor layer 1115a and the mixed layer 1115b, that is, the distance from the interface between the microcrystalline semiconductor layer 1115a and the gate insulating layer 1105 to the tip of the projection (the projecting portion) in the mixed layer 1115b is set to 3 nm to 80 nm, preferably 5 nm to 50 nm. Accordingly, the off-state current of the thin film transistor can be reduced.

The impurity semiconductor layer 1127 is formed using amorphous silicon to which phosphorus is added, microcrystalline silicon to which phosphorus is added, or the like. Note that when a p-channel thin film transistor is formed as the thin film transistor, the impurity semiconductor layer 1127 is formed using microcrystalline silicon to which boron is added, amorphous silicon to which boron is added, or the like. Note that when ohmic contact is formed between the mixed layer 1115b and the wirings 1125 or between the layer 1129c containing the amorphous semiconductor and the wirings 1125, the impurity semiconductor layer 1127 is not necessarily formed.

Further, when the impurity semiconductor layer 1127 is formed using microcrystalline silicon to which phosphorus or boron is added, characteristics of the interface can be improved by forming a microcrystalline semiconductor layer, typically a microcrystalline silicon layer, between the mixed layer 1115b and the impurity semiconductor layer 1127 or between the layer 1129c containing the amorphous semiconductor and the impurity semiconductor layer 1127. Thus, it is possible to reduce the resistance generated at the interface between the mixed layer 1115b and the impurity semiconductor layer 1127 or between the layer 1129c containing the amorphous semiconductor and the impurity semiconductor layer 1127. As a result, it is possible to increase the amount of current flowing through the source region, the microcrystalline semiconductor layer 1115a, the mixed layer 1115b, and the layer 1129c containing the amorphous semiconductor, and the drain region of the thin film transistor, and the on-state current and the field effect mobility can be increased.

The wiring 1125 illustrated in FIG. 17 can be a single layer or a stack of aluminum, copper, titanium, neodymium, scandium, molybdenum, chromium, tantalum, tungsten, or the like. Alternatively, the wiring 1125 may be formed using an aluminum alloy to which an element for preventing generation of hillocks (e.g., an Al—Nd alloy which can be used for the gate electrode 1103) is added. Moreover, the wiring 1125 may have a layered structure in which a layer on the side which is in contact with the impurity semiconductor layer 1127 is formed using titanium, tantalum, molybdenum, tungsten, or nitride of any of these elements and aluminum or an aluminum alloy is formed thereover. Further, the wiring 1125 may have a layered structure in which upper and lower surfaces of aluminum or an aluminum alloy are sandwiched between titanium, tantalum, molybdenum, tungsten, or nitride of any of these elements.

In the thin film transistor illustrated in FIG. 17 and FIGS. 18A and 18B, the off-state current can be reduced, and the on-state current and the field effect mobility can be increased. Moreover, the channel region in the thin film transistor illustrated in FIG. 17 and FIGS. 18A and 18B is formed using the microcrystalline semiconductor layer; therefore, the thin film transistor less deteriorates, electrical characteristics are not likely to deteriorate, and the thin film transistor has high reliability. Further, since the on-state current of the thin film transistor in FIG. 17 and FIGS. 18A and 18B is high, it is possible to reduce the area of the channel region, that is, the area occupied by the thin film transistor as compared to a thin film transistor in which amorphous silicon is used for a channel region; thus, the thin film transistors can be highly integrated.

(Structure 2)

Figure 19:
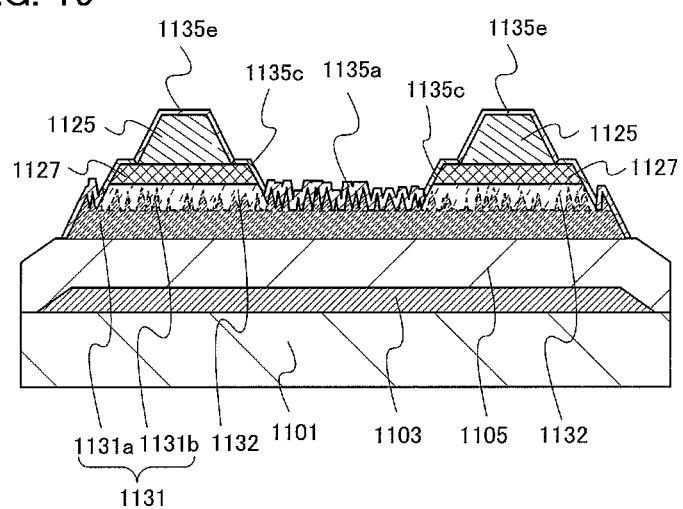
FIG. 19 is a cross-sectional view illustrating an example of a structure of a transistor in Embodiment 6.

FIG. 19 is a cross-sectional view of one embodiment of a thin film transistor. The thin film transistor illustrated in FIG. 19 includes the gate electrode 1103 over the substrate 1101; the gate insulating layer 1105 covering the gate electrode 1103; a microcrystalline semiconductor layer 1131 which is in contact with the gate insulating layer 1105 and functions as a channel region; a pair of layers 1132 containing an amorphous semiconductor, which is provided over the microcrystalline semiconductor layer 1131; and the impurity semiconductor layers 1127 which are in contact with the layers 1132 containing the amorphous semiconductor and function as a source region and a drain region. Moreover, the thin film transistor includes the wirings 1125 which are in contact with the impurity semiconductor layers 1127. The wirings 1125 function as a source electrode and a drain electrode. Further, a first insulating layer 1135a is formed on a surface of the microcrystalline semiconductor layer 1131. Second insulating layers 1135c are formed on surfaces of the pair of layers 1132 containing the amorphous semiconductor and surfaces of the impurity semiconductor layers 1127. Furthermore, third insulating layers 1135e are formed on surfaces of the wirings 1125.

The microcrystalline semiconductor layer 1131 includes a first microcrystalline semiconductor layer 1131a which is in contact with the gate insulating layer 1105, and a second microcrystalline semiconductor layer 1131*b* having a plurality of protrusions (projections) with a conical or pyramidal shape are formed.

The first microcrystalline semiconductor layer 1131*a* is formed using a microcrystalline semiconductor which is similar to the microcrystalline semiconductor layer 1115*a* illustrated in FIG. 17. The second microcrystalline semiconductor layer 1131*b* can be formed in a similar manner to the microcrystalline semiconductor regions 1108*a* included in the mixed layer 1115*b* illustrated in FIGS. 18A and 18B.

Like the layer 1129*c* containing the amorphous semiconductor illustrated in FIG. 18A, the pair of layers 1132 containing the amorphous semiconductor can be formed using a well-ordered semiconductor which has fewer defects and whose tail slope of a level at a band edge in the valence band is steeper than a conventional amorphous semiconductor layer.

The first insulating layer 1135*a* is formed using an oxide layer formed by oxidizing the microcrystalline semiconductor layer 1131, a nitride layer formed by nitriding the microcrystalline semiconductor layer 1131, an oxynitride layer or a nitride oxide layer formed by nitriding and oxidizing the microcrystalline semiconductor layer 1131, or the like. A typical example of the first insulating layer 1135*a* is a silicon oxide layer, a silicon nitride layer, a silicon oxynitride layer, or a silicon nitride oxide layer.

The second insulating layers 1135*c* are formed using oxide layers formed by oxidizing the pair of layers 1132 containing the amorphous semiconductor and the impurity semiconductor layers 1127, nitride layers formed by nitriding the pair of layers 1132 containing the amorphous semiconductor and the impurity semiconductor layers 1127, oxynitride layers or nitride oxide layers formed by nitriding and oxidizing the pair of layers 1132 containing the amorphous semiconductor and the impurity semiconductor layers 1127, or the like. A typical example of the second insulating layer 1135*c* is a silicon oxide layer, a silicon nitride layer, a silicon oxynitride layer, or a silicon nitride oxide layer. Moreover, a typical example of the second insulating layer 1135*c* is an insulating layer obtained by adding phosphorus or boron to any of the above insulating layers.

The third insulating layers 1135*e* are formed using oxide layers formed by oxidizing the wirings 1125, nitride layers formed by nitriding the wirings 1125, or oxynitride layers or nitride oxide layers formed by nitriding and oxidizing the wirings 1125. Note that here, the third insulating layers 1135*e* are formed on top surfaces and side surfaces of the wirings 1125; alternatively, the third insulating layers 1135*e* are sometimes formed only on the side surfaces of the wirings 1125 and not on the top surfaces of the wirings 1125. A typical example of the third insulating layers 1135*e* is a metal oxide layer, a metal nitride layer, a metal oxynitride layer, or a metal nitride oxide layer. The metal here refers to any of the metal elements which can be used for the wirings 1125.

The layer 1132 contains an amorphous semiconductor and thus has weak n-type conductivity. Moreover, the layer 1132 containing the amorphous semiconductor has lower density than the microcrystalline semiconductor layer 1131. Accordingly, the second insulating layers 1135*c* formed by oxidizing or nitriding the amorphous semiconductor layer are rough insulating layers having low density and low insulating properties. However, in the thin film transistor described in this embodiment, the first insulating layer 1135*a* formed by oxidizing the microcrystalline semiconductor layer 1131 is formed on the back channel side. Since the microcrystalline semiconductor layer has higher density than the amorphous semiconductor layer, the first insulating layer 1135*a* also has high density and high insulating properties. Further, the second microcrystalline semiconductor layer 1131*b* has a plurality of conical or pyramidal protrusions (projections) and thus has an uneven surface. Therefore, a leak path from the source region to the drain region has a long distance. With such structures, the leakage current and the off-state current of the thin film transistor can be reduced.

In the thin film transistor described in this embodiment, a microcrystalline semiconductor layer having a plurality of conical or pyramidal protrusions is used for a channel region, and a pair of layers containing an amorphous semiconductor is formed in contact with the microcrystalline semiconductor layer. Accordingly, the on-state current of the thin film transistor can be increased as compared to a thin film transistor in which an amorphous semiconductor is used for a channel region, and the off-state current of the thin film transistor can be reduced as compared to a thin film transistor in which a conventional microcrystalline semiconductor is used for a channel region.

When a thin film transistor with the above-described Structure 1 or Structure 2, in which a microcrystalline semiconductor is used for a channel region, is used as a transistor in the electronic circuit which is one embodiment of the present invention, the degree of degradation of characteristics of the thin film transistor can be reduced, and the degree of deterioration in display quality can be suppressed. Further, when a microcrystalline semiconductor is used for a semiconductor layer of the thin film transistor, the productivity can be increased; thus, increase in size of an electronic circuit, reduction in cost, increase in yield, or the like can be achieved.

Note that this embodiment can be combined or replaced with any of the other embodiments as appropriate.

Embodiment 7

In this embodiment, a method for manufacturing the thin film transistor described in Embodiment 6 will be described.

A method for manufacturing a thin film transistor in this embodiment will be described with reference to FIGS. 20A to 20C, FIGS. 21A to 21C, FIGS. 22A-1, 22A-2, 22B-1, and 22B-2, FIGS. 23A to 23C, FIGS. 24A and 24B, and FIGS. 25A to 25C. FIGS. 20A to 20C, FIGS. 21A to 21C, FIGS. 22A-1, 22A-2, 22B-1, and 22B-2, FIGS. 23A to 23C, FIGS. 24A and 24B, and FIGS. 25A to 25C illustrate methods for manufacturing the thin film transistor described in Embodiment 6. Note that here, all the thin film transistors formed over one substrate preferably have the same polarity because the number of manufacturing steps can be reduced. Therefore, in this embodiment, a method for manufacturing an n-channel thin film transistor is described.

(Method 1)

Figure 20A:
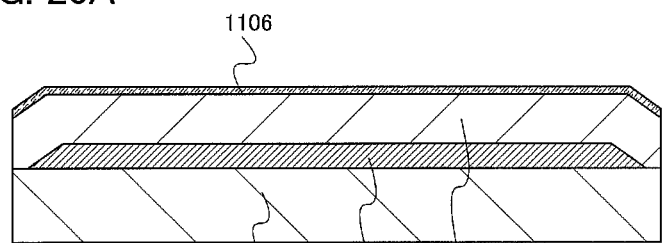
FIGS. 20A to 20C are cross-sectional views illustrating a method for manufacturing a transistor in Embodiment 7.

First, a process for manufacturing the thin film transistor illustrated in FIG. 17 is described with reference to FIGS. 20A to 20C. As illustrated in FIG. 20A, the gate electrode 1103 is formed over the substrate 1101. Next, after the gate insulating layer 1105 which covers the gate electrode 1103 is formed, a first semiconductor layer 1106 is formed.

The gate electrode 1103 can be formed in such a manner that a conductive layer is formed over the substrate 1101 with the use of any of the materials described in Embodiment 6 by a sputtering method or a vacuum evaporation method; a resist mask is formed over the conductive layer by a photolithography method, an inkjet method, or the like; and the conductive layer is etched using the resist mask. Alternatively, the resist mask can be formed by discharging a conductive nanopaste of silver, gold, copper, or the like onto the substrate by an inkjet method and baking the conductive nanopaste. Here, the gate electrode 1103 is formed in such a way that a conductive layer is formed over the substrate 1101 and etched with a resist mask formed using a photomask.

Note that in the photolithography step, a resist mask may be applied to the entire surface of the substrate. Alternatively, a resist mask may be printed by a printing method on a region where a resist mask is to be formed, and then, the resist mask may be exposed to light, whereby a resist mask can be saved and costs can be reduced. Further, instead of exposing a resist mask to light by using a light-exposure machine, a laser beam direct drawing apparatus may be used to expose a resist to light.

When side surfaces of the gate electrode 1103 are tapered, disconnection of the semiconductor layer and the wiring layer formed over the gate electrode 1103 at a step portion can be prevented. In order to make the side surfaces of the gate electrode 1103 tapered, etching may be performed while the resist mask is being reduced.

In the case where the electronic circuit, which is one embodiment of the present invention, serves as a driver circuit in a display device and the electronic circuit and a pixel portion in the display device are formed at the same time, a gate wiring (a scan line) and a capacitor wiring can be simultaneously formed in the step of forming the gate electrode 1103. Note that a scan line refers to a wiring which selects a pixel, and a capacitor wiring refers to a wiring which is connected to one of electrodes of a capacitor in a pixel. However, this embodiment is not limited to this. One or both of the gate wiring and the capacitor wiring may be formed in a step different from the step of forming the gate electrode 1103.

The gate insulating layer 1105 can be formed using any of the materials described in Embodiment 6 by a CVD method, a sputtering method, or the like. Moreover, the gate insulating layer 1105 may be formed using a microwave plasma-enhanced CVD apparatus with a high frequency (1 GHz or higher). When the gate insulating layer 1105 is formed by a microwave plasma-enhanced CVD apparatus, the withstand voltage between a gate electrode and each of a drain electrode and a source electrode can be increased. Thus, a highly reliable thin film transistor can be obtained. Further, when a silicon oxide layer is formed as the gate insulating layer 1105 by a CVD method using an organosilane gas, the crystallinity of the microcrystalline semiconductor layer which is formed later can be improved; thus, the on-state current and the field effect mobility of a thin film transistor to be formed can be increased. As the organosilane gas, a silicon-containing compound such as tetraethoxysilane (TEOS: $Si(OC_2H_5)_4$), tetramethylsilane (TMS: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

The first semiconductor layer 1106 is formed using microcrystalline silicon, microcrystalline silicon germanium, microcrystalline germanium, or the like. The first semiconductor layer 1106 is formed as thin as 3 nm to 10 nm, preferably 3 nm to 5 nm; thus, in a second semiconductor layer to be formed later, the length of a plurality of conical or pyramidal protrusions (projections) formed using a microcrystalline semiconductor can be controlled and the on-state current and the field effect mobility of the thin film transistor can be controlled.

The first semiconductor layer 1106 is formed by glow discharge plasma with a mixture of hydrogen and a deposition gas containing silicon or germanium in a treatment chamber of a plasma-enhanced CVD apparatus. Alternatively, the first semiconductor layer 1106 is formed by glow discharge plasma with a mixture of a deposition gas containing silicon or germanium; hydrogen; and a rare gas such as helium, neon, or krypton. Microcrystalline silicon, microcrystalline silicon germanium, microcrystalline germanium, or the like is formed using the deposition gas containing silicon or germanium, which is diluted with hydrogen so that the flow rate of hydrogen is 10 to 2000 times, preferably 10 to 200 times that of the deposition gas.

Typical examples of the deposition gas containing silicon or germanium are $SiH_4$, $Si_2H_6$, $GeH_4$, and $Ge_2H_6$.

A rare gas such as helium, argon, neon, krypton, or xenon is used as a source gas for the first semiconductor layer 1106, whereby the deposition rate of the first semiconductor layer 1106 is increased. Moreover, since the deposition rate is increased, the amount of impurities mixed in the first semiconductor layer 1106 is reduced; thus, the crystallinity of the first semiconductor layer 1106 can be improved. Accordingly, the on-state current and field effect mobility of the thin film transistor are increased, and the productivity of the thin film transistor can be increased.

When the first semiconductor layer 1106 is formed, glow discharge plasma is generated by application of a high frequency power of 3 MHz to 30 MHz, typically, a high frequency power of 13.56 MHz or 27.12 MHz in the HF band; or a high frequency power of approximately 30 MHz to 300 MHz in the VHF band, typically 60 MHz. Alternatively, glow discharge plasma is generated by applying a high frequency power at a microwave frequency of 1 GHz or more. Note that the use of the high frequency power in the VHF band or at the microwave frequency can increase the deposition rate. In addition, when the high frequency power in the HF band is superimposed with the high frequency power in the VHF band, unevenness of plasma in a large-sized substrate is reduced, the uniformity can be increased, and the deposition rate can be increased.

Note that before the first semiconductor layer 1106 is formed, impurity elements in the treatment chamber of the plasma-enhanced CVD apparatus are removed by introducing a deposition gas containing silicon or germanium while gas in the treatment chamber is exhausted, so that the amount of impurities in the gate insulating layer 1105 and the first semiconductor layer 1106 of the thin film transistor to be formed later can be reduced. Thus, electric characteristics of the thin film transistor can be improved.

Figure 20B:
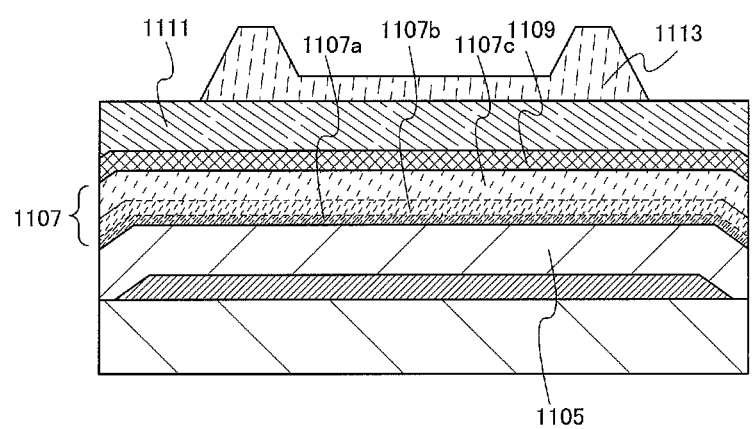
Figure 20C:
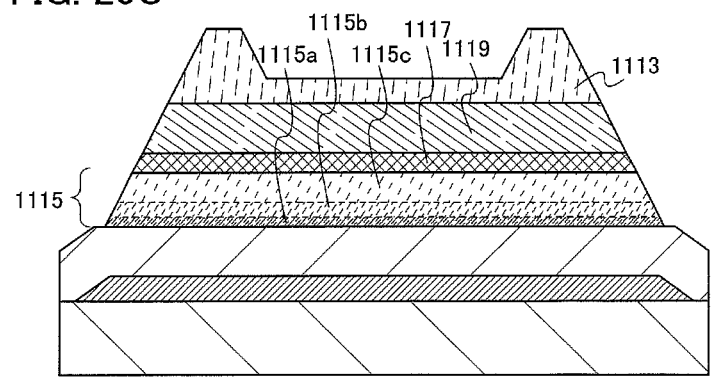

Next, as illustrated in FIG. 20B, a semiconductor layer is stacked over the first semiconductor layer 1106, so that a second semiconductor layer 1107 is formed. Then, an impurity semiconductor layer 1109 and a conductive layer 1111 are formed over the second semiconductor layer 1107. Next, a resist mask 1113 is formed over the conductive layer 1111.

The second semiconductor layer 1107 which includes a microcrystalline semiconductor layer 1107a, a mixed layer 1107b, and a layer 1107c containing an amorphous semiconductor is formed by using the first semiconductor layer 1106 as a seed crystal under a condition that crystals grow partly. Note that here, a structure in which the second semiconductor layer 1107 includes the first semiconductor layer 1106, that is, a structure in which the first semiconductor layer 1106 is included in the microcrystalline semiconductor layer 1107a is described for convenience.

The second semiconductor layer 1107 is formed by glow discharge plasma with a mixture of a deposition gas containing silicon or germanium, hydrogen, and a gas containing nitrogen in a treatment chamber of the plasma-enhanced CVD apparatus. Examples of the gas containing nitrogen are ammonia, nitrogen, nitrogen fluoride, and nitrogen chloride.

In that case, the flow rate of the deposition gas containing silicon or germanium to hydrogen is the same as that for forming a microcrystalline semiconductor layer as in the first semiconductor layer 1106, and the gas containing nitrogen is used for a source gas; thus, crystal growth can be reduced as compared to the deposition condition of the first semiconductor layer 1106. Accordingly, the mixed layer 1107b and the layer 1107c containing the amorphous semiconductor can be formed in the second semiconductor layer 1107.

A typical example of a condition for forming the second semiconductor layer 1107 in that case is as follows. The flow rate of hydrogen is 10 to 2000 times, preferably 10 to 200 times that of the deposition gas containing silicon or germanium. Note that in a typical example of a normal condition for forming an amorphous semiconductor layer, the flow rate of hydrogen is 0 to 5 times that of the deposition gas containing silicon or germanium.

A rare gas such as helium, neon, argon, xenon, or krypton is introduced into a source gas for the second semiconductor layer 1107, whereby the deposition rate of the second semiconductor layer 1107 can be increased.

In the early stage of deposition of the second semiconductor layer 1107, the first semiconductor layer 1106 serves as a seed crystal and a microcrystalline semiconductor layer is deposited over the entire surface of the first semiconductor layer 1106 (the early stage of deposition). After that, since the gas containing nitrogen is included in the source gas, crystal growth is partly suppressed, so that a conical or pyramidal microcrystalline semiconductor region is formed and an amorphous semiconductor region is formed (the middle stage of deposition). Then, crystal growth in the conical or pyramidal microcrystalline semiconductor region stops and a layer containing an amorphous semiconductor is formed (the later stage of deposition).

Accordingly, the microcrystalline semiconductor layer 1115a illustrated in FIG. 17 and FIGS. 18A and 18B corresponds to the first semiconductor layer 1106 in FIG. 20A and a microcrystalline semiconductor layer which is formed in the early stage of deposition of the second semiconductor layer 1107, that is, the microcrystalline semiconductor layer 1107a in FIG. 20B.

Further, the mixed layer 1115b illustrated in FIG. 17 and FIGS. 18A and 18B corresponds to a layer which includes the conical or pyramidal microcrystalline semiconductor regions and regions filling a space between the conical or pyramidal microcrystalline regions, which are formed in the middle stage of deposition of the second semiconductor layer 1107 in FIG. 20B, that is, the mixed layer 1107b.

The layer 1129c containing the amorphous semiconductor, which is illustrated in FIG. 17 and FIGS. 18A and 18B, corresponds to the layer 1107c containing the amorphous semiconductor, which is formed in the later stage of deposition of the second semiconductor layer 1107 in FIG. 20B.

In the second semiconductor layer 1107 formed by such a method, the nitrogen concentration which is measured by secondary ion mass spectrometry has a peak in the vicinity of the interface between the microcrystalline semiconductor layer 1107a and the mixed layer 1107b, and is constant in a direction in which the mixed layer 1107b and the layer 1107c containing the amorphous semiconductor are deposited.

The impurity semiconductor layer 1109 is formed by glow discharge plasma with a mixture of a deposition gas containing silicon, hydrogen, and phosphine (diluted with hydrogen or silane) in a treatment chamber of the plasma-enhanced CVD apparatus. Amorphous silicon to which phosphorus is added or microcrystalline silicon to which phosphorus is added is formed by diluting the deposition gas containing silicon with hydrogen.

The conductive layer 1111 can be formed using a material similar to that of the wirings 1125 illustrated in FIG. 17. The conductive layer 1111 is formed by a CVD method, a sputtering method, or a vacuum evaporation method. Further, the conductive layer 1111 may be formed by discharging a conductive nanopaste of silver, gold, copper, or the like by a screen printing method, an inkjet method, or the like and baking the conductive nanopaste.

The resist mask 1113 is formed by a photolithography step. The resist mask 1113 has regions with different thicknesses. Such a resist mask can be formed using a multi-tone mask. By using the multi-tone mask, the number of photomasks to be used is reduced and the number of manufacturing steps can be reduced. In this embodiment, the multi-tone mask can be used in a step of forming a pattern of the second semiconductor layer 1107 and a step of separating the semiconductor layer into a source region and a drain region.

A multi-tone mask is a mask capable of light exposure with multi-level light intensity, typically, with three levels of light intensity so that an exposed region, a semi-exposed region, and an unexposed region are formed. By one light exposure and development step with the use of a multi-tone mask, a resist mask with plural thicknesses (typically, two kinds of thicknesses) can be formed. Accordingly, the use of a multi-tone mask can reduce the number of photomasks.

Figures 1, 22A:
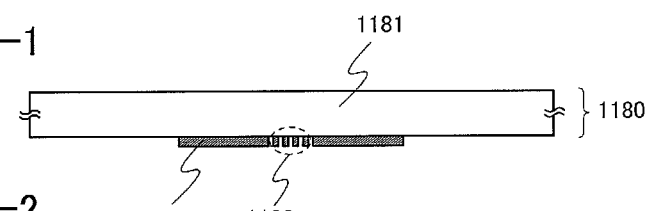
Figures 2, 22A:
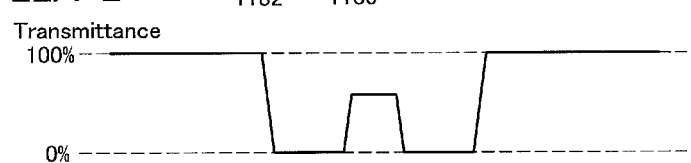
Figures 1, 22B:
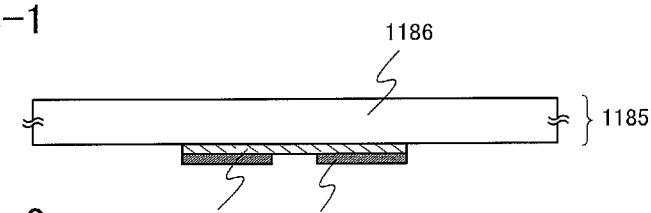
Figures 2, 22B:

FIGS. 22A-1 and 22B-1 are cross-sectional views of typical multi-tone masks. FIG. 22A-1 illustrates a gray-tone mask 1180, and FIG. 22B-1 illustrates a half-tone mask 1185.

The gray-tone mask 1180 illustrated in FIG. 22A-1 includes a light-blocking portion 1182 formed using a light-blocking layer on a light-transmitting substrate 1181, and a diffraction grating portion 1183 formed by a pattern of the light-blocking layer.

The diffraction grating portion 1183 has slits, dots, mesh, or the like provided at intervals which are equal to or less than the resolution limit of light used for light exposure, whereby the light transmittance is controlled. Note that the diffraction grating portion 1183 can have slits, dots, or mesh with regular intervals or irregular intervals.

For the light-transmitting substrate 1181, quartz or the like can be used. The light-blocking layer included in the light-blocking portion 1182 and the diffraction grating portion 1183 is formed using chromium, chromium oxide, or the like.

In the case where the gray-tone mask 1180 is irradiated with light for exposure, as illustrated in FIG. 22A-2, the light transmittance in a region overlapping with the light-blocking portion 1182 is 0%, and the light transmittance in a region where neither the light-blocking portion 1182 nor the diffraction grating portion 1183 is provided is 100%. Further, the light transmittance in the diffraction grating portion 1183 is approximately in the range of 10% to 70%, which can be adjusted by the intervals of slits, dots, or mesh of the diffraction grating, or the like.

The half-tone mask 1185 illustrated in FIG. 22B-1 includes a semi-light-transmitting portion 1187 formed using a semi-light-transmitting layer on a light-transmitting substrate 1186, and a light-blocking portion 1188 formed using a light-blocking layer.

The semi-light-transmitting portion 1187 can be formed using a layer of MoSiN, MoSi, MoSiO, MoSiON, CrSi, or the like. The light-blocking portion 1188 may be formed using a material similar to that of the light-blocking layer of the gray-tone mask 1180, and is preferably formed using chromium, chromium oxide, or the like.

In the case where the half-tone mask 1185 is irradiated with light for exposure, as illustrated in FIG. 22B-2, the light transmittance in a region overlapping with the light-blocking portion 1188 is 0%, and the light transmittance in a region where neither the light-blocking portion 1188 nor the semi-light-transmitting portion 1187 is provided is 100%. Moreover, the light transmittance of part of the semi-light-transmitting portion 1187, which does not overlap with the light-blocking portion 1188, is approximately in the range of 10% to 70% and can be adjusted by the kind of material used, the thickness of a film to be formed, or the like.

By light exposure using the multi-tone mask and development, a resist mask which includes regions having different thicknesses can be formed.

Next, the second semiconductor layer 1107, the impurity semiconductor layer 1109, and the conductive layer 1111 are etched using the resist mask 1113. Through this step, the second semiconductor layer 1107, the impurity semiconductor layer 1109, and the conductive layer 1111 are separated into each element, and a second semiconductor layer 1115, an impurity semiconductor layer 1117, and a conductive layer 1119 are formed. Note that the second semiconductor layer 1115 includes the microcrystalline semiconductor layer 1115*a*, the mixed layer 1115*b*, and a layer 1115*c* containing an amorphous semiconductor (see FIG. 20C).

Then, the resist mask 1113 is recessed to form separate resist masks 1123. Ashing by oxygen plasma may be performed in order to recess the resist mask. Here, ashing is performed on the resist mask 1113 so that the resist mask 1113 is separated over the gate electrode; thus, the resist masks 1123 can be formed (see FIG. 21A).

Figure 21A:
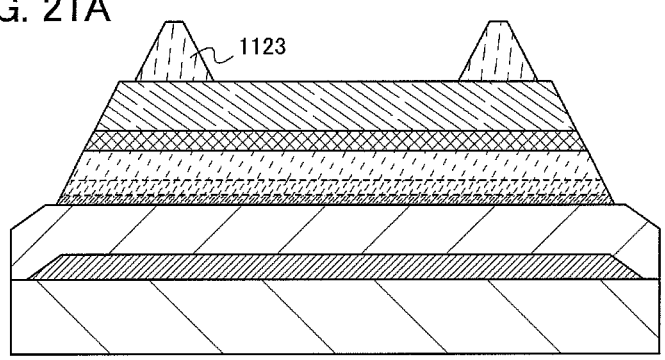
FIGS. 21A to 21C are cross-sectional views illustrating a method for manufacturing a transistor in Embodiment 7.
Figure 21B:
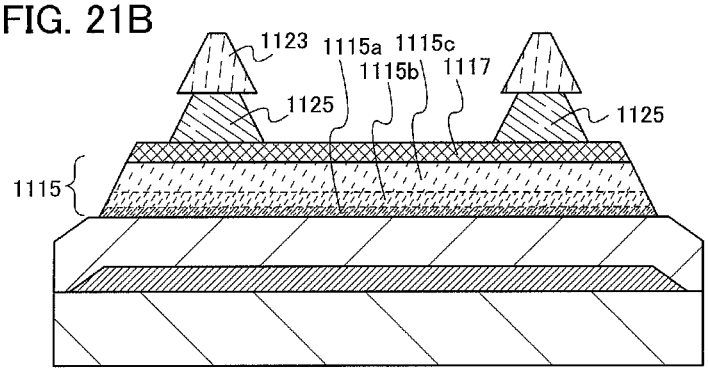
Figure 21C:
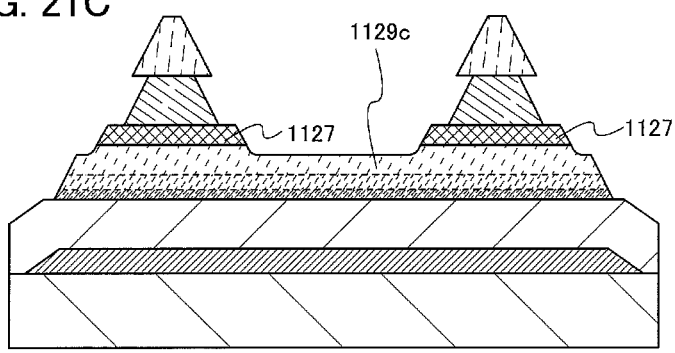

Next, the conductive layer 1111 is etched using the resist masks 1123, so that the wirings 1125 functioning as a source electrode and a drain electrode are formed (see FIG. 21B). The conductive layer 1111 is preferably removed by wet etching. By wet etching, the conductive layer 1111 is isotropically etched. Accordingly, a side surface of the conductive layer 1111 recedes to the inner side than that of the resist masks 1123, so that the wirings 1125 are formed. When the electronic circuit, which is one embodiment of the present invention, is used as the driver circuit in the display device, the wirings 1125 function not only as a source electrode and a drain electrode but also as a signal line. Note that this embodiment is not limited to this structure, and a signal line may be provided separately from the source electrode and the drain electrode.

Then, each of the layer 1115*c* containing the amorphous semiconductor and the impurity semiconductor layer 1117 is partly etched using the resist masks 1123. Here, dry etching is employed. Through this step, the layer 1129*c* containing the amorphous semiconductor, which has a recessed portion on its surface, and the impurity semiconductor layers 1127 are formed. After that, the resist masks 1123 are removed (see FIG. 21C).

Note that here, the conductive layer 1111 is removed by wet etching, and each of the layer 1115*c* containing the amorphous semiconductor and the impurity semiconductor layer 1117 is partly etched by dry etching. Thus, the conductive layer 1119 is isotropically etched, and side surfaces of the wirings 1125 are not aligned with side surfaces of the impurity semiconductor layers 1127. That is, the side surfaces of the impurity semiconductor layers 1127 are located on the outer side than the side surfaces of the wirings 1125.

Alternatively, the impurity semiconductor layer 1117 and the layers 1115*c* containing the amorphous semiconductor may be partly etched after the resist masks 1123 are removed. By the etching, the impurity semiconductor layer 1117 is etched using the wirings 1125, so that the side surfaces of the wirings 1125 are approximately aligned with the side surfaces of the impurity semiconductor layers 1127.

Next, dry etching may be performed after the resist masks 1123 are removed. The conditions of dry etching are set so that the exposed part of the layer 1129*c* containing the amorphous semiconductor is not damaged and the etching rate with respect to the layer 1129*c* containing the amorphous semiconductor is low. In other words, conditions are used with which the exposed surface of the layer 1129*c* containing the amorphous semiconductor is hardly damaged and the thickness of the exposed part of the layer 1129*c* containing the amorphous semiconductor is scarcely reduced. Typical examples of an etching gas are $Cl_2$, $CF_4$, and $N_2$. There is no particular limitation on an etching method, and an inductively coupled plasma (ICP) method, a capacitively coupled plasma (CCP) method, an electron cyclotron resonance (ECR) method, a reactive ion etching (RIE) method, or the like can be used.

Next, a surface of the layer 1129*c* containing the amorphous semiconductor may be irradiated with water plasma, ammonia plasma, nitrogen plasma, or the like.

Water plasma treatment can be performed in such a manner that a gas containing water as a main component typified by water vapor ($H_2O$ vapor) is introduced into a reaction space so that plasma is generated.

As described above, dry etching is further performed under a condition where the layer 1129*c* containing the amorphous semiconductor is not damaged after the impurity semiconductor layers 1127 are formed, so that impurities such as a residue existing on the exposed part of the layer 1129*c* containing the amorphous semiconductor can be removed. Further, water plasma treatment is performed successively after the dry etching, whereby a residue of the resist mask can be removed. By the water plasma treatment, insulation between the source region and the drain region can be secured, and the off-state current of the thin film transistor to be formed can be reduced, and variation in electric characteristics can be reduced.

Through the above-described steps, a thin film transistor in which a channel region is formed using a microcrystalline semiconductor layer can be manufactured with the use of fewer masks. Moreover, the thin film transistor with small off-state current, large on-state current, and high field effect mobility can be manufactured.

(Method 2)

A method for manufacturing a thin film transistor, which is different from Method 1, will be described with reference to FIGS. 20A to 20C, FIGS. 23A to 23C, and FIGS. 24A and 24B.

As in Method 1, the gate electrode 1103 is formed over the substrate 1101. Next, the gate insulating layer 1105 and the first semiconductor layer 1106 are formed so as to cover the gate electrode 1103 (see FIG. 20A). Then, as in Method 1, crystals are grown from the first semiconductor layer 1106, whereby the second semiconductor layer 1107 (the microcrystalline semiconductor layer 1107*a*, the mixed layer 1107*b*, and the layer 1107*c* containing the amorphous semiconductor) is formed. Next, the impurity semiconductor layer 1109 is formed over the second semiconductor layer 1107. After that, a resist mask (not illustrated) is formed over the impurity semiconductor layer 1109 (see FIG. 23A).

Next, with the use of the resist mask, the second semiconductor layer 1107 and the impurity semiconductor layer 1109 are etched. Through this step, the second semiconductor layer 1107 and the impurity semiconductor layer 1109 are separated into elements, so that the second semiconductor layer 1115 (the microcrystalline semiconductor layer 1115a, the mixed layer 1115b, and the layer 1115c containing the amorphous semiconductor) and the impurity semiconductor layer 1117 are formed (see FIG. 23B).

Figure 23A:
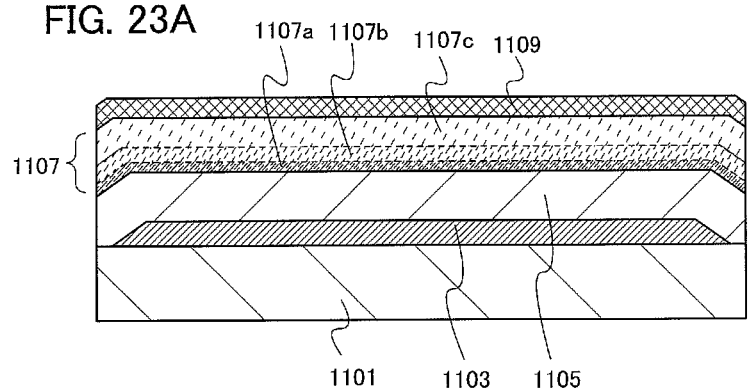
FIGS. 23A to 23C are cross-sectional views illustrating a method for manufacturing a transistor in Embodiment 7.
Figure 23B:
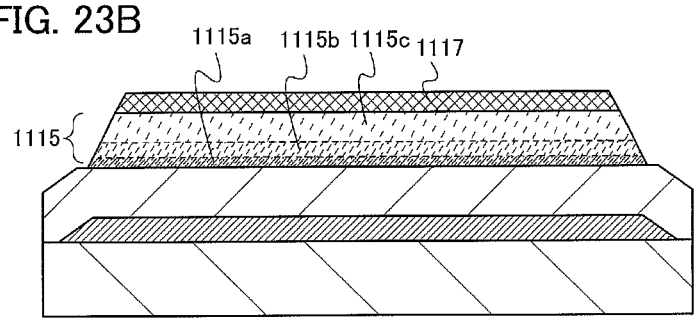
Figure 23C:
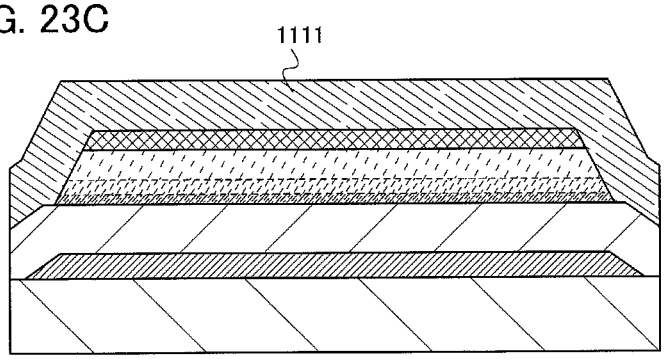

Then, the conductive layer 1111 is formed over the gate insulating layer 1105, the second semiconductor layer 1115, and the impurity semiconductor layer 1117 (see FIG. 23C).

Figure 24A:
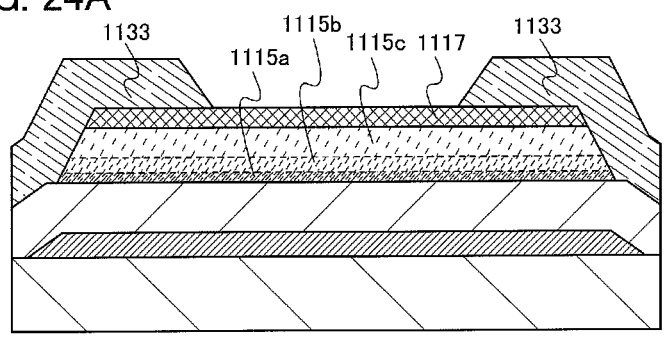
FIGS. 24A and 24B are cross-sectional views illustrating a method for manufacturing a transistor in Embodiment 7.
Figure 24B:
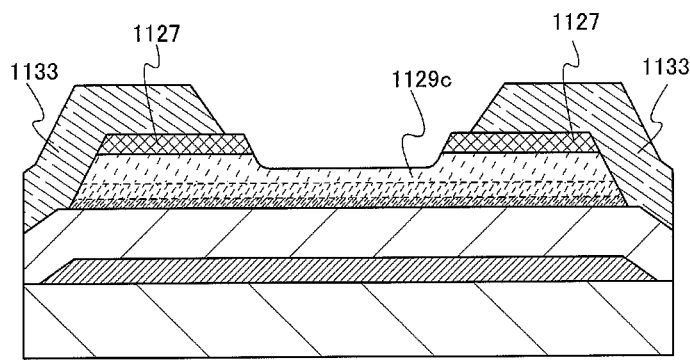

Next, a resist mask (not illustrated) is formed over the conductive layer 1111, and the conductive layer 1111 is etched with the use of the resist mask, so that wirings 1133 functioning as a source and drain electrodes are formed (see FIG. 24A).

Then, the impurity semiconductor layer 1117 is etched so that the impurity semiconductor layers 1127 functioning as a source region and a drain region are formed. Further, the layer 1115c containing the amorphous semiconductor is etched so that the layer 1129c containing the amorphous semiconductor is formed (see FIG. 24B).

Through the above-described steps, the thin film transistor can be manufactured.

Note that the layer 1115c containing the amorphous semiconductor is partly etched without removal of the resist mask after the wirings 1133 are formed; alternatively, part of the impurity semiconductor layer 1117 and part of the layer 1129c containing the amorphous semiconductor may be etched after the resist mask is removed. By the etching, the impurity semiconductor layer 1117 is etched using the wirings 1133 as masks, so that side surfaces of the wirings 1133 are approximately aligned with side surfaces of the impurity semiconductor layers 1127.

Next, dry etching is preferably performed after the resist mask is removed. The conditions of dry etching are set so that the exposed part of the layer 1129c containing the amorphous semiconductor is not damaged and the etching rate with respect to the layer 1129c containing the amorphous semiconductor is low. In other words, conditions are used with which the exposed surface of the layer 1129c containing the amorphous semiconductor is hardly damaged and the thickness of the exposed part of the layer 1129c containing the amorphous semiconductor is scarcely reduced.

Then, a surface of the layer 1129c containing the amorphous semiconductor may be irradiated with water plasma, ammonia plasma, nitrogen plasma, or the like.

Water plasma treatment can be performed in such a manner that a gas containing water as a main component typified by water vapor ($H_2O$ vapor) is introduced into a reaction space so that plasma is generated.

As described above, dry etching is further performed under a condition where the layer 1129c containing the amorphous semiconductor is not damaged after the layer 1129c is formed, so that impurities such as a residue existing on the layer 1129c containing the amorphous semiconductor can be removed. Further, water plasma treatment is performed successively after the dry etching, whereby a residue of the resist mask can be removed. By the water plasma treatment, insulation between the source region and the drain region can be secured. Thus, in a thin film transistor, the amount of off-state current can be reduced, and variation in electric characteristics can be reduced.

(Method 3)

Next, a method for manufacturing the thin film transistor shown in FIG. 19 will be described with reference to FIGS. 20A to 20C, FIGS. 21A to 21C, and FIGS. 25A to 25C.

As in Method 1, after the wirings 1125 are formed through the steps in FIGS. 20A to 20C, and FIGS. 21A and 21B, the impurity semiconductor layer 1117 is etched so that the impurity semiconductor layers 1127 are formed. Moreover, the layer 1115c containing the amorphous semiconductor is etched so that the pair of layers 1132 containing the amorphous semiconductor is formed (see FIG. 25A).

Here, a condition is used as appropriate under which the layer 1115c containing the amorphous semiconductor is selectively removed by wet etching or dry etching so that the second microcrystalline semiconductor layer 1131b is exposed. A typical example of an etchant with which selective wet etching of an amorphous semiconductor layer can be achieved is an etchant including hydrazine, potassium hydroxide, or ethylenediamine. Alternatively, an etchant including a mixed solution of hydrofluoric acid and nitric acid can be used. Further alternatively, a tetramethyl ammonium hydroxide (also referred to as TMAH) aqueous solution can be used.

In addition, hydrogen can be used as an etching gas with which selective dry etching of an amorphous semiconductor layer can be achieved. Alternatively, a gas containing chlorine, bromine, or iodine can be used as the etching gas. A typical example is hydrogen chloride, hydrogen bromide, hydrogen iodide, silicon tetrachloride, phosphorus trichloride, and boron trichloride. Alternatively, a gas containing fluorine can be used as the etching gas. A typical example is tetrafluoromethane, sulfur hexafluoride, nitrogen trifluoride, silicon tetrafluoride, boron trifluoride, xenon difluoride, and chlorine trifluoride. Further alternatively, a mixed gas of tetrafluoromethane and oxygen, or a mixed gas of sulfur hexafluoride and chlorine can be used as the etching gas.

Figure 25A:
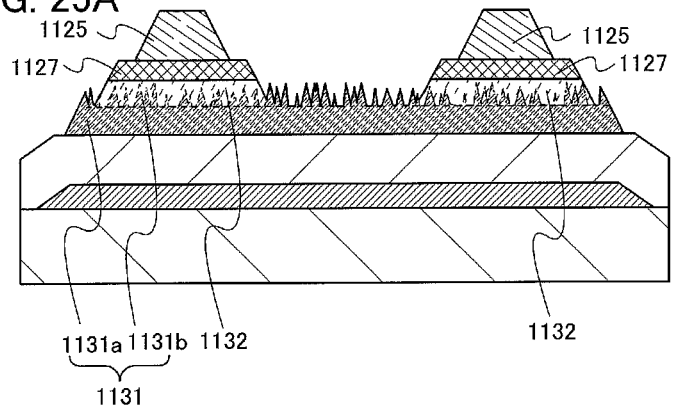
FIGS. 25A to 25C are cross-sectional views illustrating a method for manufacturing a transistor in Embodiment 7.
Figure 25B:
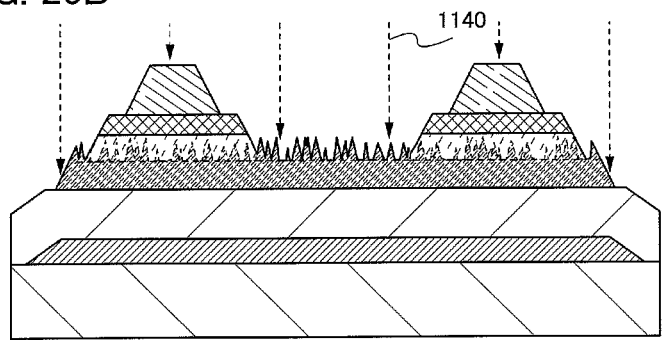
Figure 25C:
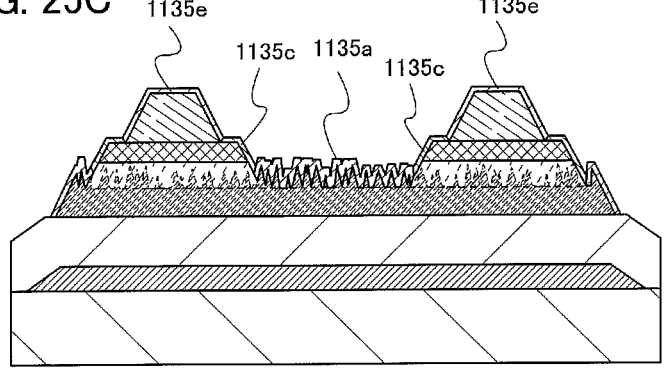

After that, a resist mask is removed, and plasma treatment 1140 by which surfaces of the second microcrystalline semiconductor layer 1131b, the pair of layers 1132 containing the amorphous semiconductor, the impurity semiconductor layers 1127, and the wirings 1125 are oxidized or nitrided is performed, whereby the insulating layer 1135a, the insulating layers 1135c, and the insulating layers 1135e illustrated in FIG. 25C are formed.

The layers 1132 containing the amorphous semiconductor have weak n-type conductivity. Moreover, the layer 1132 has lower density than the microcrystalline semiconductor layer. Accordingly, the second insulating layers 1135c formed by oxidizing or nitriding the layers 1132 containing the amorphous semiconductor layer are rough insulating layers having low density and low insulating properties. However, in the thin film transistor illustrated in FIG. 19, the first insulating layer 1135a formed by oxidizing the microcrystalline semiconductor layer 1131 is formed on the back channel side. Since the microcrystalline semiconductor layer has higher density than the amorphous semiconductor layer, the first insulating layer 1135a also has high density and high insulating properties. Further, the second microcrystalline semiconductor layer 1131b has a plurality of conical or pyramidal protrusions (projections) and thus has an uneven surface. Therefore, a leak path from the source region to the drain region has a long distance. With such structures, the leakage current and the off-state current of the thin film transistor can be reduced.

Note that here, after the wirings 1125 are formed, the layer 1115c containing the amorphous semiconductor is etched so that the second microcrystalline semiconductor layer 1131b is exposed. Alternatively, the following steps may be performed. The wirings 1125 are formed; the resist mask is removed; each of the impurity semiconductor layer 1117 and the layer 1115c containing the amorphous semiconductor is partly etched by dry etching; and the plasma treatment 1140 for oxidizing or nitriding the surface of the second microcrystalline semiconductor layer 1131b is performed. In that case, since the impurity semiconductor layer 1127 and the layer 1115c containing the amorphous semiconductor are etched using the wirings 1125 as masks, side surfaces of the wirings 1125 are approximately aligned with side surfaces of the impurity semiconductor layers 1127.

As described above, after the second microcrystalline semiconductor layer 1131b having conical or pyramidal protrusions (projections) is exposed, an insulating layer is formed on the surface of the second microcrystalline semiconductor layer 1131b by plasma treatment; thus, a leak path between the source region and the drain region can have a long distance, and an insulating layer having a high insulating property can be formed. Moreover, a channel region is formed using the microcrystalline semiconductor layer. Accordingly, a thin film transistor having small off-state current, large on-state current, and high field effect mobility can be manufactured.

(Method 4)

A method for manufacturing the second semiconductor layer 1107, which can be applied to any of Methods 1 to 3, will be described below. In this method, instead of using the gas containing nitrogen as the source gas of the second semiconductor layer 1107, nitrogen is supplied to the second semiconductor layer 1107 in such a manner that the second semiconductor layer 1107 is formed after a layer containing nitrogen is formed in a treatment chamber of the plasma-enhanced CVD apparatus.

After the first semiconductor layer 1106 is formed, the substrate is carried out of a treatment chamber of the plasma-enhanced CVD apparatus. Next, a layer containing nitrogen is formed in the treatment chamber of the plasma-enhanced CVD apparatus. In that case, a silicon nitride layer is formed as the layer containing nitrogen. Then, after the substrate is carried into the treatment chamber, a source gas used for deposition of the second semiconductor layer 1107 is introduced into the treatment chamber, and the second semiconductor layer 1107 is formed. Here, a deposition gas containing silicon or germanium, and hydrogen are used as the source gas. The layer containing nitrogen, which is formed on the inner wall of the treatment chamber, is exposed to plasma, whereby part of the layer containing nitrogen is dissociated and N (nitrogen) is eliminated. Alternatively, an NH group or an $NH_2$ group is generated. As a result, the second semiconductor layer 1107 contains nitrogen. Accordingly, the second semiconductor layer 1107 including the microcrystalline semiconductor layer 1107a, the mixed layer 1107b, and the layer 1107c containing the amorphous semiconductor can be formed as illustrated in FIG. 18A. Alternatively, as illustrated in FIG. 18B, the second semiconductor layer 1107 including the microcrystalline semiconductor layer 1107a and the mixed layer 1107b can be formed.

In the second semiconductor layer 1107 formed by such a method, the nitrogen concentration which is measured by secondary ion mass spectrometry has a peak at an upper portion of the microcrystalline semiconductor layer 1107a, or in the vicinity of the interface between the microcrystalline semiconductor layer 1107a and the mixed layer 1107b, and is decreased with respect to the direction in which the second semiconductor layer 1107 is deposited.

Through the steps above, the second semiconductor layer 1107 can be formed.

(Method 5)

A method for manufacturing the second semiconductor layer 1107, which can be applied to any of Methods 1 to 3, will be described below. In this method, instead of using the gas containing nitrogen as the source gas of the second semiconductor layer 1107, nitrogen is supplied to the second semiconductor layer 1107 in such a manner that a gas containing nitrogen is introduced into a treatment chamber of a CVD apparatus before the second semiconductor layer 1107 is formed, and then the second semiconductor layer 1107 is formed.

After the first semiconductor layer 1106 is formed, the surface of the first semiconductor layer 1106 is exposed to the gas containing nitrogen (here, this treatment is referred to as flush treatment), so that nitrogen is supplied to the treatment chamber of the plasma-enhanced CVD apparatus. Examples of the gas containing nitrogen are ammonia, nitrogen, nitrogen fluoride, and nitrogen chloride. Moreover, hydrogen may be included in any of the gas containing nitrogen. In this case, the surface of the first semiconductor layer 1106 is exposed to ammonia, whereby nitrogen is supplied.

Then, after a source gas used for deposition of the second semiconductor layer 1107 is introduced into the treatment chamber, the second semiconductor layer 1107 is formed. In this case, a deposition gas including silicon or germanium, and hydrogen are used as the source gas.

In the step of forming the second semiconductor layer 1107, the gas containing nitrogen, which is introduced into the treatment chamber by the flush treatment, ammonia in this case is decomposed by plasma discharge, so that N (nitrogen) is eliminated. Alternatively, an NH group or an $NH_2$ group is generated. As a result, the second semiconductor layer 1107 contains nitrogen. Accordingly, the second semiconductor layer 1107 including the microcrystalline semiconductor layer 1107a, the mixed layer 1107b, and the layer 1107c containing the amorphous semiconductor can be formed as illustrated in FIG. 18A. Alternatively, as illustrated in FIG. 18B, the second semiconductor layer 1107 including the microcrystalline semiconductor layer 1107a and the mixed layer 1107b can be formed.

In the second semiconductor layer 1107 formed by such a method, the nitrogen concentration which is measured by secondary ion mass spectrometry has a peak at an upper portion of the microcrystalline semiconductor layer 1107a or in the vicinity of the interface between the microcrystalline semiconductor layer 1107a and the mixed layer 1107b, and is decreased with respect to the direction in which the mixed layer 1107b and the layer 1107c containing the amorphous semiconductor are deposited.

Through the above steps, the second semiconductor layer 1107 can be formed.

As above, this embodiment describes the examples of the method for manufacturing a thin film transistor that can be applied to the electronic circuit, which is one embodiment of the present invention. When a microcrystalline semiconductor is used for a channel region of the thin film transistor, increase in size of the electronic circuit, reduction in cost, increase in yield, or the like can be achieved. Further, by the use of a microcrystalline semiconductor for the channel region, degradation of characteristics of the thin film transistor can be suppressed, so that the life of the electronic circuit can be extended.

Note that this embodiment can be combined or replaced with any of the other embodiments as appropriate.

Embodiment 8

In this embodiment, a structure of an electronic circuit which is one embodiment of the present invention will be described.

Figure 26A:
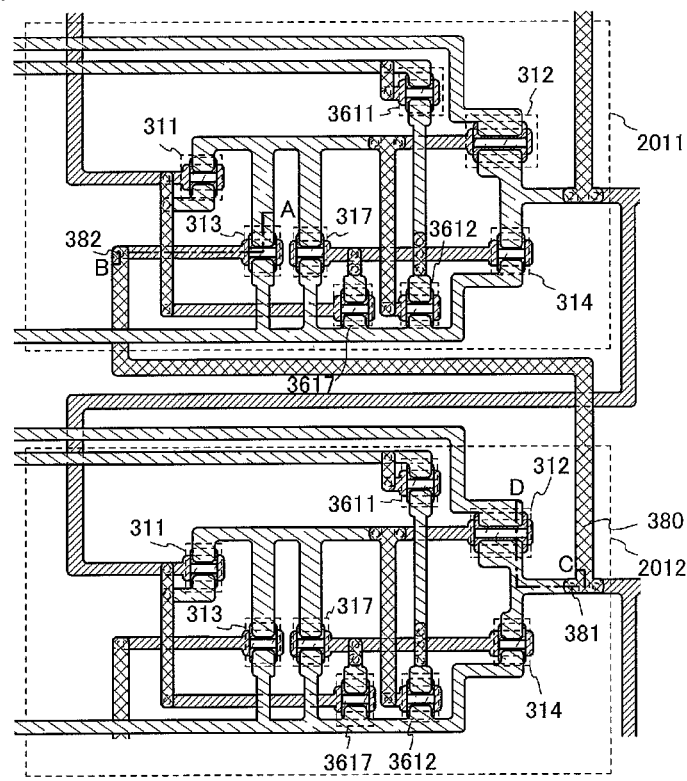
FIGS. 26A and 26B illustrate an example of a structure of an electronic circuit in Embodiment 8.
Figure 26B:
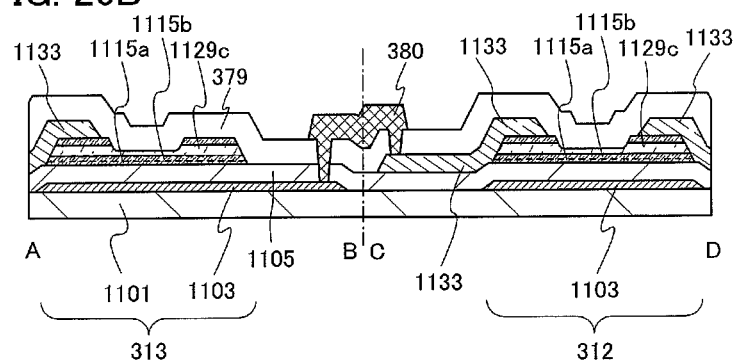

An example of a structure of an electronic circuit in this embodiment will be described with reference to FIGS. 26A and 26B. FIGS. 26A and 26B illustrate an example of a structure of the electronic circuit in this embodiment. FIG.

26A is a top view. FIG. 26B is a cross-sectional view of line A-B and line C-D in FIG. 26A. Note that FIGS. 26A and 26B show an example of the configuration of the electronic circuit illustrated in FIG. 3, and illustrate the case in which the sequential circuit 2011 and the sequential circuit 2012 in FIG. 3 each have the circuit configuration in FIG. 14E; the control circuit 316 in FIG. 14E has the circuit configuration in FIG. 15E; the control circuit 2021 in FIG. 3 has the circuit configuration in FIG. 5A; and transistors included in the electronic circuit have the structure in FIG. 24B.

The electronic circuit illustrated in FIGS. 26A and 26B includes the sequential circuit 2011 and the sequential circuit 2012. Each of the sequential circuit 2011 and the sequential circuit 2012 includes the transistor 311, the transistor 312, the transistor 313, the transistor 314, the transistor 317, the transistor 3611, the transistor 3612, and the transistor 3617.

The gate electrode 1103 of the transistor 313 in the sequential circuit 2011 is electrically connected to a wiring 380 through an opening portion 382. The wiring 1133 of the transistor 312 in the sequential circuit 2012 is electrically connected to the wiring 380 through an opening portion 381. That is, the wiring 1133 of the transistor 312 in the sequential circuit 2012 is electrically connected to the gate electrode 1103 of the transistor 313 through the wiring 380.

In the electronic circuit illustrated in FIGS. 26A and 26B, the control circuit 2021 is formed using the wiring resistance and the parasitic capacitance of the wiring 380. A material, the thickness, the width, or the like of the wiring 380 is preferably set as appropriate so that the wiring resistance and the parasitic capacitance meet the specifications for the control circuit 2021.

The wiring 380 can be formed using a light-transmitting conductive film formed of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like, for example.

As illustrated in FIGS. 26A and 26B as an example, the control circuit in the electronic circuit in this embodiment can be formed using the resistance and the parasitic capacitance of a wiring, for example. Accordingly, the control circuit can be formed without increase in the number of manufacturing steps. Note that the electronic circuit in this embodiment is not limited to having the configuration of the electronic circuit illustrated in FIGS. 26A and 26B; the control circuit in the electronic circuit in this embodiment can be constituted by a semiconductor element, for example.

Note that this embodiment can be combined or replaced with any of the other embodiments as appropriate.

Embodiment 9

In this embodiment, a display device which is one embodiment of the present invention will be described.

Figure 27:
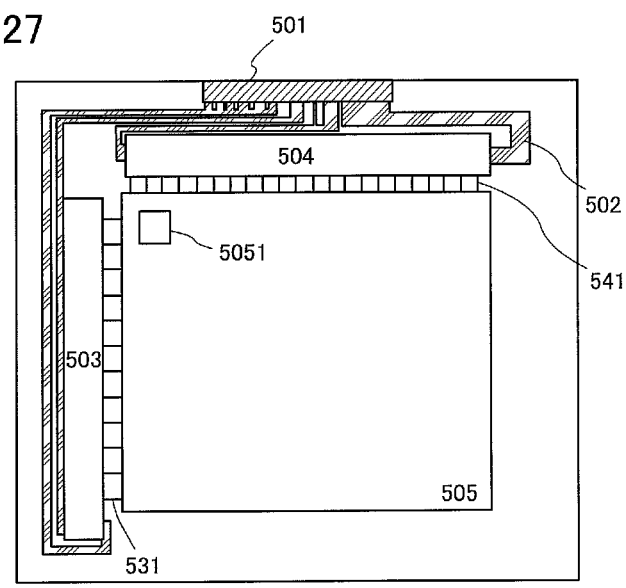
FIG. 27 illustrates an example of a structure of a display device in Embodiment 9.

A structure of a display device in this embodiment will be described with reference to FIG. 27. FIG. 27 illustrates an example of a structure of the display device in this embodiment.

The display device illustrated in FIG. 27 includes a terminal electrode 501, a wiring 502, a scan line driver circuit 503, scan lines 531, a signal line driver circuit 504, signal lines 541, and a pixel portion 505.

The terminal electrode 501 includes, for example, part of a signal input terminal to which a scan signal, a video signal, or the like is input; part of a power supply terminal to which a power supply voltage is supplied; and an electrode such as a ground electrode to which a ground potential is supplied.

The scan line driver circuit 503 is electrically connected to the terminal electrode 501 through the wiring 502. For example, a signal such as a control signal is input or a power supply voltage is applied from the terminal electrode 501 to the scan line driver circuit 503. The scan line driver circuit 503 outputs a scan signal through the scan line 531 at the timing in accordance with the signal input.

The signal line driver circuit 504 is electrically connected to the terminal electrode 501 through the wiring 502. For example, a signal such as a control signal or a video signal is input or a power supply voltage is applied from the terminal electrode 501 to the signal line driver circuit 504. The signal line driver circuit outputs a video signal through the signal line 541 at the timing in accordance with the signal input.

The pixel portion 505 includes a plurality of pixels 5051. Each of the pixels 5051 is electrically connected to any of the scan lines 531 and any of the signal lines 541, and a scan signal and a video signal are input to the pixel 5051.

Figure 28A:
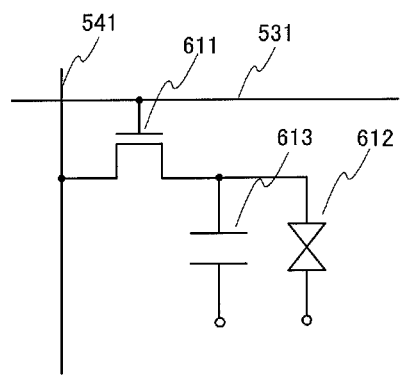
FIGS. 28A and 28B are circuit diagrams each illustrating an example of a circuit configuration of a pixel in the display device illustrated in FIG. 27.
Figure 28B:
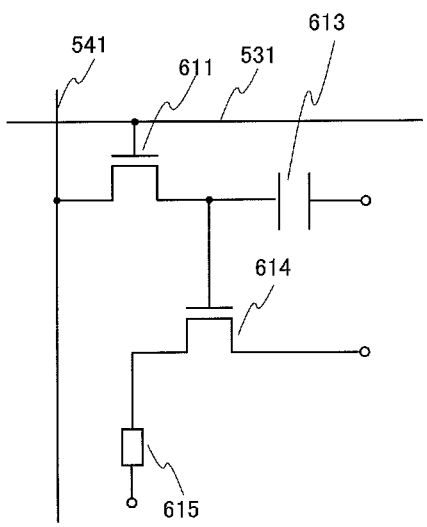

Next, examples of a circuit configuration of the pixel 5051 will be described with reference to FIGS. 28A and 28B. FIGS. 28A and 28B each illustrate an example of a circuit configuration of the pixel 5051.

The pixel illustrated in FIG. 28A includes a transistor 611, a liquid crystal element 612, and a capacitor 613. Note that the transistor 611 in FIG. 28A is a field effect transistor as an example.

The transistor 611 functions as a selection switch. A gate of the transistor 611 is electrically connected to the scan line 531. One of a source and a drain of the transistor 611 is electrically connected to the signal line 541.

The liquid crystal element 612 has a first terminal and a second terminal. The first terminal of the liquid crystal element 612 is electrically connected to the other of the source and the drain of the transistor 611. The voltage $V_1$ or the voltage $V_2$ is applied to the second terminal of the liquid crystal element 612. The liquid crystal element 612 can include, for example, a first electrode which serves as part of or the entire first terminal, a second electrode which serves as part of or the entire second terminal, and a layer including liquid crystal molecules whose transmittance is changed by application of voltage between the first electrode and the second electrode (such a layer is referred to as a liquid crystal layer).

The following are examples of the liquid crystal layer, a liquid crystal material which can be used for the liquid crystal layer, or a liquid crystal mode which can be used for the liquid crystal element 612 including the liquid crystal layer: a nematic liquid crystal, a cholesteric liquid crystal, a smectic liquid crystal, a discotic liquid crystal, a thermotropic liquid crystal, a lyotropic liquid crystal, a low molecular liquid crystal, a high molecular liquid crystal, a polymer dispersed liquid crystal (PDLC), a ferroelectric liquid crystal, an anti-ferroelectric liquid crystal, a main-chain liquid crystal, a side-chain polymer liquid crystal, a plasma addressed liquid crystal (PALC), a banana-shaped liquid crystal, a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned micro-cell) mode, an OCB (optical compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, and a blue-phase mode.

A first terminal of the capacitor 613 is electrically connected to the other of the source and the drain of the transistor 611. Like the liquid crystal element 612, the voltage $V_1$ or the voltage $V_2$ is applied to a second terminal of the capacitor 613. The capacitor 613 functions as a storage capacitor. Note that although the capacitor 613 is not necessarily provided, the capacitor 613 can inhibit adverse effects of leakage current of the transistor 611.

Next, operation of the pixel illustrated in FIG. 28A will be described.

First, when the scan line 531 is selected by the scan line driver circuit 503 illustrated in FIG. 27, the transistor 611 is turned on by a scan signal input from the scan line driver circuit 503.

At this time, the first terminal of the liquid crystal element 612 and the first terminal of the capacitor 613 have a potential corresponding to a video signal input from the signal line driver circuit 504 illustrated in FIG. 27. The alignment of liquid crystal molecules in the liquid crystal element 612 is controlled in accordance with voltage applied between the first terminal and the second terminal, and an image is displayed with the pixel in accordance with the transmittance of the liquid crystal element 612. The above operation is sequentially performed every scan line 531 in FIG. 27, so that data is written to all the pixels. This is the operation of the pixel illustrated in FIG. 28A.

Note that the circuit configuration of the pixel in the display device in this embodiment is not limited to the circuit configuration of the pixel illustrated in FIG. 28A. For example, a transistor, a resistor, a capacitor, or the like can be additionally provided in the circuit configuration of the pixel in FIG. 28A.

Further, the pixel in the display device in this embodiment is not limited to having the circuit configuration of the pixel in FIG. 28A, and can have a different circuit configuration. Another example of the circuit configuration of the pixel in the display device in this embodiment is described with reference to FIG. 28B. FIG. 28B is a circuit diagram illustrating an example of the circuit configuration of the pixel in the display device in this embodiment.

The pixel illustrated in FIG. 28B includes the transistor 611, the capacitor 613, a transistor 614, and a light-emitting element 615.

The gate of the transistor 611 is electrically connected to the scan line 531. One of the source and the drain of the transistor 611 is electrically connected to the signal line 541.

The capacitor 613 includes the first terminal and the second terminal. The first terminal of the capacitor 613 is electrically connected to the other of the source and the drain of the transistor 611. One of the voltage $V_1$ or the voltage $V_2$ is applied to the second terminal of capacitor 613. The capacitor 613 functions as a storage capacitor. Note that although the capacitor 613 is not necessarily provided, the capacitor 613 can make the ON state of the transistor 614 held for a certain period of time.

A gate of the transistor 614 is electrically connected to the other of the source and the drain of the transistor 611. One of the voltage $V_1$ or the voltage $V_2$ is applied to one of a source and a drain of the transistor 614.

The light-emitting element 615 has a first terminal and a second terminal. The first terminal of the light-emitting element 615 is electrically connected to the other of the source and the drain of the transistor 614. The other of the voltage $V_1$ or the voltage $V_2$ is applied to the second terminal of the light-emitting element 615. The light-emitting element 615 can include, for example, a first electrode which serves as part of or the entire first terminal, a second electrode which serves as part of or the entire second terminal, and an electroluminescent layer which emits light by application of voltage between the first electrode and the second electrode. As the light-emitting element 615, an EL (also referred to as electroluminescence) element can be used, for example. Examples of the EL element are an organic EL element and an inorganic EL element.

At least one of the first electrode and the second electrode of the light-emitting element 615 is formed using a light-transmitting conductive material. Accordingly, a light-emitting element can have a top emission structure in which light is emitted through the surface opposite to the substrate, a bottom emission structure in which light is emitted through the surface on the substrate side, or a dual emission structure in which light is emitted through the surface opposite to the substrate and the surface on the substrate side. As the light-transmitting conductive material, a light-transmitting conductive film such as a film of indium oxide containing tungsten oxide, indium zinc oxide containing tungsten oxide, indium oxide containing titanium oxide, indium tin oxide containing titanium oxide, indium tin oxide (also referred to as ITO), indium zinc oxide, or indium tin oxide to which silicon oxide is added can be used, for example.

The electroluminescent layer may be formed using a single layer or a plurality of layers stacked. When the electroluminescent layer is formed using a plurality of layers, an electron-injecting layer, an electron-transporting layer, an electroluminescent layer, a hole-transporting layer, and a hole-injecting layer are stacked in this order over the first electrode. Note that it is not necessary to form all of these layers. The electroluminescent layer can be formed using an organic compound or an inorganic compound.

Next, operation of the pixel illustrated in FIG. 28B will be described.

First, when the scan line 531 is selected by the scan line driver circuit 503 illustrated in FIG. 27, the transistor 611 is turned on by a scan signal input from the scan line driver circuit 503.

At this time, the gate of the transistor 614 and the first terminal of the capacitor 613 have a potential corresponding to a video signal input from the signal line driver circuit 504 illustrated in FIG. 27; the transistor 614 is turned on; and a current flows between the source and the drain of the transistor 614. Further, a given voltage is applied between the first terminal and the second terminal of the light-emitting element 615 in accordance with the amount of current flowing through the transistor 614, and an image is displayed with the pixel. The above operation is sequentially performed every scan line 531 in FIG. 27, so that data is written to all the pixels. This is the operation of the pixel illustrated in FIG. 28B.

In the case where a data signal input from the signal line 541 to the pixel is a digital signal, the pixel is brought into a light-emitting state or a non-light-emitting state by switching on and off of the transistor. Thus, gray levels can be expressed by an area ratio grayscale method or a time ratio grayscale method. An area ratio grayscale method refers to a driving method in which one pixel is divided into a plurality of subpixels and the subpixels each having the circuit configuration in FIG. 28B are independently driven in accordance with data signals so that gray levels are expressed. Further, a time ratio grayscale method refers to a driving method in which a period during which a pixel emits light is controlled so that gray levels are expressed.

The response speed of the light-emitting element 615 is higher than that of the liquid crystal element 612 illustrated in FIG. 28A, for example. Therefore, the light-emitting element 615 is suitable for a time ratio grayscale method. Specifically, in the case of performing display by a time ratio grayscale method, one frame period is divided into a plurality of sub-frame periods. Then, in accordance with video signals, the light-emitting element in the pixel is set in a light-emitting state or in a non-light-emitting state during each subframe period. By dividing one frame period into a plurality of sub-frame periods, the total length of time during which a pixel actually emits light in one frame period can be controlled by video signals so that gray levels can be expressed.

Figure 29A:
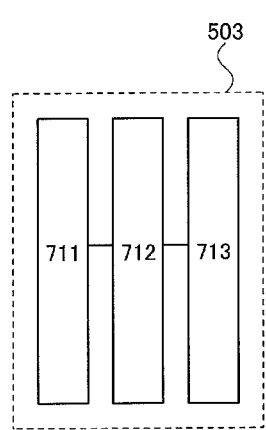
FIGS. 29A and 29B are block diagrams illustrating an example of a configuration of a scan line driver circuit and a signal line driver circuit in the display device illustrated in FIG. 27.
Figure 29B:
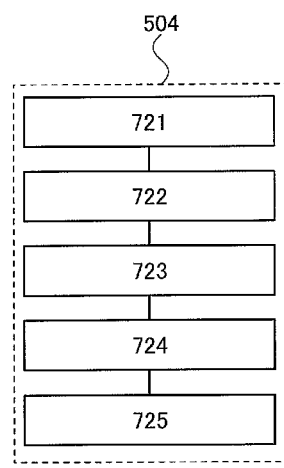

Next, examples of structures of the scan line driver circuit 503 and the signal line driver circuit 504 in the display device illustrated in FIG. 27 will be described with reference to FIGS. 29A and 29B. FIGS. 29A and 29B illustrate examples of the structures of the scan line driver circuit and the signal line driver circuit in the display device illustrated in FIG. 27. FIG. 29A is a block diagram illustrating an example of the structure of the scan line driver circuit. FIG. 29B is a block diagram illustrating an example of the structure of the signal line driver circuit.

The scan line driver circuit 503 illustrated in FIG. 29A includes a shift register 711, a level shifter 712, and a buffer circuit 713.

The shift register 711 has a function of sequentially selecting the scan lines 531.

The level shifter 712 has a function of generating a plurality of signals whose voltage states are different depending on applications, in accordance with a signal input.

The buffer circuit 713 has a function of amplifying an output signal of the level shifter 712, which is input to the buffer circuit 713. The buffer circuit 713 can include an operational amplifier, for example.

The signal line driver circuit 504 illustrated in FIG. 29B includes a shift register 721, a latch circuit 722, a level shifter 723, a buffer circuit 724 and a D/A converter circuit 725.

The shift register 721 has a function of sequentially selecting the signal lines 541.

The latch circuit 722 holds a signal input from the shift register 721 for a certain period of time, and outputs the held latch signals to the pixel portion 505 in FIG. 27 all at once. This is referred to as line sequential driving.

The level shifter 723 has a function of generating a plurality of signals which are different depending on applications, in accordance with a signal input.

The buffer circuit 724 has a function of amplifying an output signal from the level shifter 723, which is input to the buffer circuit 724. The buffer circuit 724 can include an operational amplifier, for example.

The D/A converter circuit 725 has a function of converting a digital signal into an analog signal in the case where a signal input is a digital signal. Note that in the case where the input signal is an analog signal, the D/A converter circuit 725 is not necessarily provided.

A driver circuit such as the scan line driver circuit or the signal line driver circuit can be constituted by a semiconductor element, for example. Examples of the semiconductor element are a transistor, a capacitor, and a resistor. For example, when a transistor is used, the transistor can have the same structure as the transistor in the electronic circuit which is one embodiment of the present invention.

Figure 30:
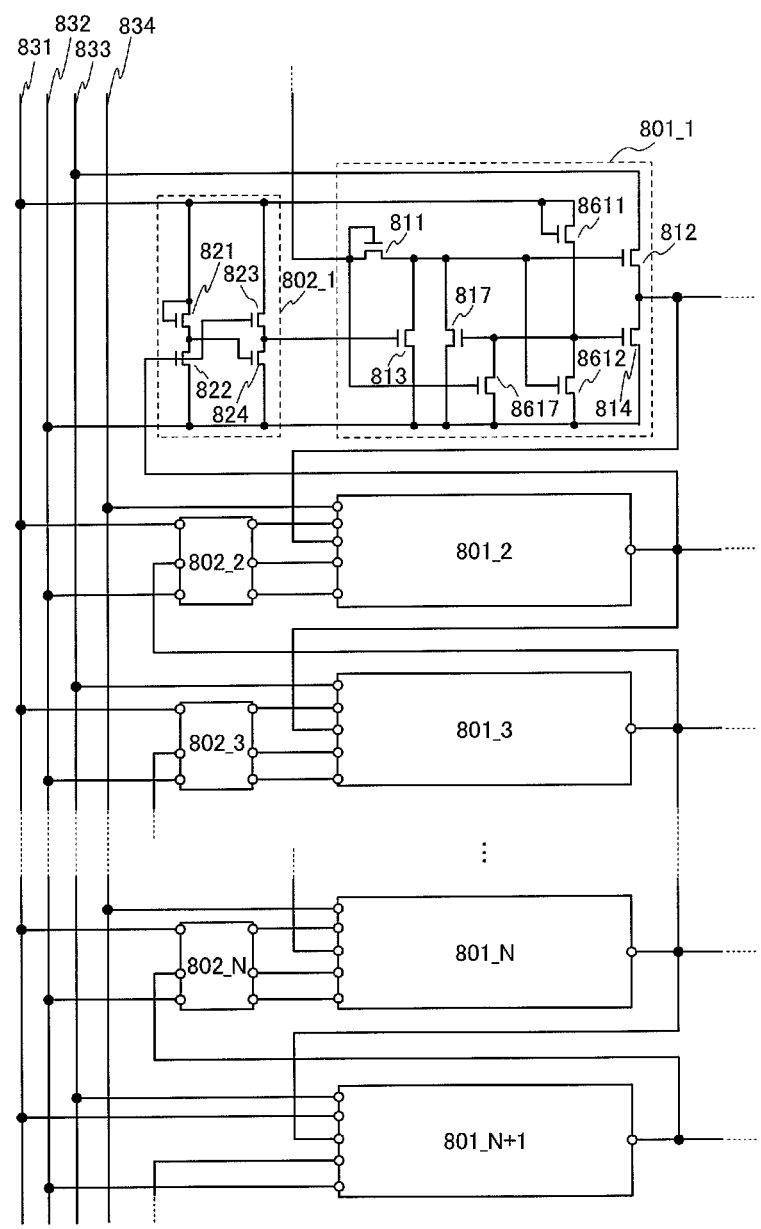
FIG. 30 illustrates an example of a configuration of a shift register in the scan line driver circuit or the signal line driver circuit illustrated in FIG. 29A or FIG. 29B.

An example of a circuit configuration of a shift register in the scan line driver circuit or the signal line driver circuit will be described with reference to FIG. 30. FIG. 30 illustrates an example of a circuit configuration of a shift register in the driver circuit of the display device in this embodiment. Note that the case is described in which a sequential circuit in the shift register in FIG. 30 has the circuit configuration in FIG. 14E, the control circuit 316 in FIG. 14E has the circuit configuration in FIG. 15E, and the control circuit has the circuit configuration in FIG. 6B.

The shift register illustrated in FIG. 30 includes sequential circuits of N stages (N is a natural number) constituted by N sequential circuits (sequential circuits 801_1 to 801_N) which are electrically connected to each other; and control circuits of N stages constituted by N control circuits (control circuits 802_1 to 802_N), one of which is electrically connected to the Oth stage sequential circuit and the (O+1)th stage sequential circuit (O is a natural number of 1 to N−1).

Each of the sequential circuits of N stages includes a transistor 811, a transistor 812, a transistor 813, a transistor 814, a transistor 817, a transistor 8611, a transistor 8612, and a transistor 8617, as exemplified by the sequential circuit 801_1 in FIG. 30.

In the Kth stage sequential circuit, one of a source and a drain of the transistor 812 is electrically connected to a clock signal line 833 or an inverted clock signal line 834; the other of the source and the drain of the transistor 812 is electrically connected to a gate and one of a source and a drain of the transistor 811 in the (K+1)th stage sequential circuit; and a gate of the transistor 812 is electrically connected to the other of the source and the drain of the transistor 811;

Moreover, in the Kth stage sequential circuit, one of a source and a drain of the transistor 813 is electrically connected to the other of the source and the drain of the transistor 811, and the other of the source and the drain of the transistor 813 is electrically connected to a power supply line 832.

In the Kth stage sequential circuit, one of a source and a drain of the transistor 814 is electrically connected to the other of the source and the drain of the transistor 812, and the other of the source and the drain of the transistor 814 is electrically connected to the power supply line 832.

Furthermore, in the Kth stage sequential circuit, a gate of the transistor 817 is electrically connected to a gate of the transistor 814; one of a source and a drain of the transistor 817 is electrically connected to the other of the source and the drain of the transistor 811; and the other of the source and the drain of the transistor 817 is electrically connected to the power supply line 832.

In the Kth stage sequential circuit, a gate and one of a source and a drain of the transistor 8611 are electrically connected to a power supply line 831, and the other of the source and the drain of the transistor 8611 is electrically connected to the gate of the transistor 814.

Further, in the Kth stage sequential circuit, a gate of the transistor 8612 is electrically connected to the other of the source and the drain of the transistor 811; one of a source and a drain of the transistor 8612 is electrically connected to the other of the source and the drain of the transistor 8611; and the other of the source and the drain of the transistor 8612 is electrically connected to the power supply line 832.

In the Kth stage sequential circuit, one of a source and a drain of the transistor 8617 is electrically connected to the other of the source and the drain of the transistor 811, and the other of the source and the drain of the transistor 8617 is electrically connected to the power supply line 832.

In the Kth stage sequential circuit, a start signal (also referred to as ST) is input to the gate of the transistor 811 and a gate of the transistor 8617.

In addition, each of the control circuits of N stages includes a transistor 821, a transistor 822, a transistor 823, and a transistor 824, as exemplified by the control circuit 802_1 in FIG. 30.

In the Kth stage control circuit, a gate and one of a source and a drain of the transistor 821 are electrically connected to the power supply line 831. Moreover, in the Kth stage control circuit, a gate of the transistor 822 is electrically connected to the other of the source and the drain of the transistor 812 in the (K+1)th stage sequential circuit; one of a source and a drain of the transistor 822 is electrically connected to the other of the source and the drain of the transistor 821; and the other of the source and the drain of the transistor 822 is electrically connected to the power supply line 832. Furthermore, in the Kth stage control circuit, a gate of the transistor 823 is electrically connected to the other of the source and the drain of the transistor 812 in the (K+1)th stage sequential circuit; one of a source and a drain of the transistor 823 is electrically connected to the power supply line 831; and the other of the source and the drain of the transistor 823 is electrically connected to the gate of the transistor 813 in the Kth stage sequential circuit. Further, in the Kth stage control circuit, a gate of the transistor 824 is electrically connected to the other of the source and the drain of the transistor 821; one of a source and a drain of the transistor 824 is electrically connected to the other of the source and the drain of the transistor 823; and the other of the source and the drain of the transistor 824 is electrically connected to the power supply line 832.

Figure 31A:
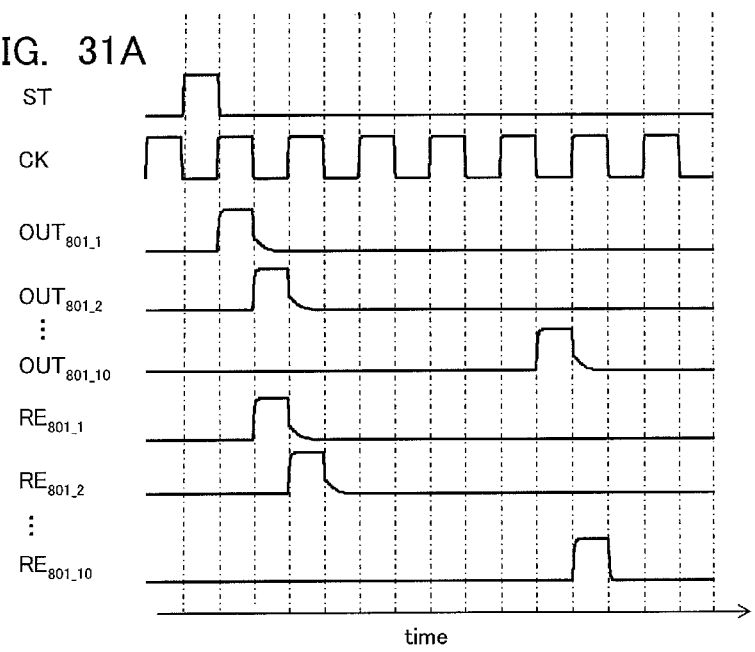
FIGS. 31A and 31B illustrate the result of operation verification of the shift register illustrated in FIG. 30.
Figure 31B:
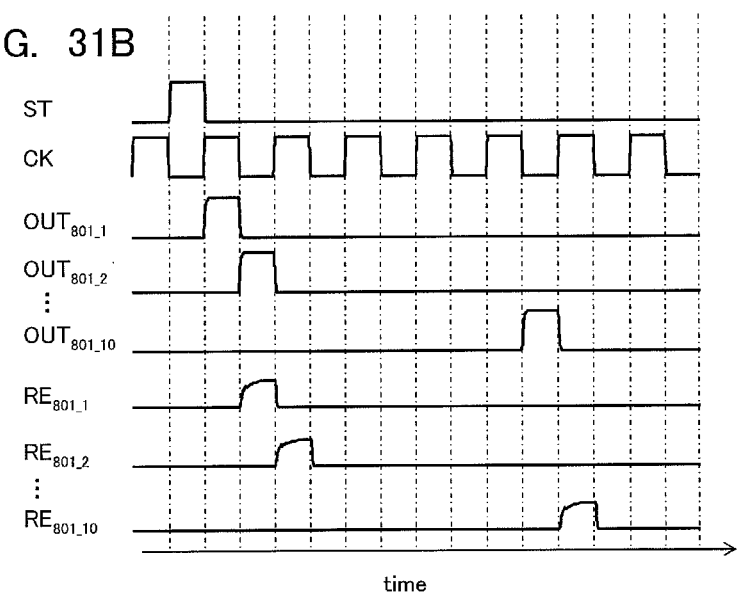

Next, operation verification of the shift register illustrated in FIG. 30 will be described. Note that verification is performed on a shift register in which N is 10 and a dummy one-stage sequential circuit is provided in addition to sequential circuits of ten stages. The use of an output signal of the dummy sequential circuit can control a reset signal of the tenth stage sequential circuit. Moreover, the shift register is set so that all the transistor are n-channel transistors, the size of the transistor in the control circuit is smaller than that of the transistor in the sequential circuit, and a desired delay time is obtained. In addition, as a comparative example to the shift register in FIG. 30, verification is also performed on the shift register in FIG. 30 in the case where the control circuits of N stages are not provided. In the verification, the start signal (also referred to as ST) is input to the gate and one of the source and the drain of the transistor 811 in the sequential circuit 801_1; a clock signal (also referred to as CK) is input through the clock signal line 833; an inverted clock signal (also referred to as CKB) of the clock signal in the clock signal line 833 is input through the inverted clock signal line 834; the cycle of the clock signal is 24 μs; the frequency of the clock signal is 41.7 kHz; the amplitude of the clock signal is 0 V to 30 V; $V_{dd}$ is 30 V; $V_{ss}$ is 0 V; and the threshold voltage of each transistor is 8 V. In the case where the control circuit is not provided, the other of the source and the drain of the transistor 812 in the (K+1)th stage sequential circuit is electrically connected to the gate of the transistor 813 in the Kth stage sequential circuit. The verification result is described with reference to FIGS. 31A and 31B. FIGS. 31A and 31B are timing charts illustrating the result of operation verification of the shift register in this embodiment. FIG. 31A is a timing chart of the shift register of the comparative example. FIG. 31B is a timing chart of the shift register illustrated in FIG. 30.

In the shift register of the comparative example, delay occurs by the time output signals ($OUT_{801\_1}$ to $OUT_{801\_10}$) of each sequential circuit fall as illustrated in FIG. 31A. In the sequential circuit in the shift register of the comparative example, after the output signal rises, the clock signal rises and the transistors 812 and 814 are turned on, whereby the voltage of the output signal starts to decrease. In general, the channel width of the transistor 812 is often made larger than that of the transistor 814; thus, the use of the transistor 812 can shorten the fall time of the output signal. However, in the shift register of the comparative example, before the output signal of each sequential circuit falls, the transistor 813 is turned on and the transistor 812 is turned off by each reset signal ($RE_{801\_1}$ to $RE_{801\_10}$). The output signal falls by the transistor 814 when the transistor 812 is turned off. Accordingly, it takes more time for the output signal to fall in the case of using the transistor 814 as compared to the case of using the transistor 812.

On the other hand, in the shift register in FIG. 30, output signals of the sequential circuits of the second stage to the tenth stage are input as reset signals to the respective sequential circuits in the previous stage through the respective control circuits; thus, the reset signals of the sequential circuits of the first stage to the tenth stage are delayed as compared to output signals of the respective sequential circuits in the next stage as illustrated in FIG. 31B. By inputting the delayed reset signal to the sequential circuit, the timing at which the transistor 813 is turned on can be delayed for a certain period of time, when the output signal is made to fall. Thus, the output signal can be made to fall by using the transistor 812, and the fall time of the output signal can be shortened.

As illustrated in FIGS. 31A and 31B, it can be seen that even when the shift register includes sequential circuits of ten stages, control of the reset signal of each sequential circuit can control the output signal of each sequential circuit.

Note that this embodiment can be combined or replaced with any of the other embodiments as appropriate.

Embodiment 10

Figure 32A:
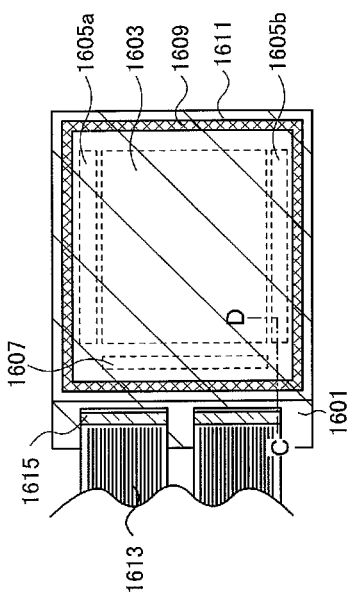
FIGS. 32A and 32B illustrate a structure of a display device in Embodiment 10.
Figure 32B:
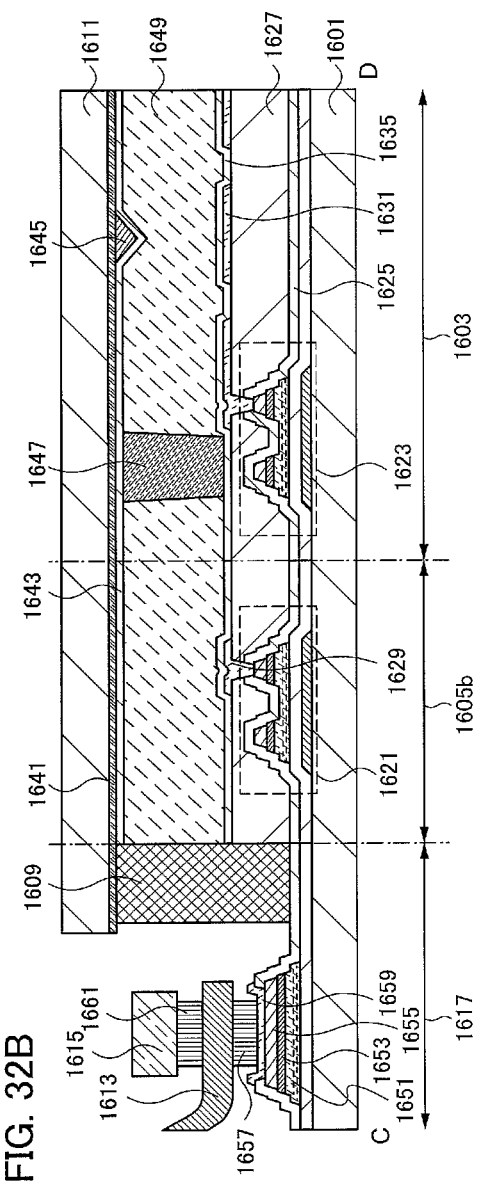

In this embodiment, a structure of a liquid crystal display device will be described with reference to FIGS. 32A and 32B as an embodiment of a display device, which is one embodiment of the present invention. Specifically, a structure of a liquid crystal display device which includes a TFT substrate, a counter substrate, and a liquid crystal layer held between the counter substrate and the TFT substrate will be described. FIG. 32A is a top view of a liquid crystal display device. FIG. 32B is a cross-sectional view along line C-D in FIG. 32A. Note that FIG. 32B is a cross-sectional view of a liquid crystal display device in which an inverted staggered thin film transistor including a microcrystalline semiconductor layer in a channel region is formed over a substrate 1601, and an MVA (multi-domain vertical alignment) mode is employed for the display mode.

In the liquid crystal display device illustrated in FIG. 32A, a pixel portion 1603, a first scan line driver circuit 1605a, a second scan line driver circuit 1605b, and a signal line driver circuit 1607 are formed over the substrate 1601. The pixel portion 1603, the first scan line driver circuit 1605a, the second scan line driver circuit 1605b, and the signal line driver circuit 1607 are sealed between the substrate 1601 and a substrate 1611 with a sealant 1609. Moreover, an FPC 1613 and an IC chip 1615 are provided over the substrate 1601 by a TAB method.

A cross-sectional structure along line C-D in FIG. 32A is described with reference to FIG. 32B. Here, the pixel portion 1603, the second scan line driver circuit 1605b which is part of a peripheral driver circuit portion, and a terminal portion 1617, which are formed over the substrate 1601, are shown.

A thin film transistor 1621 provided in the second scan line driver circuit 1605b and a thin film transistor 1623 provided in the pixel portion 1603 are formed over the substrate 1601. Moreover, insulating layers 1625 and 1627 are formed over the thin film transistors 1621 and 1623. Furthermore, a wiring 1629 to be connected to a source electrode or a drain electrode of the thin film transistor 1621 through an opening portion in the insulating layers 1625 and 1627 is formed, and a pixel electrode 1631 to be connected to a source electrode or a drain electrode of the thin film transistor 1623 through an opening portion in the insulating layers 1625 and 1627 is formed. Further, an insulating layer 1635 is formed over the insulating layer 1627, the wiring 1629, and the pixel electrode 1631.

The structures and manufacturing methods of the thin film transistors described in Embodiments 6 and 7 can be applied to a structure and a manufacturing method of the thin film transistors 1621 and 1623 as appropriate.

Each of the insulating layer 1625 and the insulating layer 1627 can be formed using an inorganic insulating layer, an organic resin layer, or the like. As the inorganic insulating layer, a silicon oxide layer, a silicon oxynitride layer, a silicon nitride oxide layer, a carbon layer typified by diamond like carbon (DLC), or the like can be used. For the organic resin layer, an acrylic resin, an epoxy resin, polyimide, polyamide, polyvinyl phenol, benzocyclobutene, or the like can be used. Alternatively, a siloxane polymer can be used.

Each of the insulating layer 1625 and the insulating layer 1627 can be formed by a CVD method, a sputtering method, a printing method, a coating method, a slit coating method, or the like as appropriate.

In addition, the planarity can be improved when at least one of the insulating layer 1625 and the insulating layer 1627 is formed using an organic resin layer; thus, alignment of liquid crystal molecules in a liquid crystal layer 1649 can be easily controlled.

The wiring 1629 and the pixel electrode 1631 can be formed using indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like.

Alternatively, the wiring 1629 and the pixel electrode 1631 can be formed using a conductive composition containing a conductive macromolecule (also referred to as a conductive polymer) having a light-transmitting property. The wiring 1629 and the pixel electrode 1631 preferably have a sheet resistance of 10000 ohms/square or less and a light transmittance of 70% or higher at a wavelength of 550 nm. Furthermore, the resistivity of the conductive macromolecule contained in the conductive composition is preferably 0.1 Ω·cm or less.

As the conductive macromolecule, a so-called π-electron conjugated conductive macromolecule can be used. Examples are polyaniline and a derivative thereof, polypyrrole and a derivative thereof, polythiophene and a derivative thereof, and a copolymer of two or more kinds of these materials.

Note that when the pixel electrode 1631 functions as a reflective electrode, the wiring 1629 and the pixel electrode 1631 can be formed using aluminum, silver, or the like; or an alloy thereof, or the like. Alternatively, the wiring 1629 and the pixel electrode 1631 may have a two-layer structure of aluminum and titanium, molybdenum, tantalum, chromium, or tungsten; or a three-layer structure in which aluminum is sandwiched between metals such as titanium, molybdenum, tantalum, chromium, or tungsten.

An opening portion is formed in the pixel electrode 1631. The opening portion formed in the pixel electrode 1631 can have the same function as a protrusion used in the MVA mode because the opening portion can make liquid crystal molecules be slanted.

The insulating layer 1635 functions as an alignment film.

The sealant 1609 is formed around the pixel portion 1603, or around the pixel portion 1603 and the peripheral driver circuit portion thereof by an inkjet method or the like. The substrate 1611 on which a conductive layer 1641, an insulating layer 1643, a protrusion 1645, and the like are formed and the substrate 1601 are attached to each other by the sealant 1609 with a spacer 1647 therebetween, and the liquid crystal layer 1649 is provided in the gap between the two substrates. Note that the substrate 1611 functions as a counter substrate.

The spacer 1647 may be provided in such a manner that particles of several micrometers are dispersed or that a resin layer is formed over the entire surface of the substrate and then etched.

The conductive layer 1641 functions as a counter electrode. The conductive layer 1641 can be formed using a material similar to that of the wiring 1629 and the pixel electrode 1631. Moreover, the insulating layer 1643 functions as an alignment film.

A connection terminal 1659 is formed in the terminal portion 1617. The connection terminal 1659 is electrically connected to the pixel portion 1603 and the wiring 1629 in the peripheral driver circuit portion. The connection terminal 1659 is formed in a similar manner to that in the pixel electrode 1631 in the pixel portion 1603 and the wiring 1629 in the peripheral driver circuit portion.

In this case, the thin film transistors 1621 and 1623 are formed through the steps with the multi-tone mask; therefore, a microcrystalline semiconductor layer 1651 which is formed concurrently with microcrystalline semiconductor layers of the thin film transistors, an impurity semiconductor layer 1653 which is formed concurrently with source regions and drain regions, and a wiring 1655 are formed between the connection terminal 1659 and the substrate 1601.

The FPC 1613 is provided over the connection terminal 1659 with an anisotropic conductive layer 1657 therebetween. Furthermore, the IC chip 1615 is provided over the FPC 1613 with an anisotropic conductive layer 1661 therebetween. That is, the FPC 1613, the anisotropic conductive layers 1657 and 1661, and the IC chip 1615 are electrically connected to each other.

An adhesive material such as an anisotropic conductive film (ACF) or anisotropic conductive paste (ACP) can be used for the anisotropic conductive layers 1657 and 1661. Alternatively, a conductive adhesive such as silver paste, copper paste, or carbon paste, solder paste, or the like can be used for the anisotropic conductive layers 1657 and 1661.

Note that by forming a functional circuit (e.g., a memory or a buffer) in the IC chip 1615, the area of the substrate can be efficiently utilized.

Note that although FIG. 32B illustrates the cross-sectional view in the case where the display mode is the MVA mode, the display mode may be a PVA (patterned vertical alignment) mode. In the case of employing the PVA mode, a slit may be provided for the conductive layer 1641 formed on the substrate 1611, so that liquid crystal molecules can be slanted to be aligned. Moreover, the protrusion 1645 (also referred to as the alignment control protrusion) may be provided over the conductive film for which the slit is provided, so that liquid crystal molecules can be slanted to be aligned. Note that this embodiment is not limited to this example, and any of the liquid crystal modes which can be applied to the liquid crystal element 612 illustrated in FIG. 28A can be employed for the display mode.

The structure is described in which the first scan line driver circuit 1605a, the second scan line driver circuit 1605b, and the signal line driver circuit 1607 are formed over the substrate 1601 in the liquid crystal panel in FIGS. 32A and 32B; alternatively, a driver IC may be used as a driver circuit corresponding to the signal line driver circuit 1607 and mounted on a liquid crystal panel by a COG method or the like. The use of the driver IC as the signal line driver circuit 1607 can save power. Further, when a semiconductor chip formed using a silicon wafer or the like is used as the driver IC, the liquid crystal display device can operate at higher speed with lower power consumption.

As has been described above, a microcrystalline semiconductor is used for a channel region of the thin film transistor in the display device in this embodiment, whereby increase in size of the display device, reduction in cost, increase in yield, or the like can be achieved. In addition, the use of the microcrystalline semiconductor for the semiconductor layer can suppress deterioration in characteristics of the thin film transistor, so that the life of the display device can be made longer.

Note that this embodiment can be combined or replaced with any of the other embodiments as appropriate.

Embodiment 11

In this embodiment, an electronic device including the display device, which is one embodiment of the present invention, for a display portion will be described.

FIGS. 33A to 33H and FIGS. 34A to 34D illustrates examples of electronic devices. These electronic devices can include a housing 5000, a display portion 5001, a speaker 5003, an LED lamp 5004, operation keys 5005 (including a power switch or an operation switch for controlling the operation of a display device), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 33A:
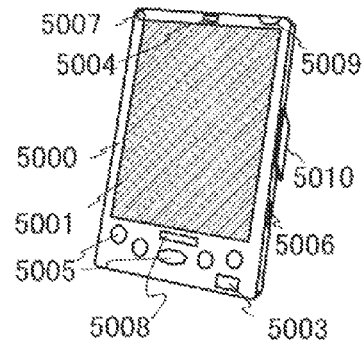
FIGS. 33A to 33H each illustrate an example of a structure of an electronic device in Embodiment 11.
Figure 33B:
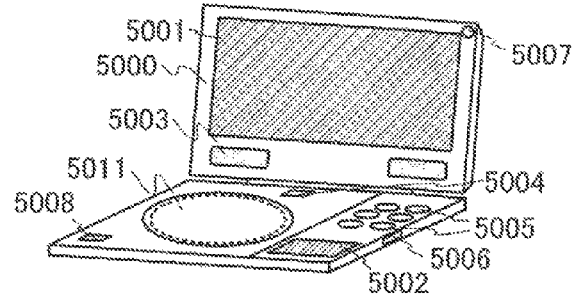
Figure 33C:
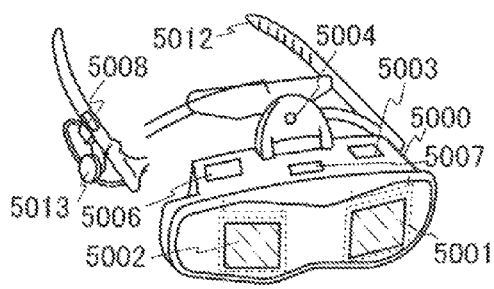
Figure 33D:
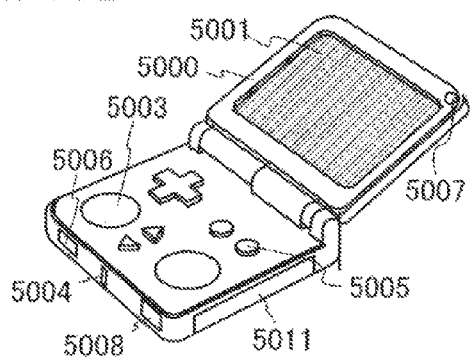
Figure 33E:
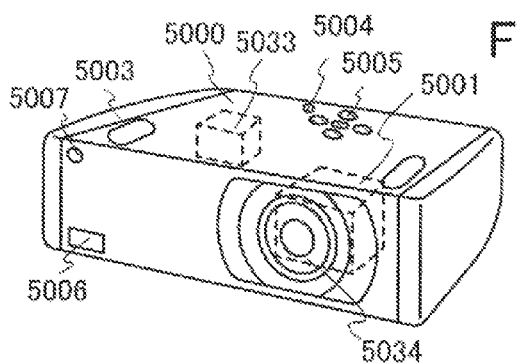
Figure 33F:
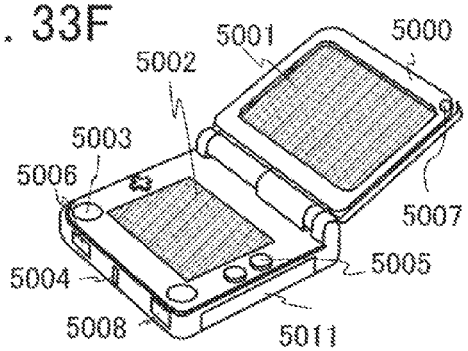
Figure 33G:
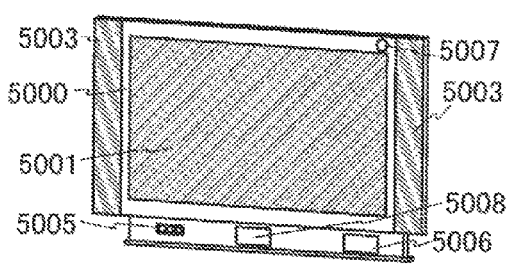
Figure 33H:
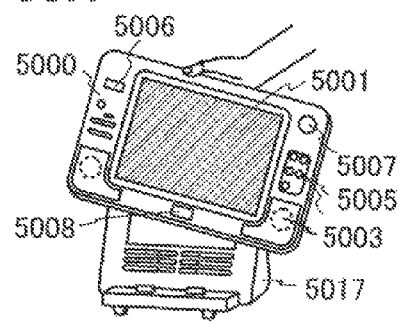
Figure 34A:
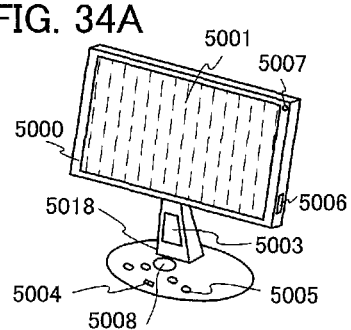
FIGS. 34A to 34H each illustrate an example of a structure of an electronic device in Embodiment 11.
Figure 34B:
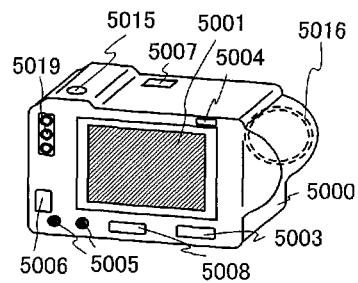
Figure 34C:
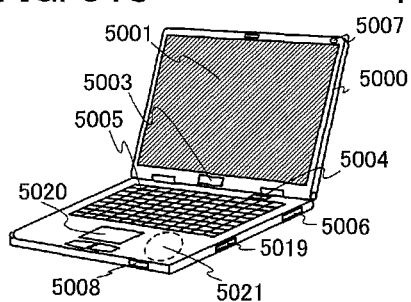
Figure 34D:
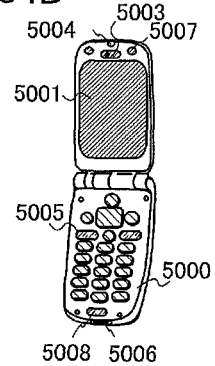

FIG. 33A illustrates a mobile computer, which can include a switch 5009, an infrared port 5010, and the like in addition to the above objects. FIG. 33B illustrates a portable image reproducing device provided with a memory medium (e.g., a DVD reproducing device), which can include a second display portion 5002, a memory medium reading portion 5011, and the like in addition to the above objects. FIG. 33C illustrates a goggle-type display, which can include the second display portion 5002, a support portion 5012, an earphone 5013, and the like in addition to the above objects. FIG. 33D illustrates a portable game machine, which can include the memory medium reading portion 5011 and the like in addition to the above objects. FIG. 33E illustrates a projector, which can include a light source 5033, a projection lens 5034, and the like in addition to the above objects. FIG. 33F illustrates a portable game machine, which can include the second display portion 5002, the memory medium reading portion 5011, and the like in addition to the above objects. FIG. 33G illustrates a television receiver, which can include a tuner, an image processing portion, and the like in addition to the above objects. FIG. 33H illustrates a portable television receiver, which can include a charger 5017 capable of transmitting and receiving signals and the like in addition to the above objects. FIG. 34A illustrates a display, which can include a support base 5018 and the like in addition to the above objects. FIG. 34B illustrates a camera, which can include an external connecting port 5019, a shutter button 5015, an image receiving portion 5016, and the like in addition to the above objects. FIG. 34C illustrates a computer, which can include a pointing device 5020, the external connecting port 5019, a reader/writer 5021, and the like in addition to the above objects. FIG. 34D illustrates a mobile phone, which can include a tuner of one-segment partial reception service for mobile phones and mobile terminals ("1seg"), and the like in addition to the above objects. Moreover, an antenna is incorporated in the housing 5000.

The electronic devices illustrated in FIGS. 33A to 33H and FIGS. 34A to 34D can have a variety of functions, for example, a function of displaying a variety of information (a still image, a moving image, a text image, and the like) on a display portion; a touch panel function; a function of displaying a calendar, date, time, and the like; a function of controlling process with a variety of software (programs); a wireless communication function; a function of being connected to a variety of computer networks with a wireless communication function; a function of transmitting and receiving a variety of data with a wireless communication function; and a function of reading program or data stored in a memory medium and displaying the program or data on a display portion. Further, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on a display portion, or the like. Note that functions which can be provided for the electronic devices illustrated in FIGS. 33A to 33H and FIGS. 34A to 34D are not limited to those described above, and the electronic devices can have a variety of functions.

The electronic device described in this embodiment includes a display portion for displaying some sort of information. The display device which is one embodiment of the present invention is applied to a display portion, whereby it is possible to achieve improvement in reliability, increase in yield, reduction in cost, increase in size of the display portion, higher definition of the display portion, or the like.

Figure 34E:
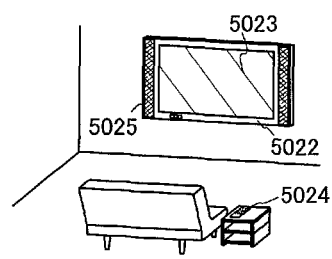

FIG. 34E illustrates an example in which the display device, which is one embodiment of the present invention, is provided so as to be integrated with a building. FIG. 34E illustrates a housing 5022, a display portion 5023, a remote controller device 5024 which is an operation portion, a speaker 5025, and the like. The display device is incorporated in the building as a wall-hanging type and can be provided without requiring a large space.

Figure 34F:
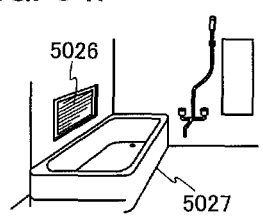

FIG. 34F illustrates another example in which the display device, which is one embodiment of the present invention, is incorporated in a constructed object. A display panel 5026 which is the display device is integrated with a prefabricated bath 5027, so that a person who takes a bath can watch the display panel 5026.

Note that although the wall and the prefabricated bath are shown as examples of the building in this embodiment, this embodiment is not limited to these examples. The display device, which is one embodiment of the present invention, can be provided in a variety of building structures.

Next, examples where the display device, which is one embodiment of the present invention, is incorporated with a moving object will be described.

Figure 34G:
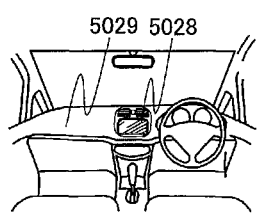

FIG. 34G illustrates an example in which the display device, which is one embodiment of the present invention, is incorporated in a car. A display panel 5028 is provided in a body 5029 of the car and can display information input from the operation of the body or the outside of the body on demand. Note that a navigation function may be provided.

Figure 34H:
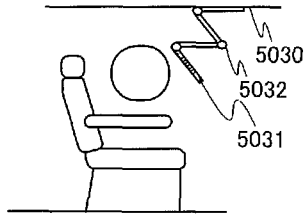

FIG. 34H illustrates an example in which the display device, which is one embodiment of the present invention, is incorporated in a passenger airplane. FIG. 34H illustrates a usage pattern when a display panel 5031 is provided for a ceiling 5030 above a seat of the passenger airplane. The display panel 5031 is integrated with the ceiling 5030 through a hinge portion 5032, and a passenger can watch the display panel 5031 by extending and contracting the hinge portion 5032. The display panel 5031 has a function of displaying information when operated by the passenger.

Note that although this embodiment gives the body of the vehicle and the body of the plane as examples of the moving body, this embodiment is not limited to these examples. The display device can be provided for a variety of moving bodies such as a two-wheel motor vehicle, a four-wheel vehicle (including a car, bus, and the like), a train (including a monorail, a railway, and the like), and a ship.

Figure 35A:
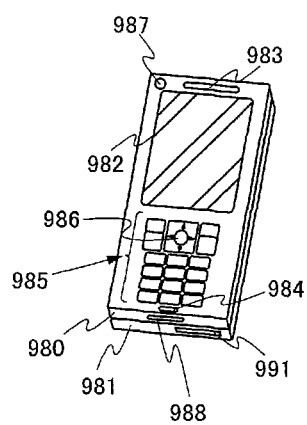
FIGS. 35A to 35C illustrate an example of a structure of an electronic device in Embodiment 11.
Figure 35B:
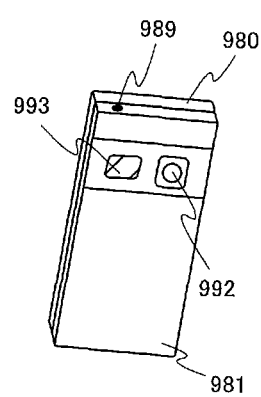
Figure 35C:
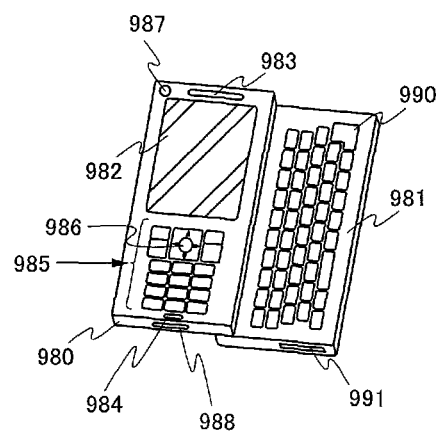

FIGS. 35A to 35C illustrate an example of a portable information terminal. FIG. 35A is a front view, FIG. 35B is a rear view, and FIG. 35C is a development view of the portable information terminal. A portable information terminal such as one illustrated in FIGS. 35A to 35C can have a plurality of functions. For example, such a portable information terminal can include a computer so as to have a function of processing a variety of data, in addition to a telephone function. A portable information terminal having a telephone function is also referred to as a mobile phone.

The portable information terminal illustrated in FIGS. 35A to 35C includes two housings: a housing 980 and a housing 981. The housing 980 is provided with a display portion 982, a speaker 983, a microphone 984, operation keys 985, a pointing device 986, a camera lens 987, an external connection terminal 988, an earphone terminal 989, and the like. The housing 981 is provided with a keyboard 990, an external memory slot 991, a camera lens 992, a light 993, and the like. Moreover, an antenna is incorporated in the housing 981.

Further, the portable information terminal may incorporate a contactless IC chip, a small memory device, or the like in addition to the above components.

The display device, which is one embodiment of the present invention, can be used for the display portion 982, and the display direction changes as appropriate depending on applications. Since the camera lens 987 is provided on the same plane as the display portion 982, a videophone is realized. Further, still images and motion images can be taken with the camera lens 992 and the light 993 by using the display portion 982 as a viewfinder. The speaker 983 and the microphone 984 can be used for videophone, recording, playback, and the like without being limited to verbal communication. The incoming and outgoing calls, simple input of information such as e-mail, scroll of a screen, cursor motion, and the like can be performed with the operation keys 985. The housings 980 and 981 (FIG. 35A) which overlap with each other can be slid open as illustrated in FIG. 35C so as to be used as the portable information terminal. In that case, smooth operation can be conducted using the keyboard 990 and the pointing device 986. The external connection terminal 988 can be connected to an AC adaptor and a variety of cables such as a USB cable, whereby charging and data communication with a personal computer or the like are possible. Moreover, a larger amount of data can be stored and moved by using a recording medium inserted in the external memory slot 991.

Further, in addition to the above functions, an infrared communication function, a television reception function, or the like may be provided.

In this embodiment, examples of electronic devices each including the display device described in any of the above embodiments are described as above. In the case where a microcrystalline semiconductor is used, increase in size of the display device, reduction in cost, increase in yield, or the like can be achieved. Further, by the use of a microcrystalline semiconductor for a channel region of a thin film transistor, degradation of characteristics of the thin film transistor can be suppressed, so that the life of the electronic circuit can be extended.

Note that this embodiment can be combined or replaced with any of the other embodiments as appropriate.

This application is based on Japanese Patent Application serial no. 2009-122906 filed with Japan Patent Office on May 21, 2009, the entire contents of which are hereby incorporated by reference.

What is claimed is:

1. An electronic circuit comprising:
   a sequential circuit configured to input a first signal, a second signal, and a third signal and to output a fourth signal in accordance with voltage states of the first signal, the second signal and the third signal, as an output signal; and
   a control circuit configured to output the third signal to the sequential circuit and configured to input the fourth signal, wherein the voltage state of the third signal is controlled by the control circuit in accordance with a voltage state of the fourth signal,
   wherein the first signal, the second signal, and the third signal are a start signal, a clock signal, and a reset signal, respectively.

2. The electronic circuit according to claim 1, wherein the sequential circuit includes a flip-flop circuit.

3. A display device comprising:
   a driver circuit including the electronic circuit according to claim 1; and
   a pixel portion including a pixel, wherein display operation of the pixel portion is controlled by the driver circuit.

4. An electronic device comprising:
   a display portion including the display device according to claim 3; and
   a control switch configured to control the display operation of the display portion.

5. The electronic circuit according to claim 1,
   wherein the sequential circuit includes:
      a first transistor having a first gate, a first source, and a first drain;
      a second transistor having a second gate, a second source, and a second drain; and
      a third transistor having a third gate, a third source, and a third drain,
   wherein the start signal is input to the first gate of the first transistor,
   wherein the second gate of the second transistor is electrically connected to one of the first source and the first drain of the first transistor,
   wherein the clock signal is input to one of the second source and the second drain of the second transistor,
   wherein a voltage at the other of the second source and the second drain of the second transistor is output as the output signal,
   wherein the reset signal is input to the third gate of the third transistor, wherein one of the third source and the third drain of the third transistor is electrically connected to the second gate of the second transistor, and wherein one of a first voltage and a second voltage is applied to the other of the third source and the third drain of the third transistor.

6. The electronic circuit according to claim 1, wherein the control circuit is a logic circuit.

7. An electronic circuit comprising:
a first sequential circuit configured to input a first signal, a second signal, and a third signal and to output a fourth signal in accordance with voltage states of the first signal, the second signal and the third signal, as an output signal;
a second sequential circuit configured to input the fourth signal, a fifth signal, and a sixth signal and to output a seventh signal in accordance with the voltage states of the inputted fourth signal, fifth signal and sixth signal, as an output signal; and
a control circuit configured to output the third signal to the first sequential circuit and configured to input the seventh signal, wherein the voltage state of the third signal is controlled by the control circuit in accordance with a voltage state of the inputted seventh signal,
wherein the first signal, the second signal, and the third signal are input to the first sequential circuit as a start signal, a clock signal, and a reset signal, respectively, and
wherein the fourth signal, the fifth signal, and the sixth signal are input to the second sequential circuit as a start signal, a clock signal, and a reset signal, respectively.

8. The electronic circuit according to claim 7, wherein each of the first and second sequential circuits includes a flip-flop circuit.

9. A display device comprising:
a driver circuit including the electronic circuit according to claim 7; and
a pixel portion including a pixel, wherein display operation of the pixel portion is controlled by the driver circuit.

10. An electronic device comprising:
a display portion including the display device according to claim 9; and
a control switch configured to control the display operation of the display portion.

11. The electronic circuit according to claim 9,
wherein each of the first and second sequential circuits includes:
a first transistor having a first gate, a first source, and a first drain;
a second transistor having a second gate, a second source, and a second drain; and
a third transistor having a third gate, a third source, and a third drain,
wherein the start signal is input to the first gate of the first transistor,
wherein the second gate of the second transistor is electrically connected to one of the first source and the first drain of the first transistor,
wherein the clock signal is input to one of the second source and the second drain of the second transistor,
wherein a voltage at the other of the second source and the second drain of the second transistor is output as the output signal,
wherein the reset signal is input to the third gate of the third transistor, wherein one of the third source and the third drain of the third transistor is electrically connected to the second gate of the second transistor, and wherein one of a first voltage and a second voltage is applied to the other of the third source and the third drain of the third transistor.

12. The electronic circuit according to claim 7, wherein the control circuit is a delay circuit.

13. The electronic circuit according to claim 7, wherein the control circuit is a logic circuit.

14. An electronic circuit comprising:
a first sequential circuit configured to input a first signal, a second signal, and a third signal and to output a fourth signal in accordance with voltage states of the first signal, the second signal and the third signal, as an output signal;
a second sequential circuit configured to input the fourth signal, a fifth signal, and a sixth signal and to output a seventh signal in accordance with the voltage states of the inputted fourth signal, fifth signal and sixth signal, as an output signal; and
a control circuit configured to output the third signal to the first sequential circuit and configured to input the fourth signal and the seventh signal, wherein the voltage state of the third signal is controlled by the control circuit in accordance with the voltage state of the inputted fourth signal and a voltage state of the inputted seventh signal,
wherein the first signal, the second signal, and the third signal are input to the first sequential circuit as a start signal, a clock signal, and a reset signal, respectively,
wherein the fourth signal, the fifth signal, and the sixth signal are input to the second sequential circuit as a start signal, a clock signal, and a reset signal, respectively.

15. The electronic circuit according to claim 14, wherein each of the first and second sequential circuits includes a flip-flop circuit.

16. A display device comprising:
a driver circuit including the electronic circuit according to claim 14; and
a pixel portion including a pixel, wherein display operation of the pixel portion is controlled by the driver circuit.

17. An electronic device comprising:
a display portion including the display device according to claim 16; and
a control switch configured to control the display operation of the display portion.

18. The electronic circuit according to claim 14,
wherein each of the first and second sequential circuits includes:
a first transistor having a first gate, a first source, and a first drain;
a second transistor having a second gate, a second source, and a second drain; and
a third transistor having a third gate, a third source, and a third drain,
wherein the start signal is input to the first gate of the first transistor,
wherein the second gate of the second transistor is electrically connected to one of the first source and the first drain of the first transistor,
wherein the clock signal is input to one of the second source and the second drain of the second transistor,
wherein a voltage at the other of the second source and the second drain of the second transistor is output as the output signal,
wherein the reset signal is input to the third gate of the third transistor, wherein one of the third source and the third drain of the third transistor is electrically connected to the second gate of the second transistor, and wherein one of a first voltage and a second voltage is applied to the other of the third source and the third drain of the third transistor.

19. The electronic circuit according to claim 14, wherein the control circuit is a logic circuit.

* * * * *

UNITED STATES PATENT AND TRADEMARK OFFICE
CERTIFICATE OF CORRECTION

| | | |
|---|---|---|
| PATENT NO. | : 8,872,745 B2 | Page 1 of 1 |
| APPLICATION NO. | : 12/783079 | |
| DATED | : October 28, 2014 | |
| INVENTOR(S) | : Atsushi Umezaki et al. | |

It is certified that error appears in the above-identified patent and that said Letters Patent is hereby corrected as shown below:

In the Specification

Column 35, line 51 – replace "bexamethyldisilazane" with --hexamethyldisilazane--; and In the Claims Column 59, line 47, claim 11 – replace "9" with --7--.

Signed and Sealed this
Eighth Day of September, 2015

Michelle K. Lee
*Director of the United States Patent and Trademark Office*